US010312224B2

(12) United States Patent
Edmond et al.

(10) Patent No.: US 10,312,224 B2
(45) Date of Patent: Jun. 4, 2019

(54) HIGH DENSITY PIXELATED LED AND DEVICES AND METHODS THEREOF

(71) Applicant: Cree, Inc., Durham, NC (US)

(72) Inventors: John Edmond, Durham, NC (US); Matthew Donofrio, Raleigh, NC (US); Jesse Reiherzer, Raleigh, NC (US); Peter Scott Andrews, Durham, NC (US); Joseph G. Clark, Raleigh, NC (US); Kevin Haberern, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/401,240

(22) Filed: Jan. 9, 2017

(65) Prior Publication Data

US 2017/0294418 A1    Oct. 12, 2017

Related U.S. Application Data

(63) Continuation of application No. 15/399,729, filed on Jan. 5, 2017.
(Continued)

(51) Int. Cl.
*H01L 25/075* (2006.01)
*H01L 27/15* (2006.01)
(Continued)

(52) U.S. Cl.
CPC .......... *H01L 25/0753* (2013.01); *H01L 25/50* (2013.01); *H01L 27/156* (2013.01);
(Continued)

(58) Field of Classification Search
CPC ......... H01L 33/50; H01L 33/58; H01L 33/60; H01L 33/62; H01L 27/156; H01L 25/0753
See application file for complete search history.

(56) References Cited

U.S. PATENT DOCUMENTS 4,319,070 A    3/1982    Imai et al.
5,955,747 A    9/1999    Ogihara et al.
(Continued)

FOREIGN PATENT DOCUMENTS

| CN | 101894851 A | 11/2010 |
|---|---|---|
| EP | 2320483 A1 | 5/2011 |
| EP | 2325883 A2 | 5/2011 |
| EP | 2393132 A2 | 12/2011 |
| EP | 3076442 A1 | 10/2016 |
| JP | 5788046 B2 | 9/2015 |

(Continued)

OTHER PUBLICATIONS

Invitation to Pay Additional Fees and Partial Search Report for International Patent Application No. PCT/US2017/026163, dated Aug. 1, 2017, 23 pages.
(Continued)

*Primary Examiner* — Christine A Enad
(74) *Attorney, Agent, or Firm* — Withrow & Terranova, P.L.L.C.

(57) ABSTRACT

At least one array of LEDs (e.g., in a flip chip configuration) is supported by a substrate having a light extraction surface overlaid with at least one lumiphoric material. Light segregation elements registered with gaps between LEDs are configured to reduce interaction between emissions of different LEDs and/or lumiphoric material regions to reduce scattering and/or optical crosstalk, thereby preserving pixel-like resolution of the resulting emissions. Light segregation elements may be formed by mechanical sawing or etching to define grooves or recesses in a substrate, and filling the grooves or recesses with light-reflective or light-absorptive material. Light segregation elements external to a substrate may be defined by photolithographic patterning and etching of a sacrificial material, and/or by 3D printing.

28 Claims, 48 Drawing Sheets

Related U.S. Application Data

(60) Provisional application No. 62/321,514, filed on Apr. 12, 2016.

(51) Int. Cl.

| | | |
|---|---|---|
| *H01L 33/50* | (2010.01) | |
| *H01L 33/56* | (2010.01) | |
| *H01L 33/58* | (2010.01) | |
| *H01L 33/60* | (2010.01) | |
| *H01L 33/62* | (2010.01) | |
| *H01L 25/00* | (2006.01) | |
| *H01L 33/46* | (2010.01) | |
| *H01L 33/00* | (2010.01) | |
| *H01L 33/38* | (2010.01) | |
| *H01L 33/44* | (2010.01) | |

(52) U.S. Cl.
CPC .............. *H01L 33/46* (2013.01); *H01L 33/50* (2013.01); *H01L 33/502* (2013.01); *H01L 33/504* (2013.01); *H01L 33/58* (2013.01); *H01L 33/60* (2013.01); *H01L 33/62* (2013.01); *H01L 33/0079* (2013.01); *H01L 33/382* (2013.01); *H01L 33/44* (2013.01); *H01L 33/508* (2013.01); *H01L 2933/0033* (2013.01); *H01L 2933/0058* (2013.01)

(56) References Cited

U.S. PATENT DOCUMENTS

| | | |
|---|---|---|
| 6,657,236 B1 | 12/2003 | Thibeault et al. |
| 6,747,298 B2 | 6/2004 | Slater, Jr. et al. |
| 6,791,119 B2 | 9/2004 | Slater, Jr. et al. |
| 6,821,804 B2 | 11/2004 | Thibeault et al. |
| 6,888,167 B2 | 5/2005 | Slater, Jr. et al. |
| 7,211,803 B1 | 5/2007 | Dhurjaty et al. |
| 7,829,906 B2 | 11/2010 | Donofrio |
| 8,716,724 B2 | 5/2014 | von Malm et al. |
| 8,835,959 B2 | 9/2014 | Nakamura et al. |
| 8,940,561 B2 | 1/2015 | Donofrio et al. |
| 8,963,121 B2 | 2/2015 | Odnoblyudov et al. |
| 8,969,897 B2 | 3/2015 | Choi |
| 8,981,395 B2 | 3/2015 | Choi et al. |
| 9,048,368 B2 | 6/2015 | Jeong |
| 9,099,575 B2 | 8/2015 | Medendorp, Jr. et al. |
| 9,123,864 B2 | 9/2015 | Tomonari et al. |
| 9,129,977 B2 | 9/2015 | Marchand et al. |
| 9,130,127 B2 | 9/2015 | Katsuno et al. |
| 9,130,128 B2 | 9/2015 | Shinohara |
| 9,130,137 B2 | 9/2015 | Lin et al. |
| 9,136,432 B2 | 9/2015 | Yun et al. |
| 9,136,433 B2 | 9/2015 | Park et al. |
| 9,142,725 B1 | 9/2015 | Suzuki |
| 9,153,750 B2 | 10/2015 | Seo et al. |
| 9,159,894 B2 | 10/2015 | Cho et al. |
| 9,166,107 B2 | 10/2015 | Park |
| 9,166,108 B2 | 10/2015 | Unosawa |
| 9,166,110 B2 | 10/2015 | Aihara |
| 9,166,111 B2 | 10/2015 | Matsui et al. |
| 9,171,882 B2 | 10/2015 | Akimoto et al. |
| 9,172,002 B2 | 10/2015 | Wang et al. |
| 9,172,021 B2 | 10/2015 | Sugizaki et al. |
| 9,178,121 B2 | 11/2015 | Edmond et al. |
| 9,196,653 B2 | 11/2015 | Leatherdale et al. |
| 9,209,223 B2 | 12/2015 | Lee et al. |
| 9,219,196 B2 | 12/2015 | Seo et al. |
| 9,219,200 B2 | 12/2015 | Erchak et al. |
| 9,231,037 B2 | 1/2016 | Shimayama |
| 9,236,526 B2 | 1/2016 | Choi et al. |
| 9,240,433 B2 | 1/2016 | Kim et al. |
| 9,252,345 B2 | 2/2016 | Cho et al. |
| 9,263,643 B2 | 2/2016 | Huang et al. |
| 9,263,652 B2 | 2/2016 | Yoon et al. |
| 9,269,858 B2 | 2/2016 | Schubert et al. |
| 9,277,618 B2 | 3/2016 | Odnoblyudov et al. |
| 9,281,448 B2 | 3/2016 | Choi et al. |
| 9,281,449 B2 | 3/2016 | Kim et al. |
| 9,287,457 B2 | 3/2016 | Jeong et al. |
| 9,293,664 B2 | 3/2016 | Seo et al. |
| 9,293,674 B2 | 3/2016 | Kususe et al. |
| 9,293,675 B2 | 3/2016 | Yang et al. |
| 9,299,889 B2 | 3/2016 | Katsuno et al. |
| 9,299,893 B2 | 3/2016 | Chen et al. |
| 9,300,111 B2 | 3/2016 | Lee et al. |
| 9,318,529 B2 | 4/2016 | Jang et al. |
| 9,324,765 B2 | 4/2016 | An |
| 9,337,175 B2 | 5/2016 | Seo et al. |
| 9,362,335 B2 | 6/2016 | von Malm |
| 9,373,756 B2 | 6/2016 | Lee et al. |
| 9,653,643 B2 | 5/2017 | Bergmann et al. |
| 9,729,676 B2 | 8/2017 | Kobayashi et al. |
| 9,754,926 B2 | 9/2017 | Donofrio et al. |
| 9,831,220 B2 | 11/2017 | Donofrio et al. |
| 2003/0015959 A1 | 1/2003 | Tomoda et al. |
| 2005/0253492 A1* | 11/2005 | Besshi ............... H01L 27/3293 313/110 |
| 2008/0179611 A1 | 7/2008 | Chitnis et al. |
| 2008/0211416 A1 | 9/2008 | Negley et al. |
| 2008/0290351 A1 | 11/2008 | Ajiki et al. |
| 2009/0179843 A1 | 7/2009 | Ackermann et al. |
| 2009/0241390 A1 | 10/2009 | Roberts |
| 2010/0015574 A1 | 1/2010 | Van der Zel et al. |
| 2010/0051785 A1* | 3/2010 | Dai ..................... H01L 27/1464 250/208.1 |
| 2010/0123386 A1 | 5/2010 | Chen |
| 2010/0163900 A1 | 7/2010 | Seo et al. |
| 2010/0318636 A1 | 12/2010 | Matsumura et al. |
| 2011/0049545 A1 | 3/2011 | Basin et al. |
| 2011/0084294 A1 | 4/2011 | Yao |
| 2011/0121732 A1* | 5/2011 | Tsutsumi ............ F21S 48/1159 315/77 |
| 2011/0294240 A1 | 12/2011 | Kim |
| 2012/0119237 A1 | 5/2012 | Leatherdale et al. |
| 2012/0205634 A1* | 8/2012 | Ikeda ................. H01L 27/3204 257/40 |
| 2012/0236582 A1* | 9/2012 | Waragaya ............ H01L 33/507 362/510 |
| 2012/0268042 A1 | 10/2012 | Shiobara et al. |
| 2013/0264592 A1* | 10/2013 | Bergmann ............. H01L 33/50 257/88 |
| 2014/0070245 A1 | 3/2014 | Haberern et al. |
| 2015/0207045 A1 | 7/2015 | Wada et al. |
| 2015/0228876 A1 | 8/2015 | Place et al. |
| 2015/0279902 A1 | 10/2015 | Von Malm et al. |
| 2015/0311407 A1 | 10/2015 | Göötz et al. |
| 2015/0340346 A1 | 11/2015 | Chu et al. |
| 2016/0150614 A1 | 5/2016 | Randolph |
| 2016/0240516 A1* | 8/2016 | Chang ................ H01L 25/0753 |
| 2017/0092820 A1 | 3/2017 | Kim et al. |
| 2017/0098746 A1 | 4/2017 | Bergmann et al. |
| 2017/0135177 A1 | 5/2017 | Wang et al. |
| 2017/0141280 A1 | 5/2017 | Zhong et al. |
| 2017/0207284 A1* | 7/2017 | Dykaar ............... H01L 27/3253 |
| 2017/0250164 A1 | 8/2017 | Takeya et al. |
| 2017/0287887 A1 | 10/2017 | Takeya et al. |
| 2017/0317251 A1 | 11/2017 | Sweegers et al. |
| 2017/0358624 A1 | 12/2017 | Takeya et al. |
| 2018/0012949 A1 | 1/2018 | Takeya et al. |
| 2018/0212108 A1 | 7/2018 | Leirer et al. |
| 2019/0044040 A1 | 2/2019 | Andrews |

FOREIGN PATENT DOCUMENTS

| | | |
|---|---|---|
| WO | 2008062783 A1 | 5/2008 |
| WO | 2015063077 A1 | 5/2015 |
| WO | 2016188505 A1 | 12/2016 |

OTHER PUBLICATIONS

U.S. Appl. No. 15/399,729, filed Jan. 5, 2017.
U.S. Appl. No. 15/499,520, filed Apr. 27, 2017.
U.S. Appl. No. 15/493,735, filed Apr. 21, 2017.

(56) References Cited

OTHER PUBLICATIONS

Carey, Julian, "New LED architectures and phosphor technologies lower costs and boost quality (MAGAZINE)," LEDs Magazine, accessed Feb. 17, 2017, http://www.ledsmagazine.com/articles/print/volume-11/issue-7/features/manufacturing/new-led-architectures-and-phosphor-technologies-lower-costs-and-boost-quality.html, published Sep. 4, 2014, PennWell Corporation, 7 pages.

Chong, Wing et al., "1700 pixels per inch (PPI) Passive-Matrix Micro-LED Display Powered by ASIC," IEEE Compound Semiconductor Integrated Circuit Symposium (CSICs), Oct. 19-22, 2014, IEEE, 4 pages.

Dodel, Dr. Kerstin et al., "Capital Markets Day 2015," HELLA KGaA Hueck & Co, Dec. 2, 2015, London, HELLA, pp. 1-89.

Herrnsdorf, Johannes et al., "Active-Matrix GaN Micro Light-Emitting Diode Display With Unprecedented Brightness," IEEE Transactions on Electron Devices, vol. 62, Issue 6, Jun. 2015, IEEE, pp. 1918-1925.

Jiang, H. X. et al., "Nitride micro-LEDs and beyond—a decade progress review," Optics Express, vol. 21, Issue S3, Apr. 22, 2013, OSA, 10 pages.

International Search Report and Written Opinion for International Patent Application No. PCT/US2017/026163, dated Oct. 25, 2017, 30 pages.

Author Unknown, "MBI5026: 16-bit Constant Current LED Sink Driver," Datasheet, Version 1.0, Mar. 2004, Hsinchu, Taiwan, www.DatasheetCatalog.com, Macroblock, Inc., pp. 1-15.

Non-Final Office Action for U.S. Appl. No. 15/399,729, dated Jan. 24, 2018, 12 pages.

Final Office Action for U.S. Appl. No. 15/399,729, dated Jun. 28, 2018, 9 pages.

Notice of Allowance for U.S. Appl. No. 15/399,729, dated Oct. 23, 2018, 8 pages.

International Preliminary Report on Patentability for International Patent Application No. PCT/US2017/026163, dated Oct. 25, 2018, 20 pages.

Official Letter for Taiwanese Patent Application No. 106112033, dated Aug. 27, 2018, 19 pages.

Invitation to Pay Additional Fees and Partial Search Report for International Patent Application No. PCT/US2018/045102, dated Oct. 30, 2018, 14 pages.

Quayle Action for U.S. Appl. No. 15/896,805, dated Jan. 10, 2019, 5 pages.

Non-Final Office Action for U.S. Appl. No. 15/621,731, dated Dec. 31, 2018, 43 pages.

International Search Report and Written Opinion for International Patent Application No. PCT/US2018/045102, dated Jan. 21, 2019, 23 pages.

Non-Final Office Action for U.S. Appl. No. 15/399,729, dated Mar. 27, 2019, 9 pages.

\* cited by examiner

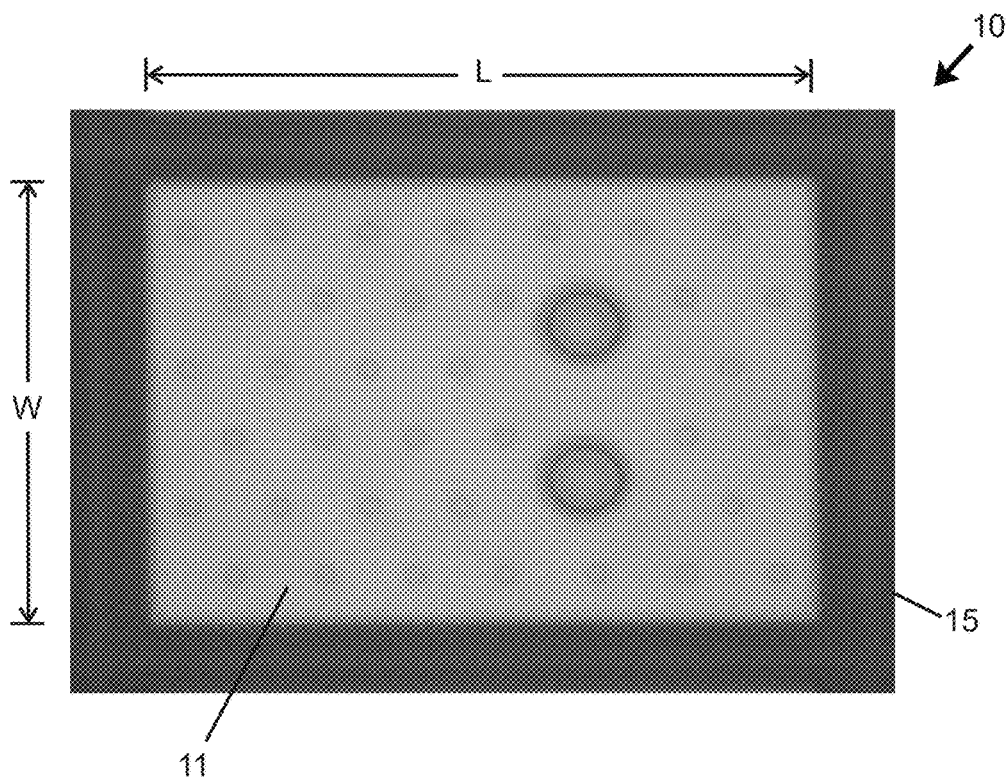
FIG._2A
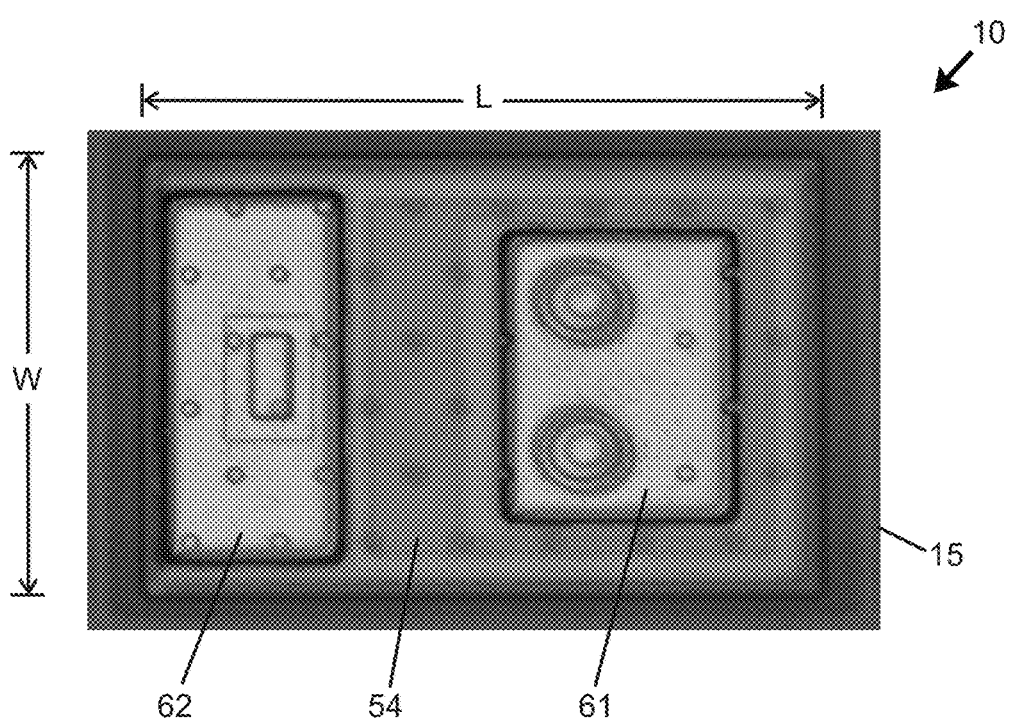
FIG._2B

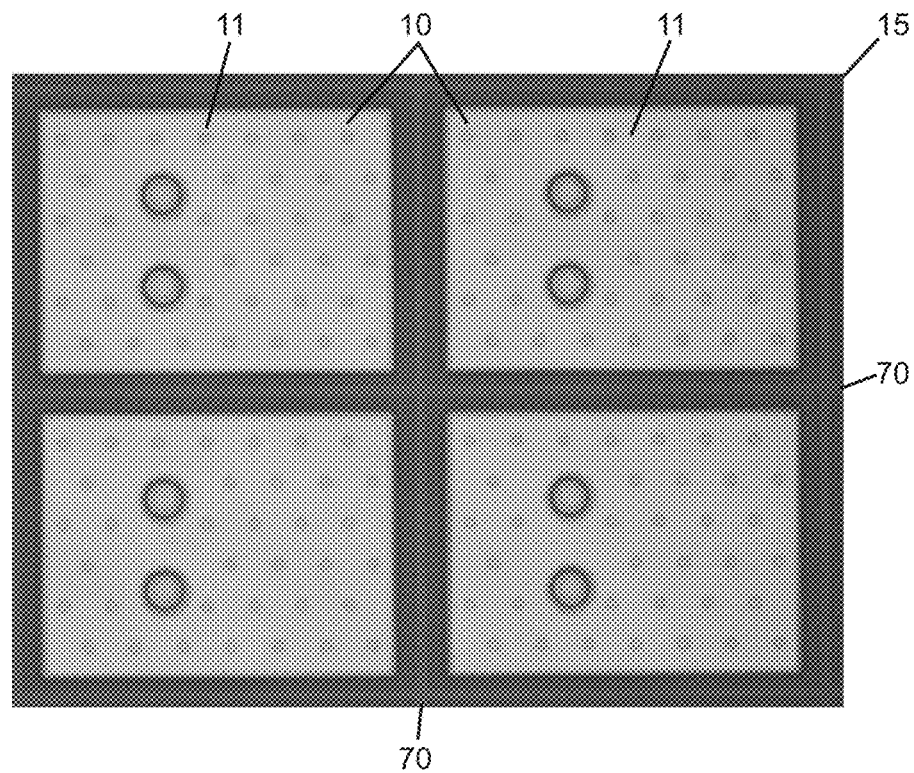
FIG._3A
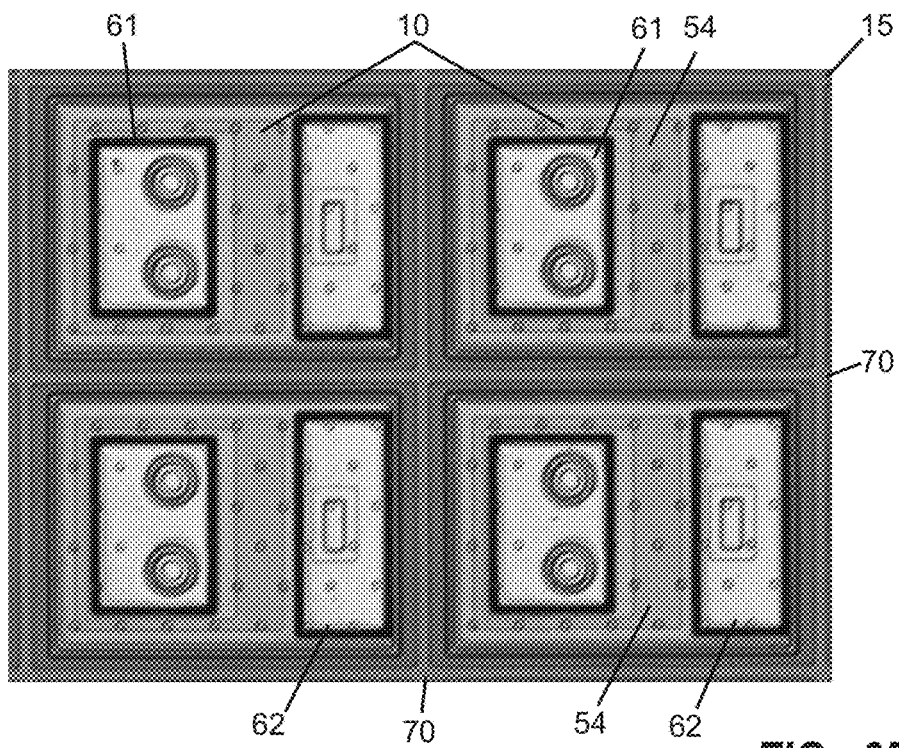
FIG._3B

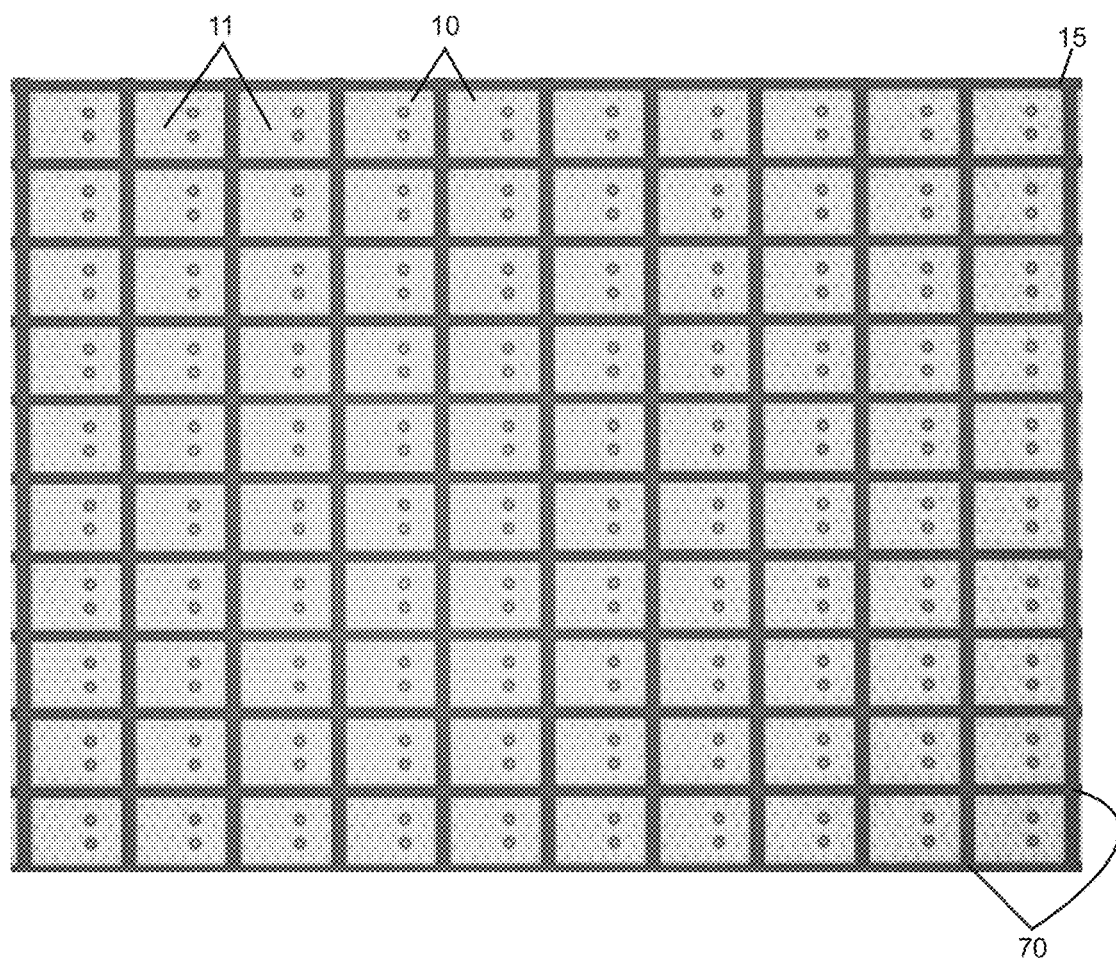
FIG._4A

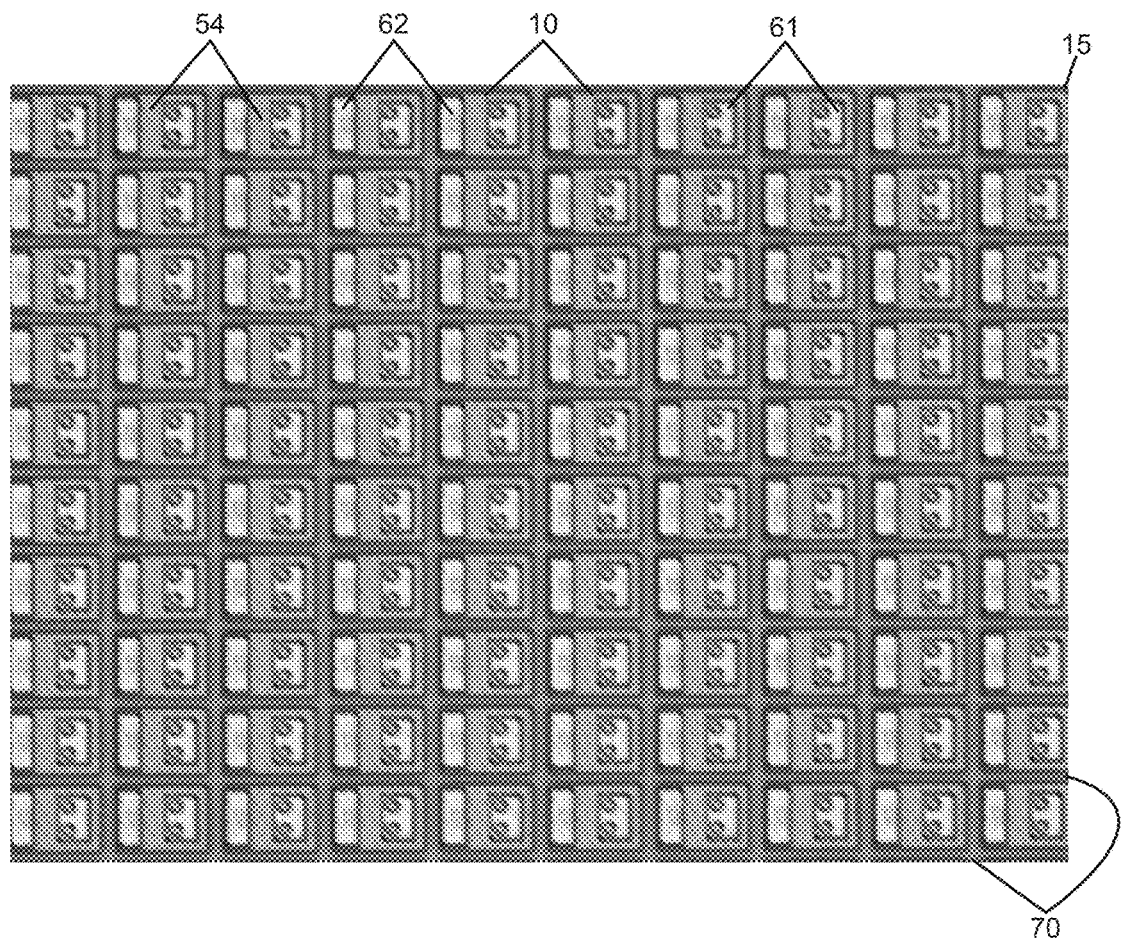
FIG._4B

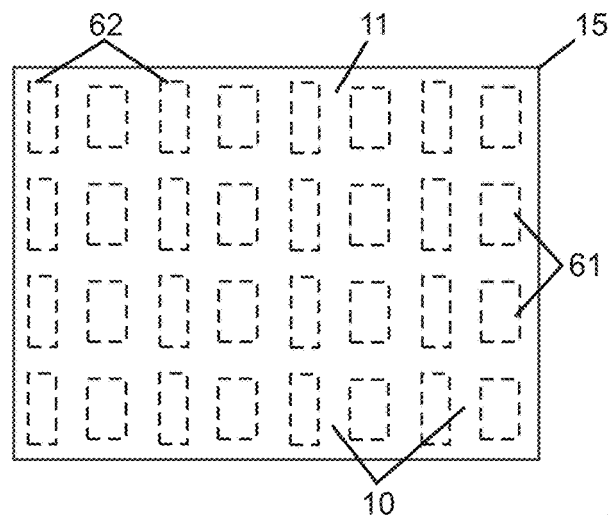
FIG._5A
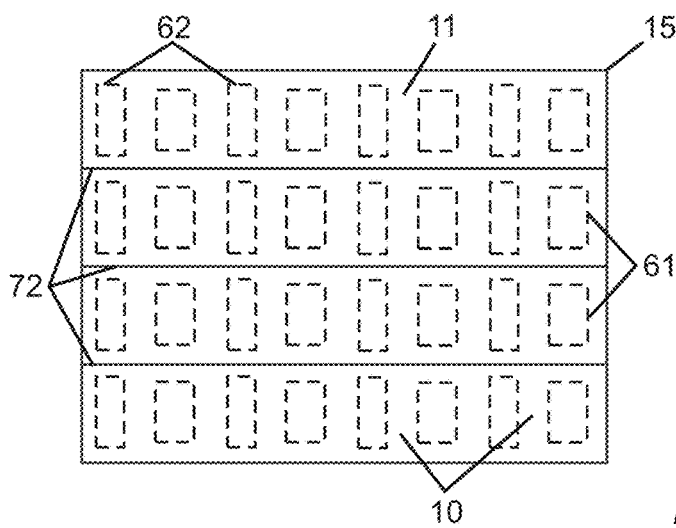
FIG._5B
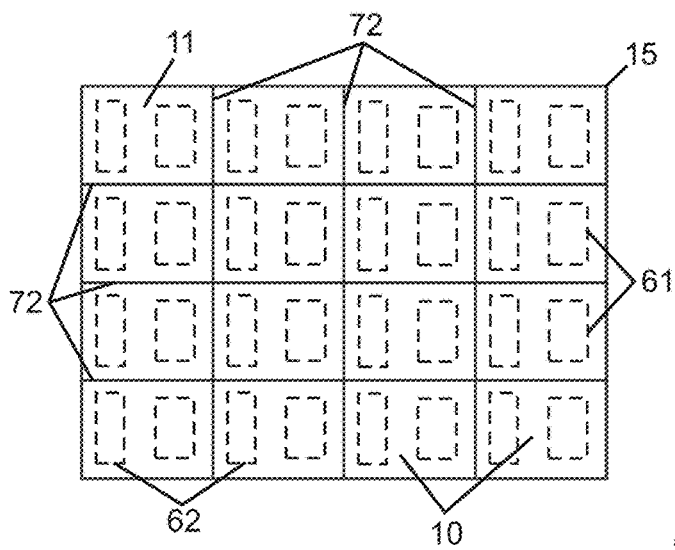
FIG._5C

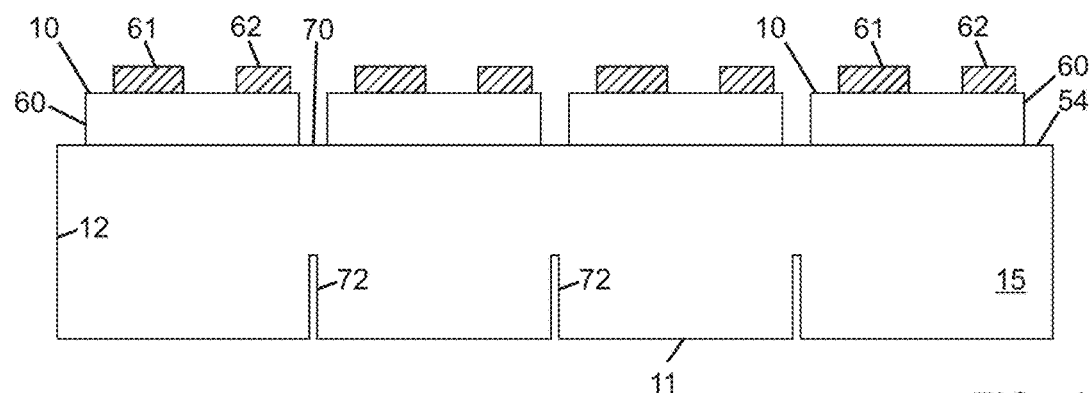
FIG._6A
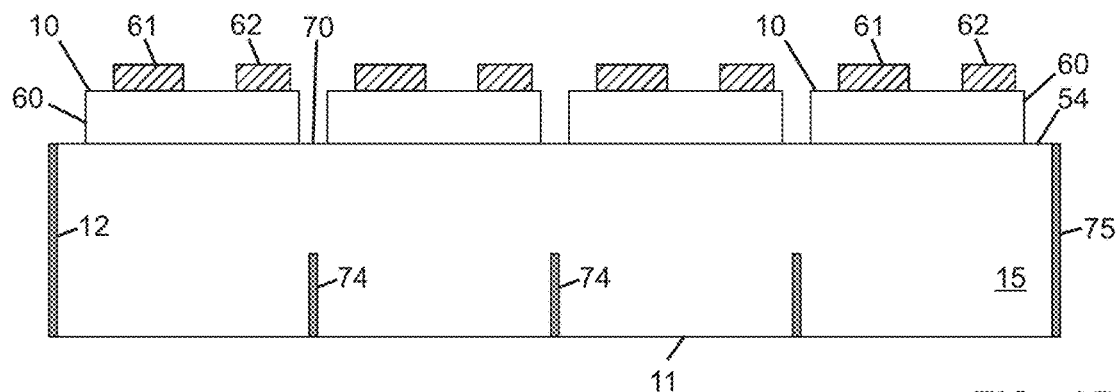
FIG._6B
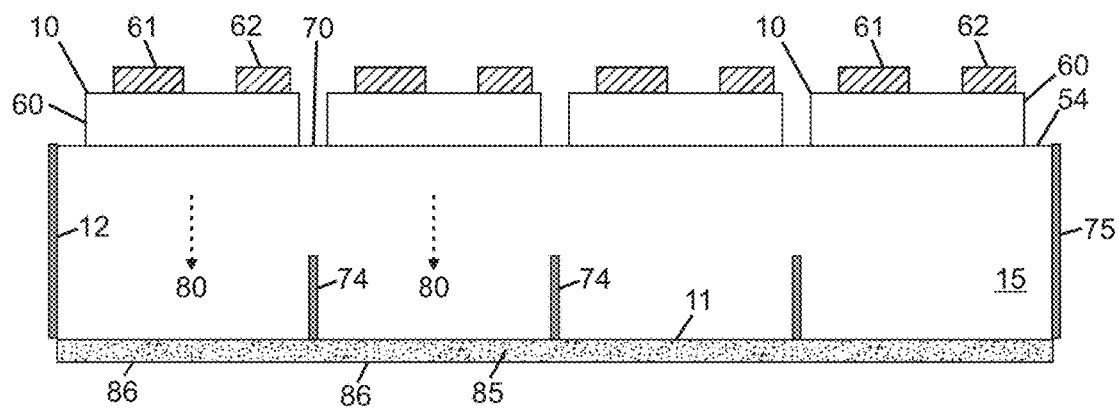
FIG._6C

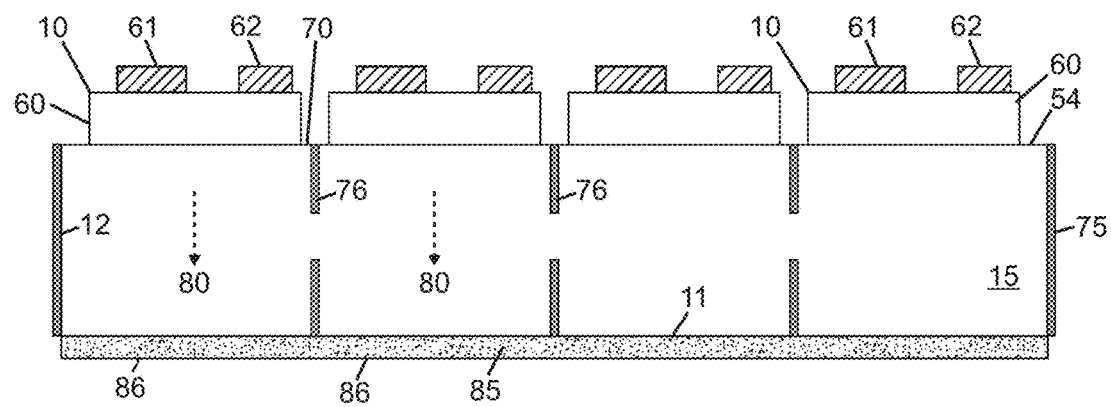
FIG._7A
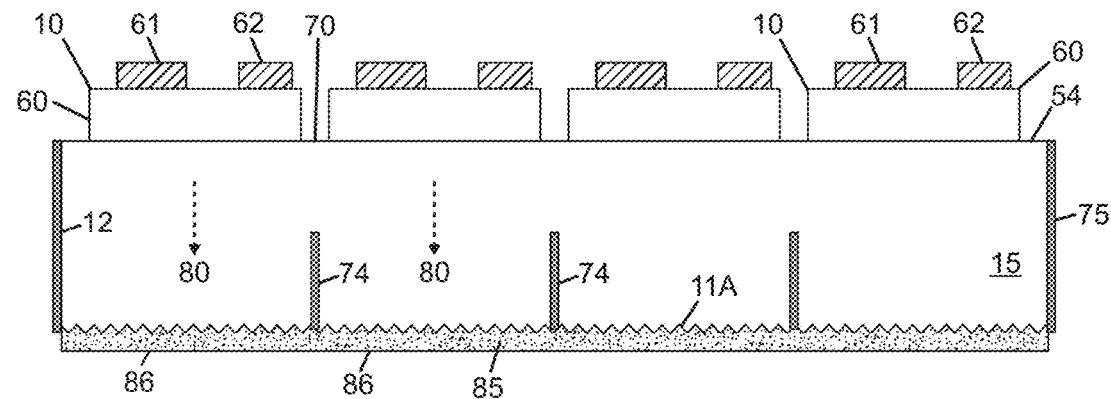
FIG._7B
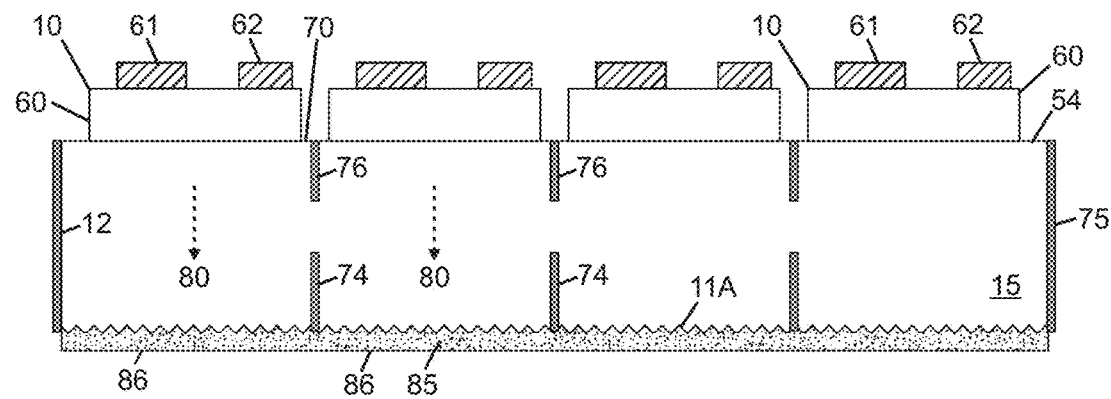
FIG._7C

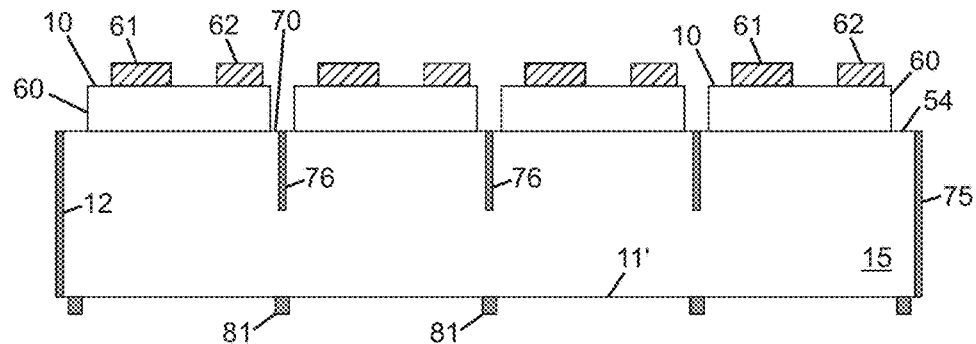
FIG._8A
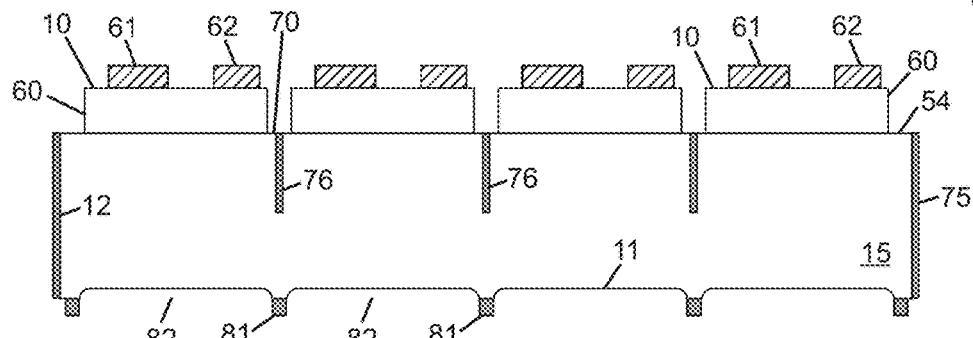
FIG._8B
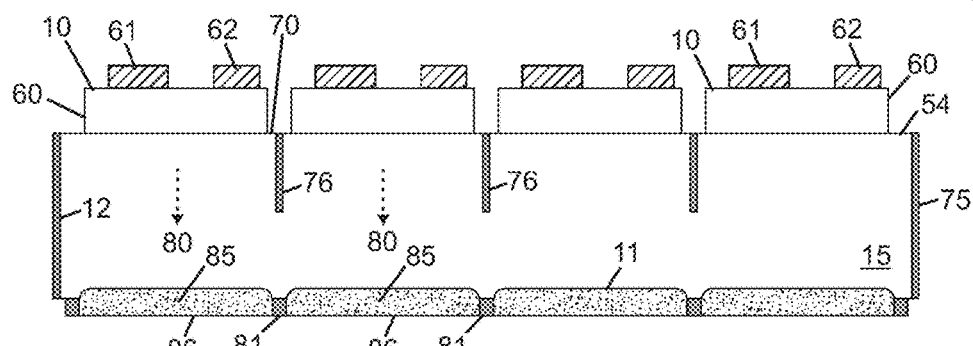
FIG._8C
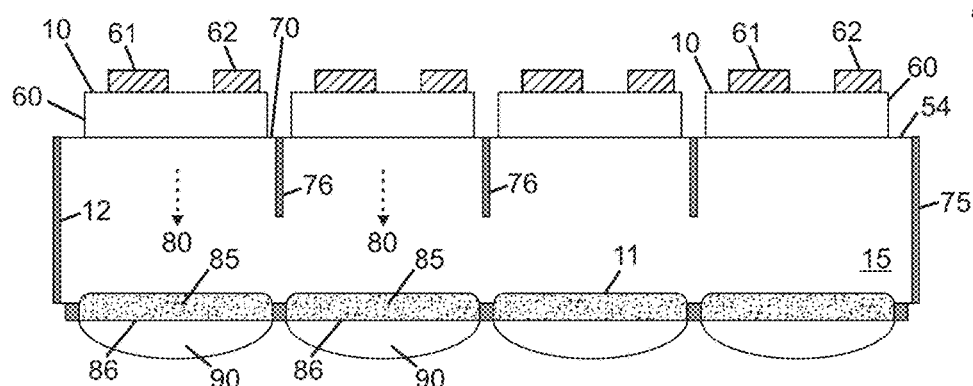
FIG._8D

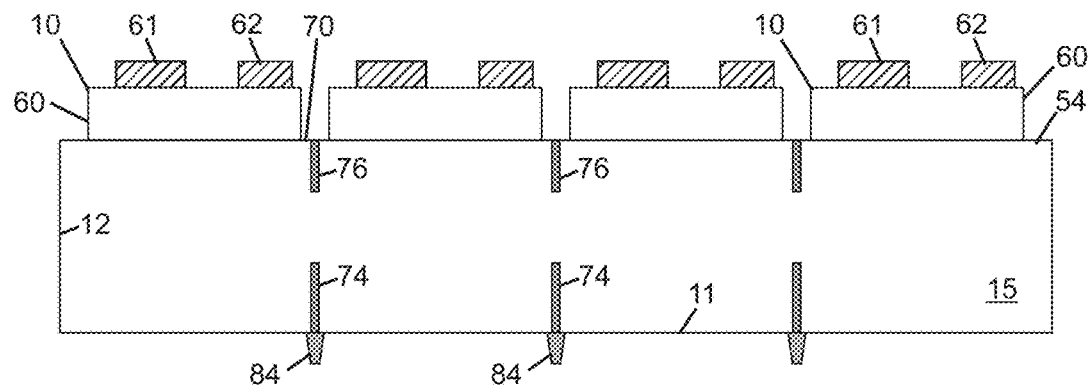
FIG._9A
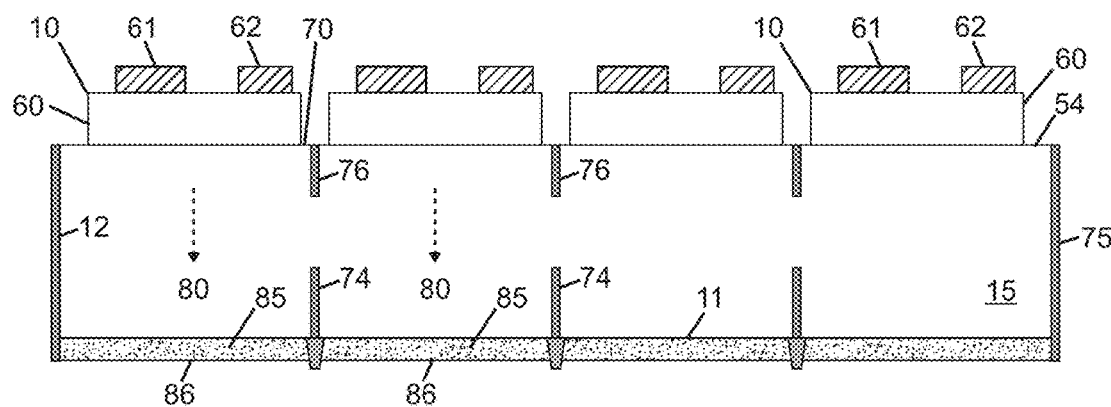
FIG._9B
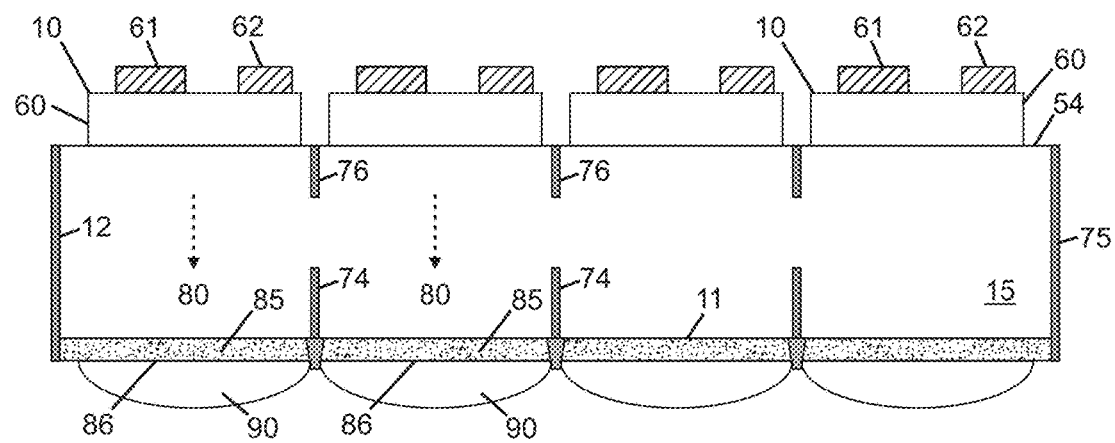
FIG._9C

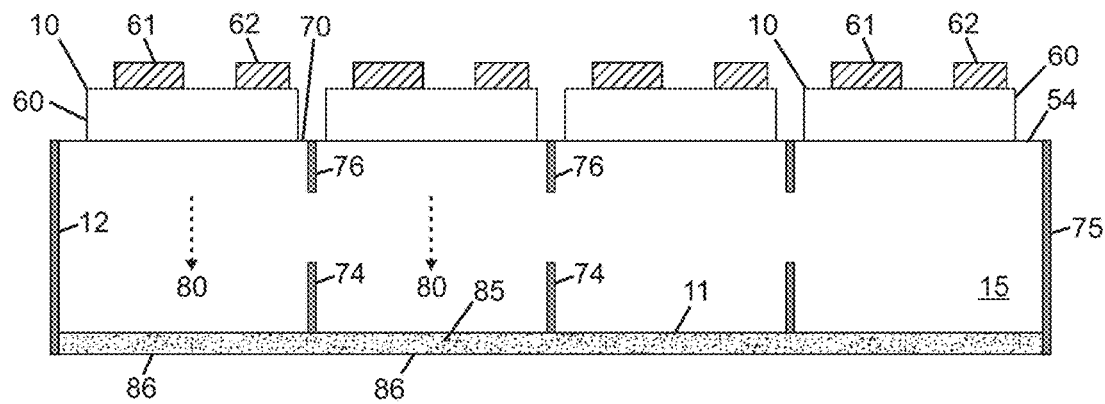
FIG._10A
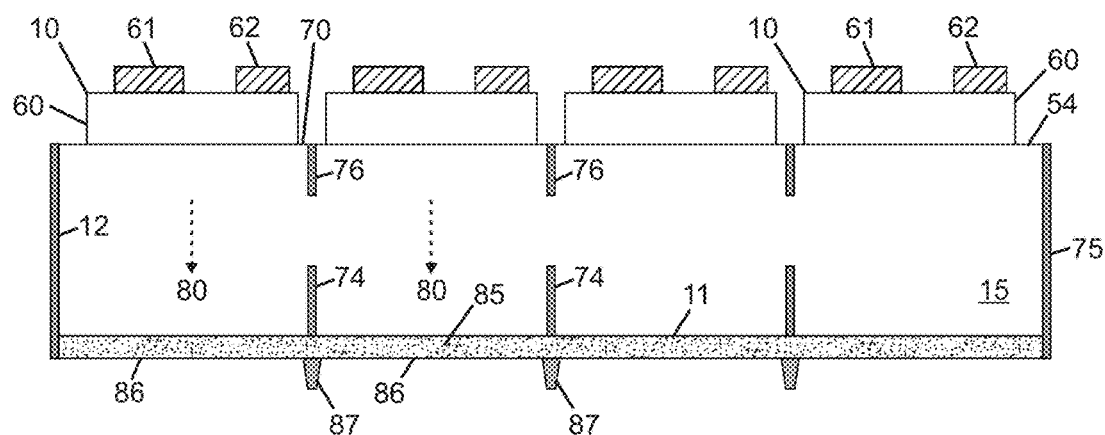
FIG._10B
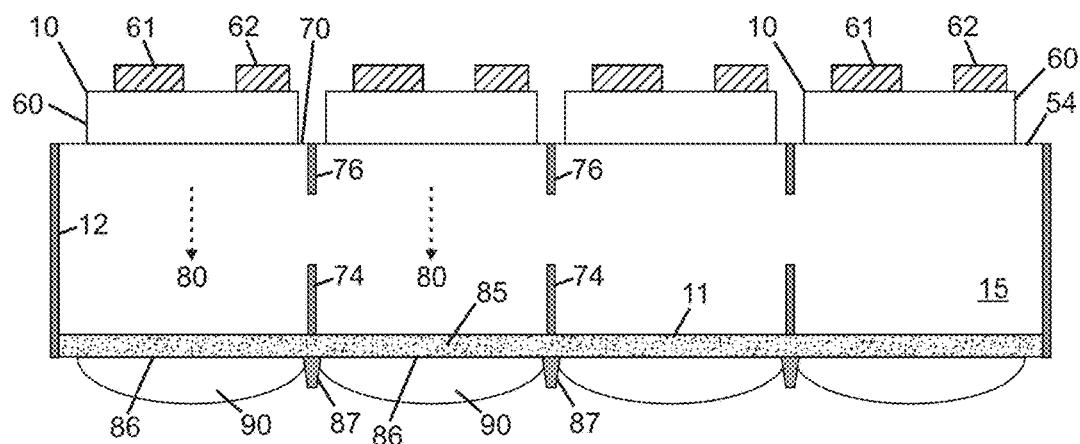
FIG._10C

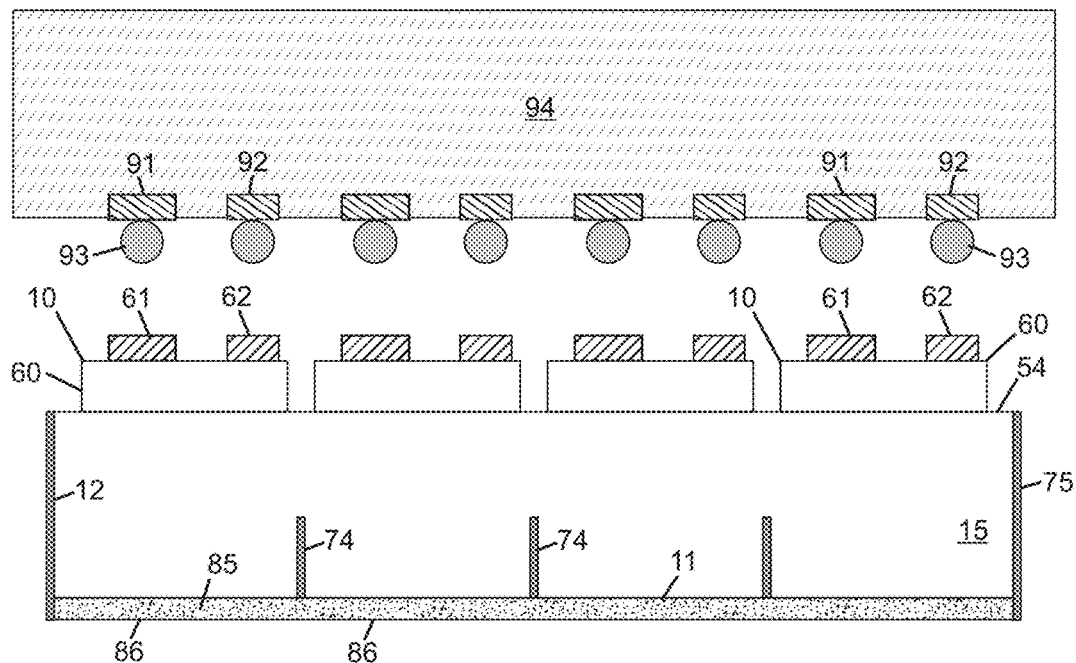
FIG._11A
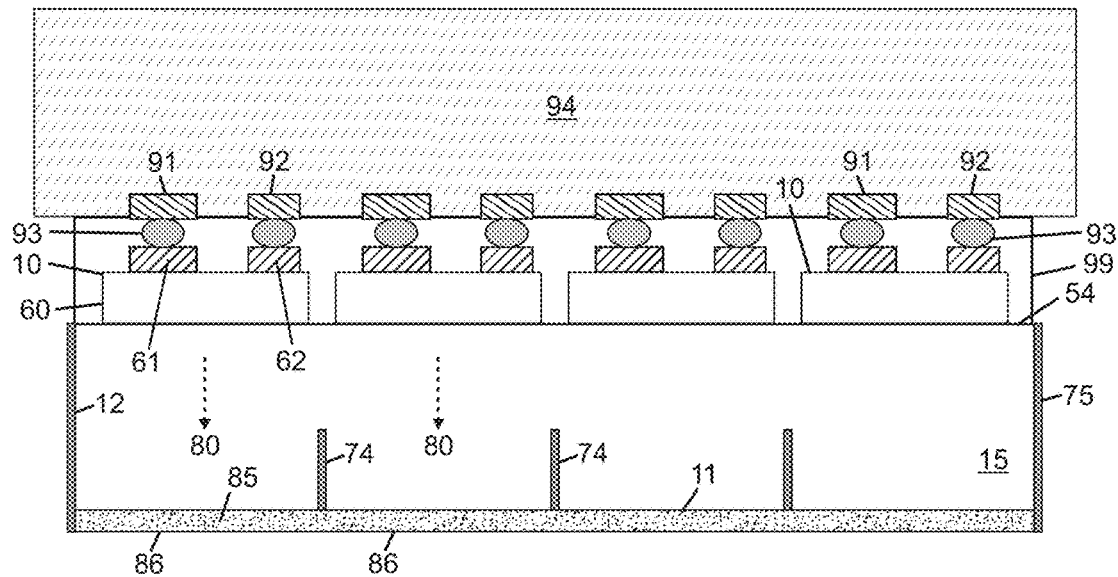
FIG._11B

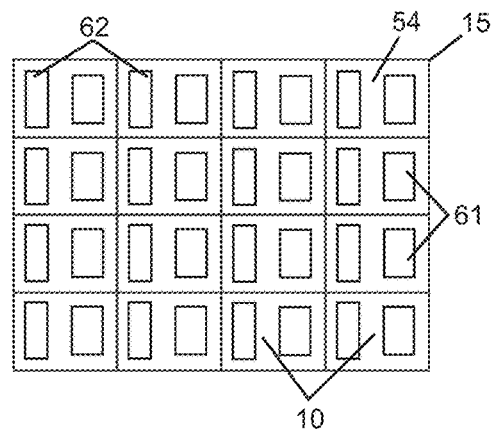
FIG._12A
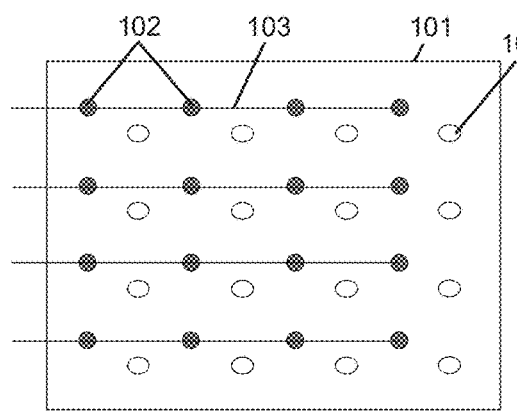
FIG._12B
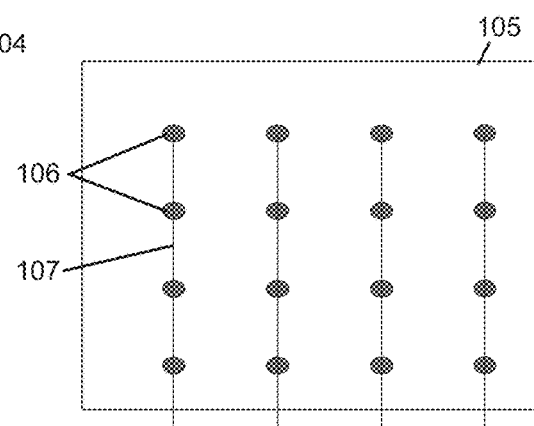
FIG._12C
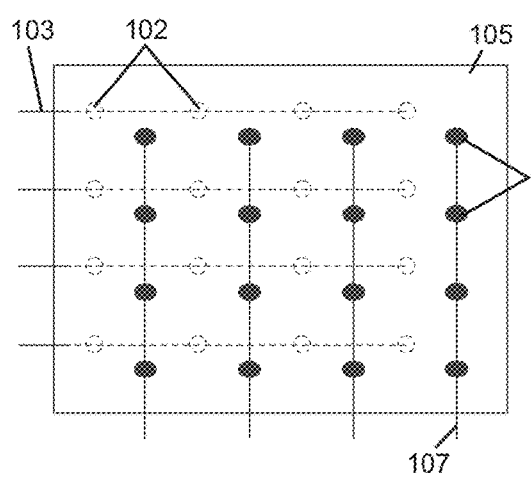
FIG._12D
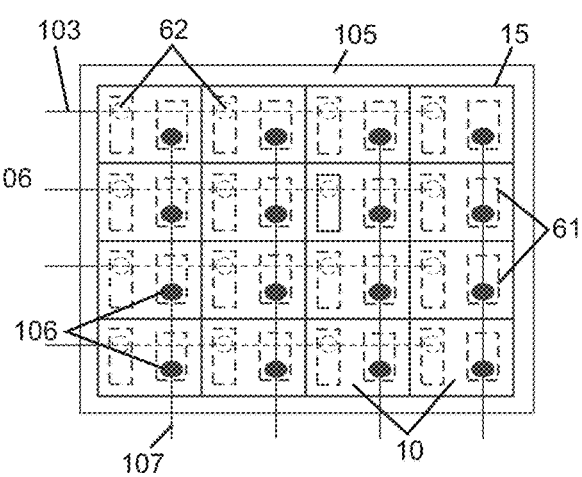
FIG._12E

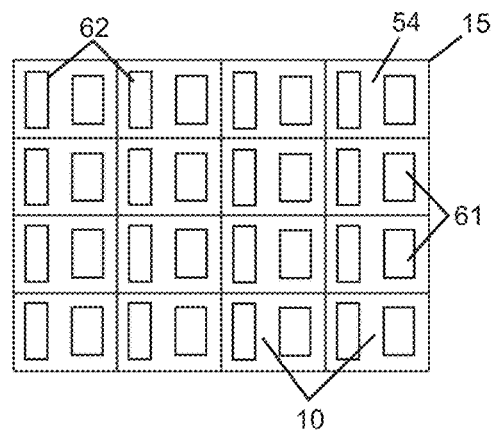
FIG._13A
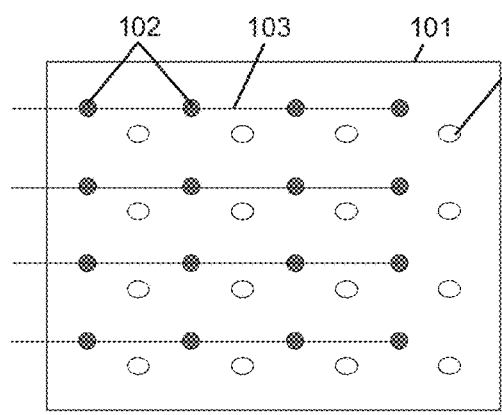
FIG._13B
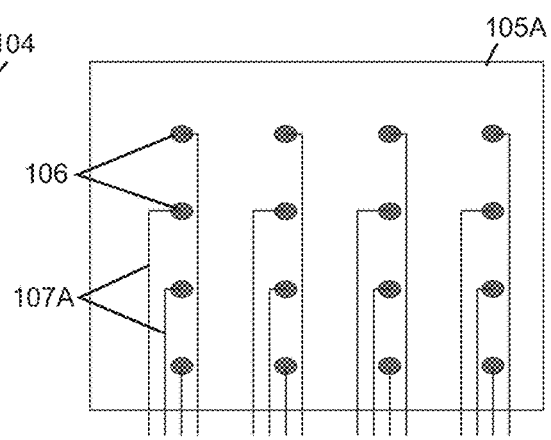
FIG._13C
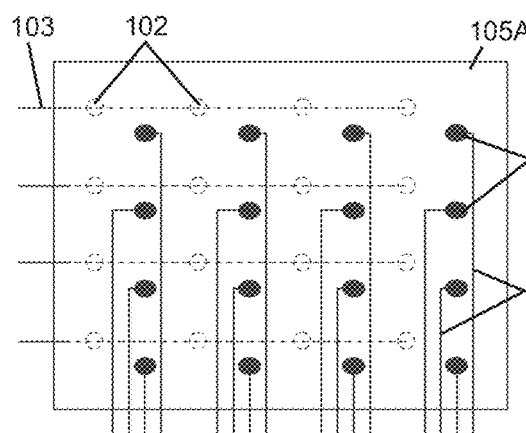
FIG._13D
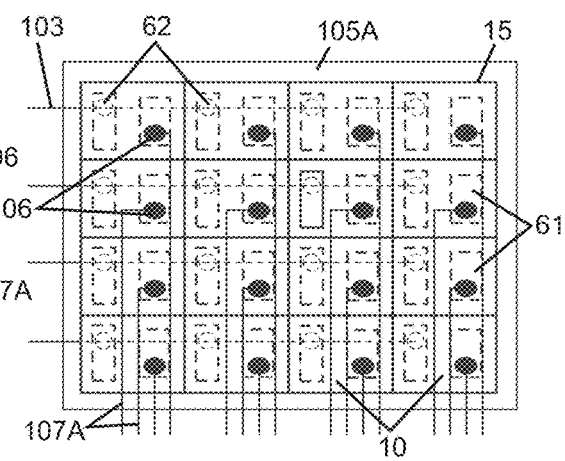
FIG._13E

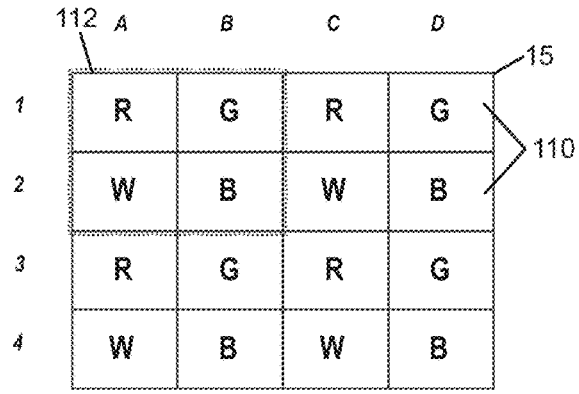
FIG._14A
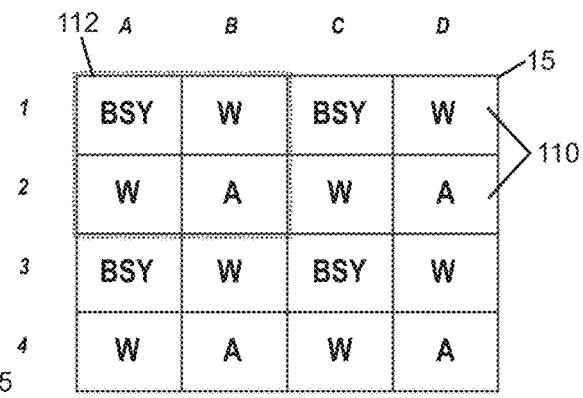
FIG._14C
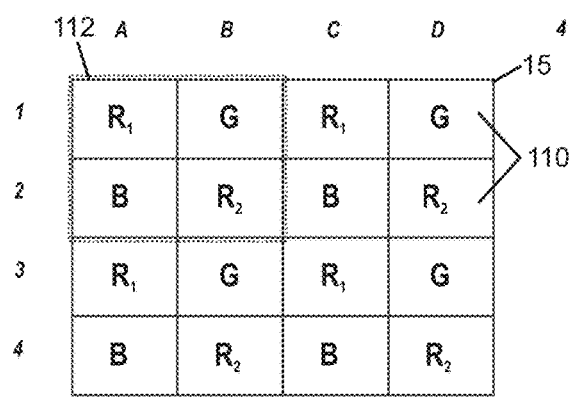
FIG._14B
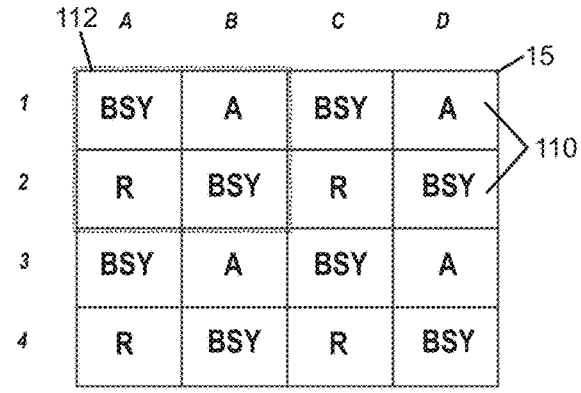
FIG._14D

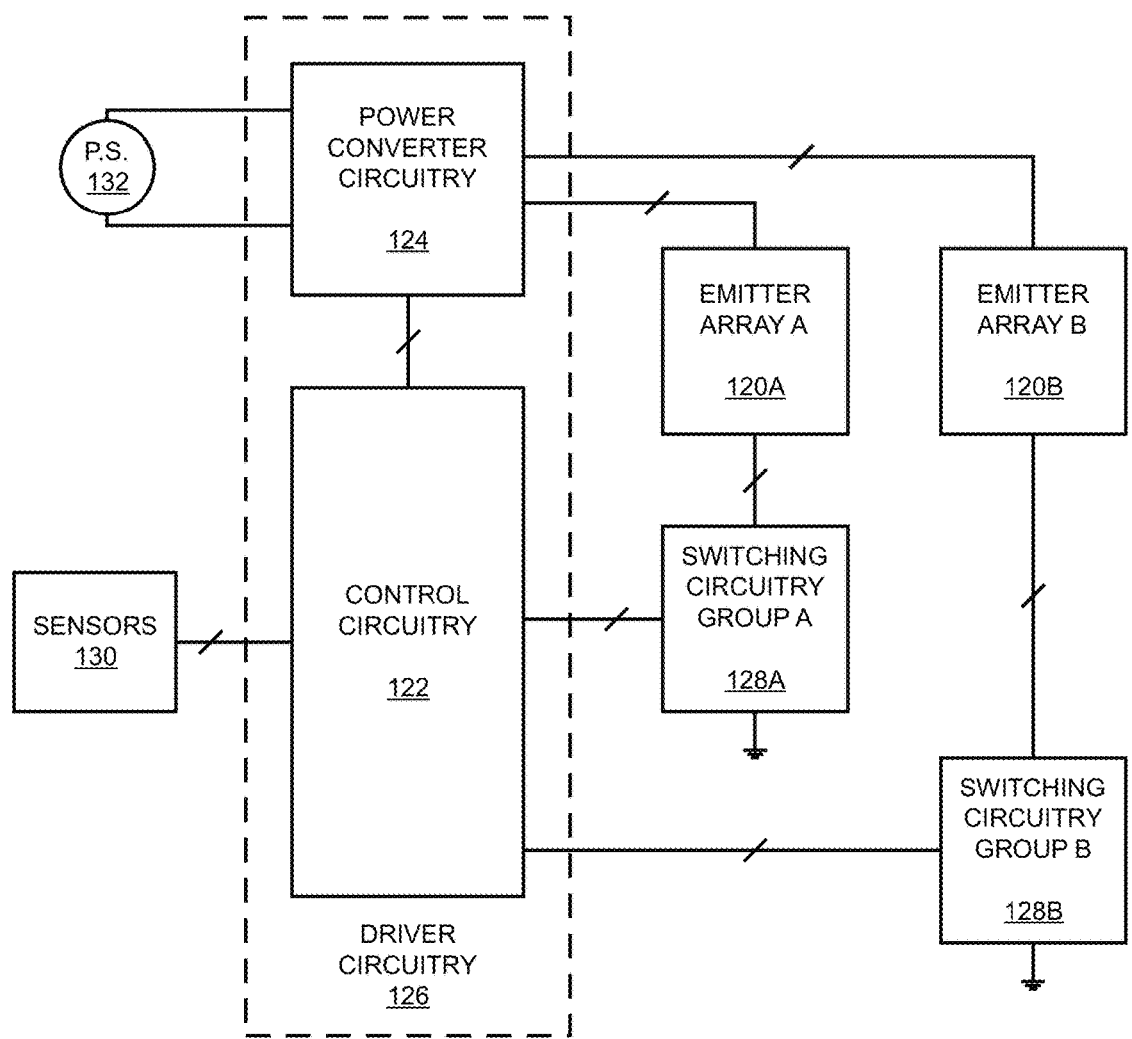
FIG._15

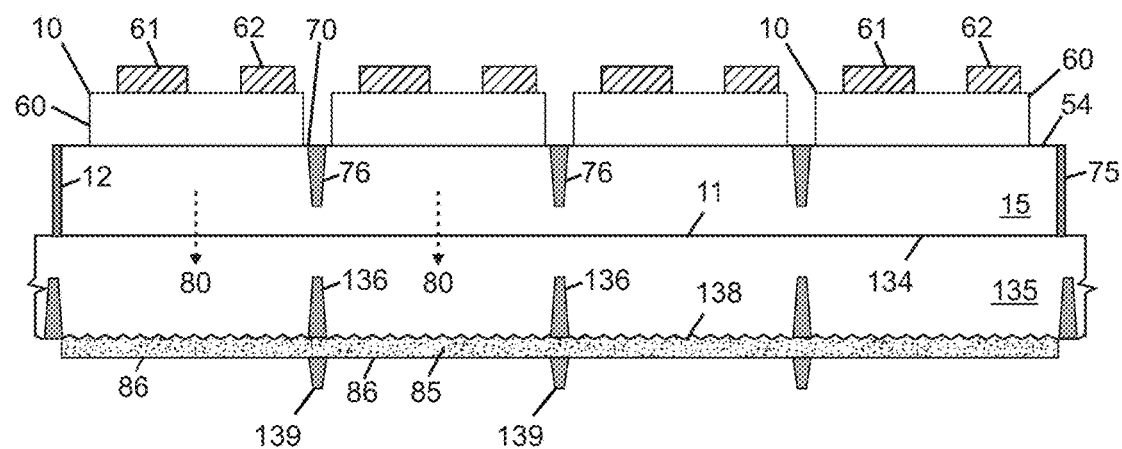
FIG._16

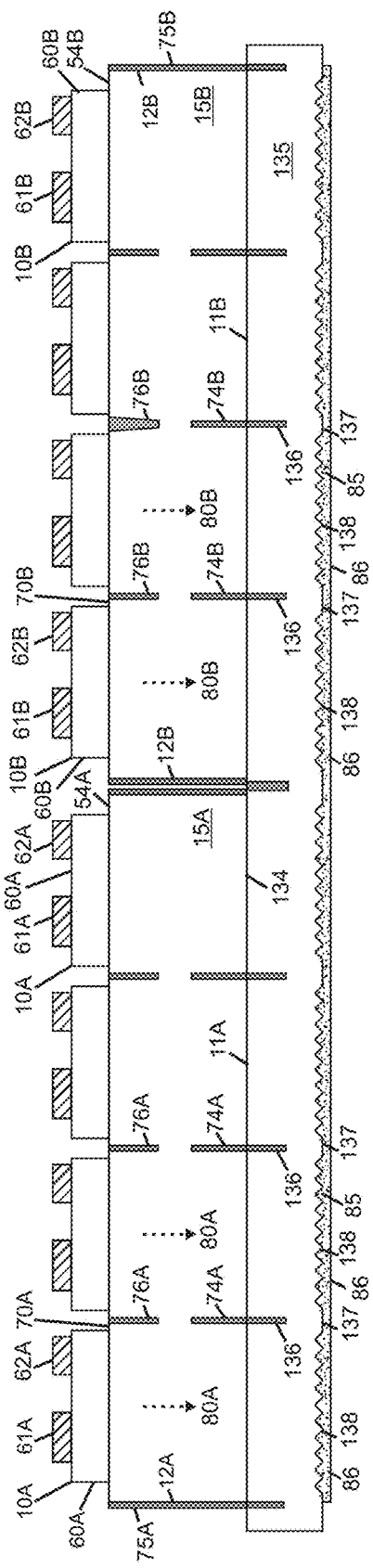
FIG._17
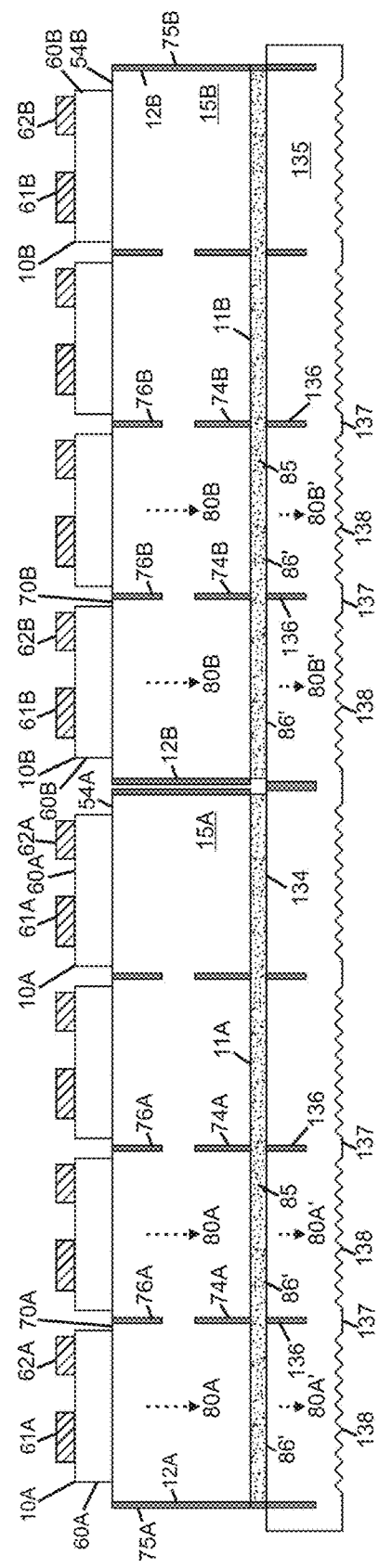
FIG._18

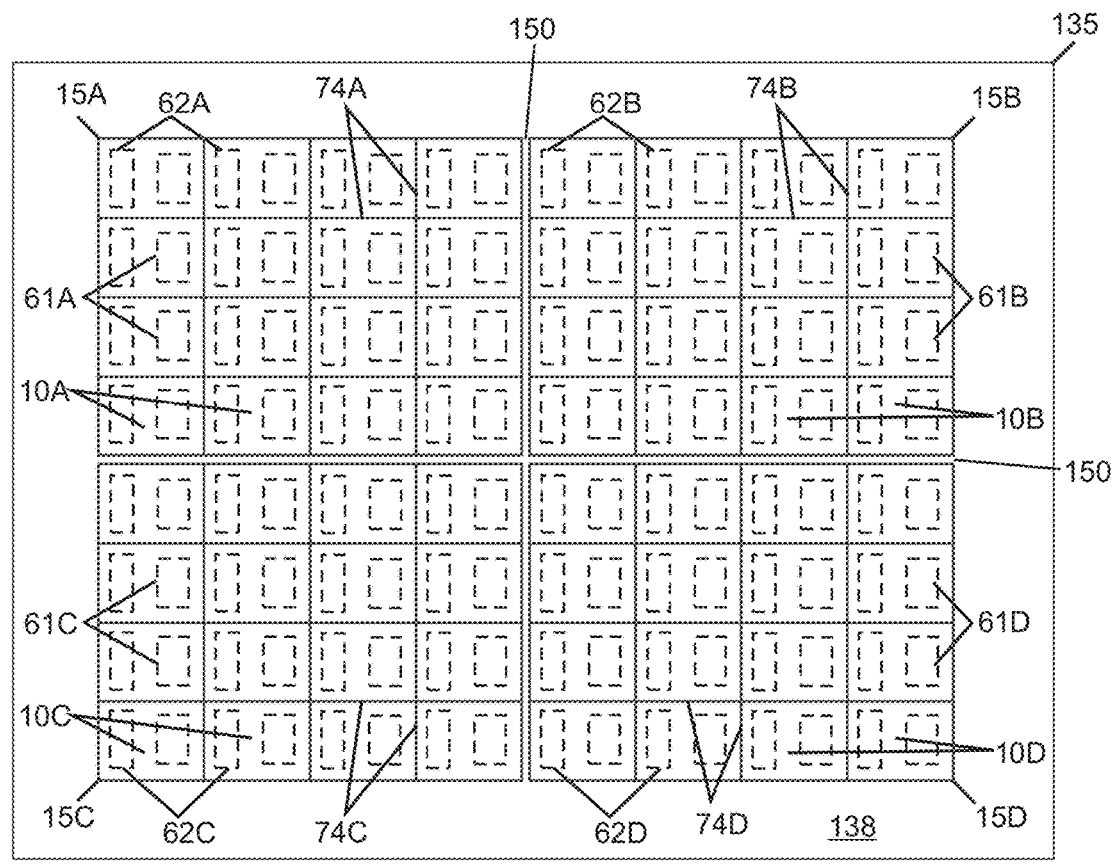
FIG._19

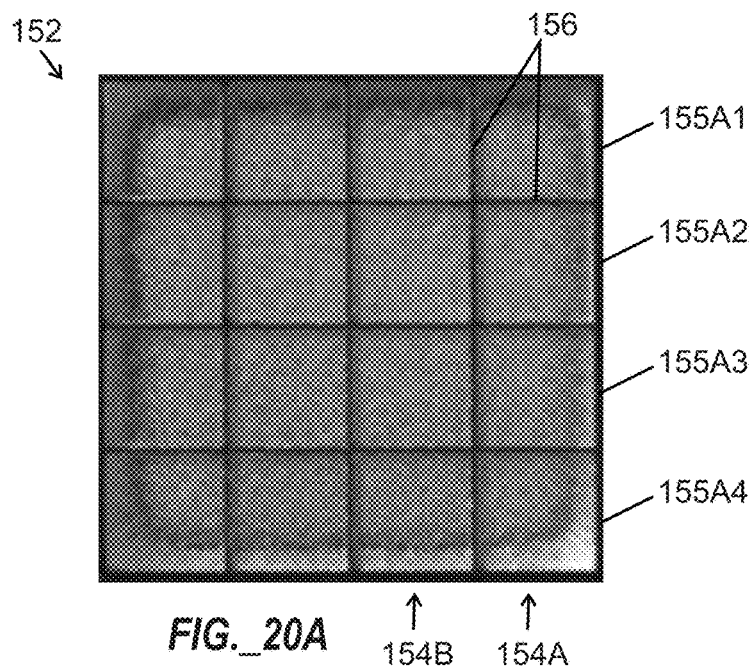
FIG._20A
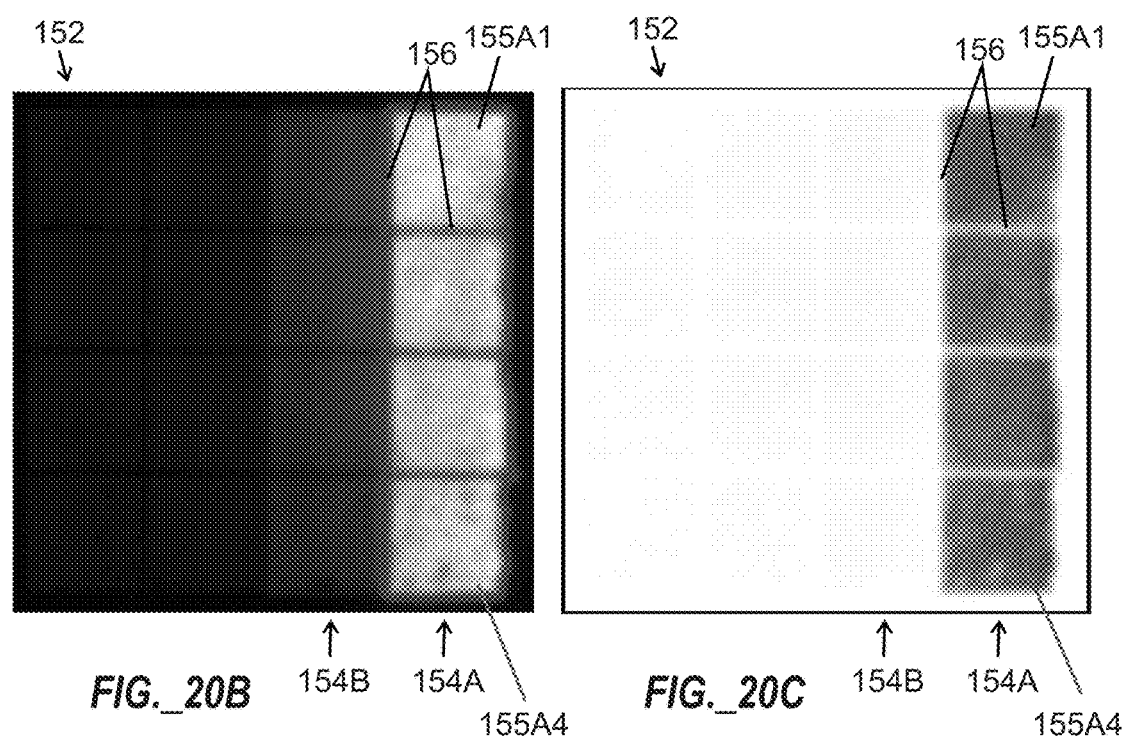
FIG._20B
FIG._20C

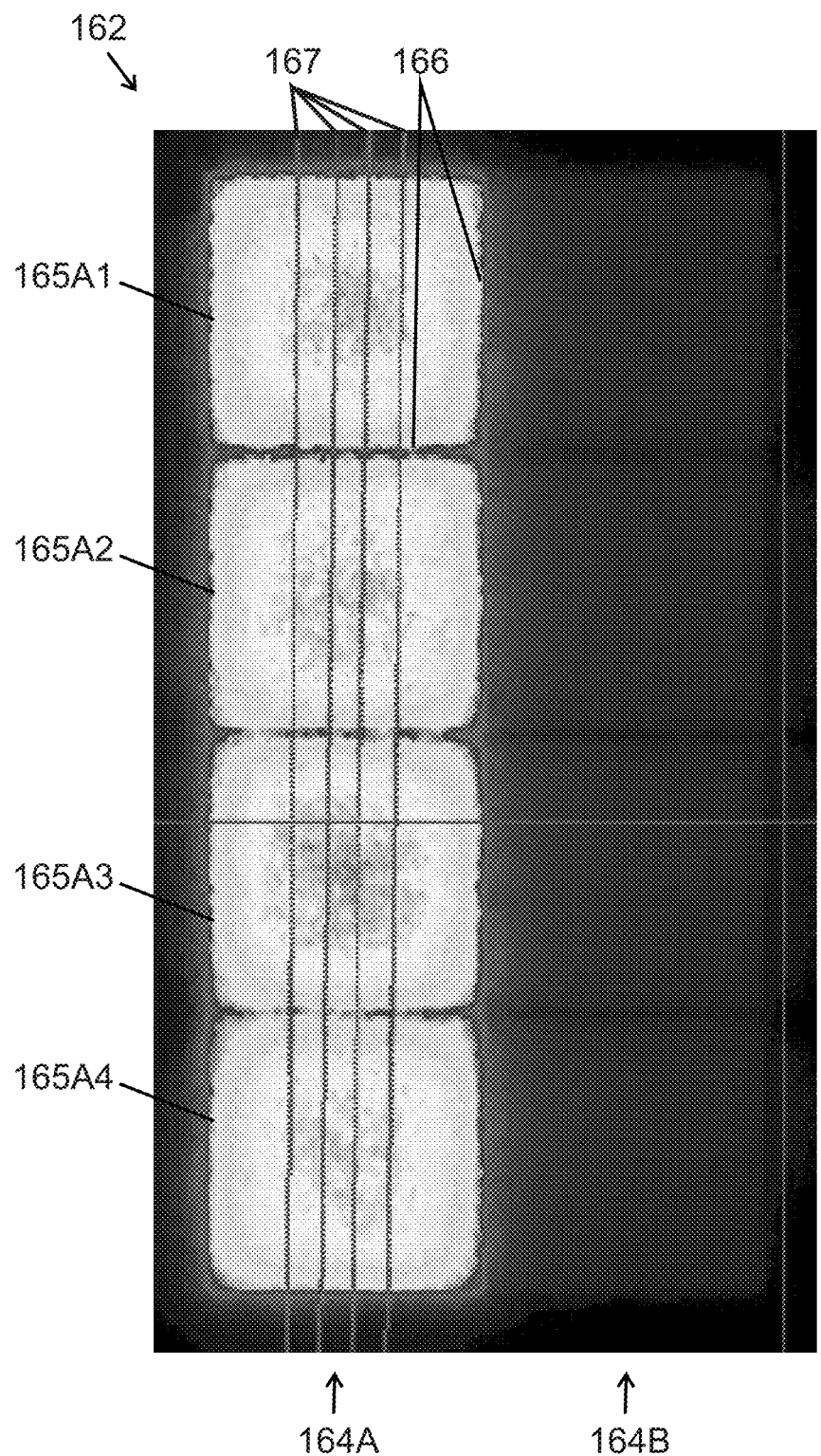
FIG._21A

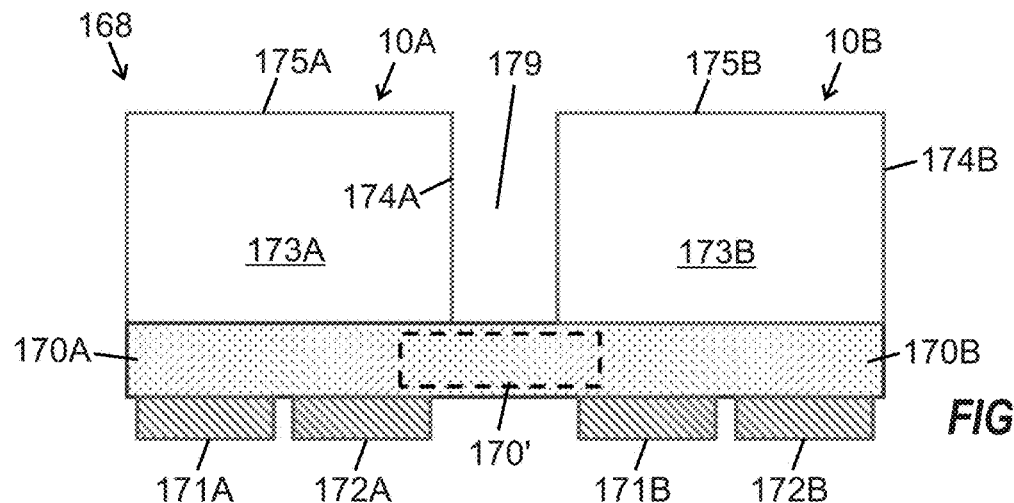
*FIG._22A*
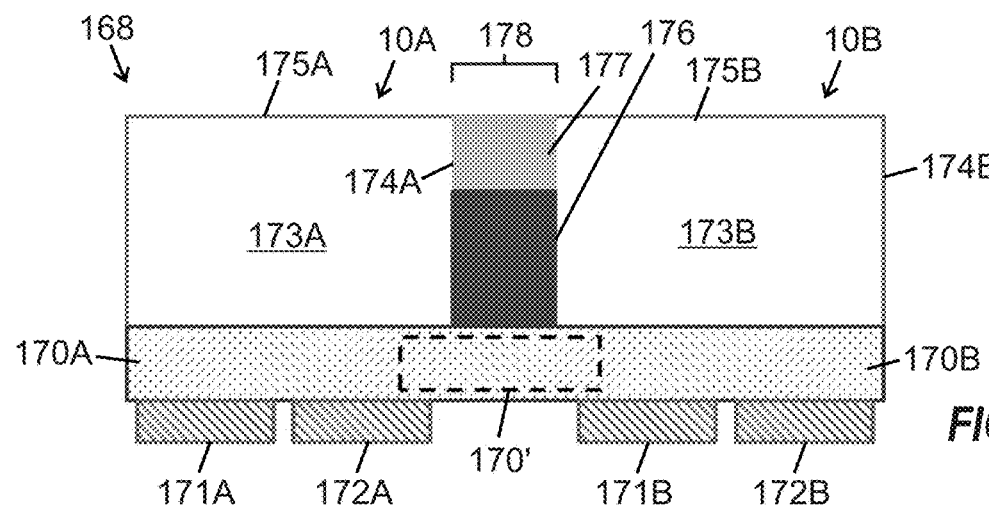
*FIG._22B*
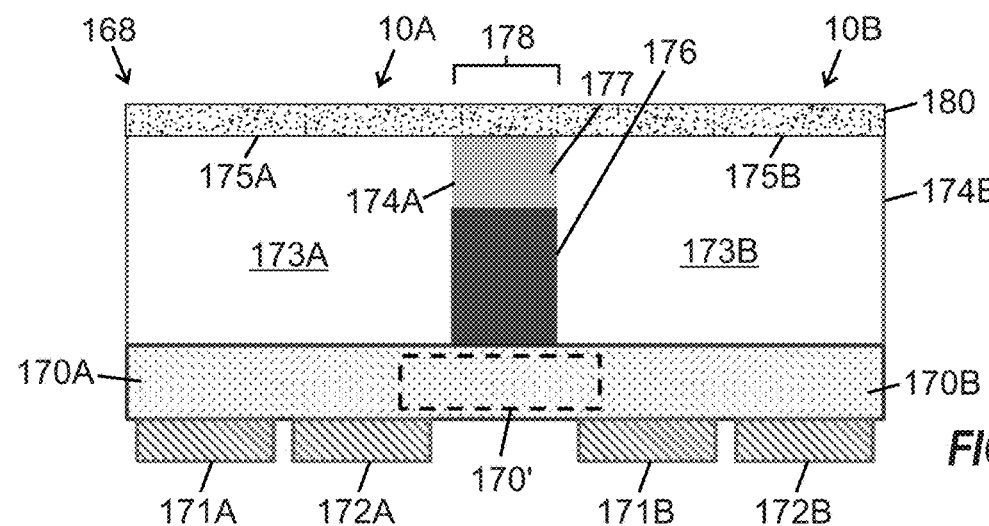
*FIG._22C*

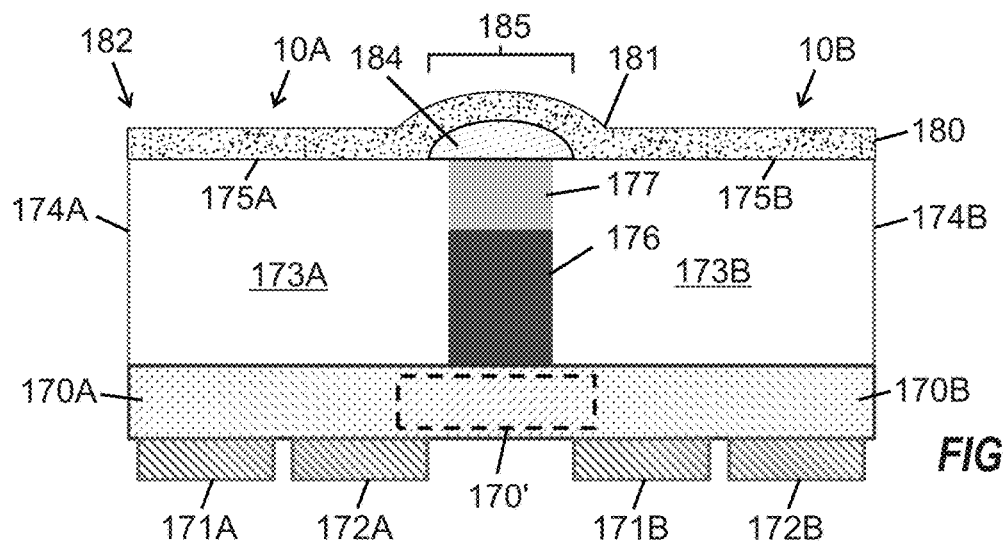
FIG._23A
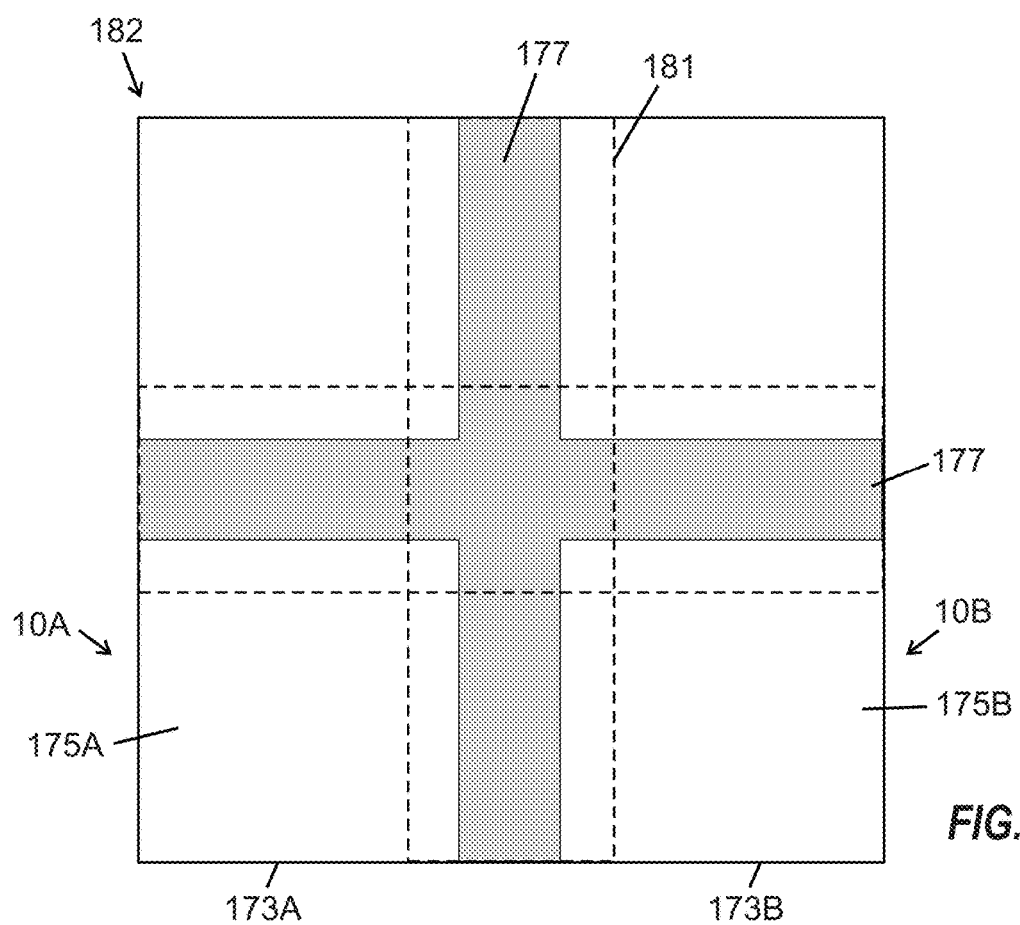
FIG._23B

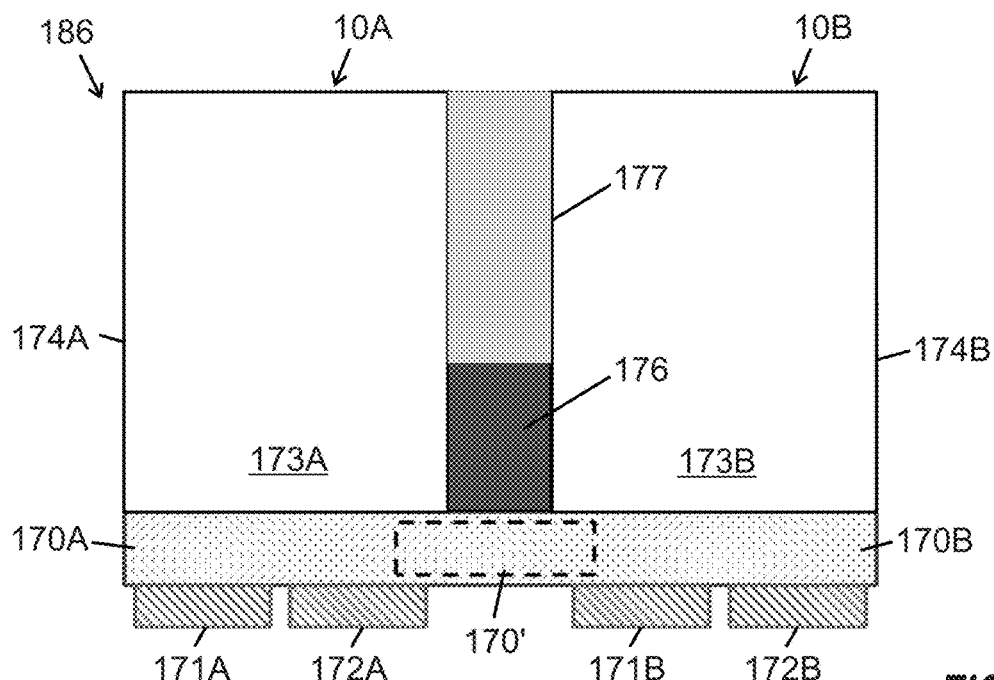
FIG._24A
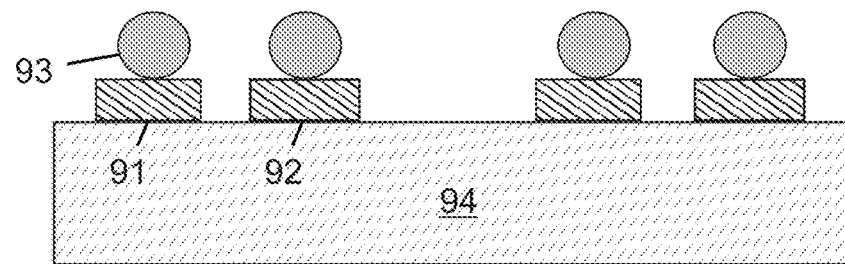
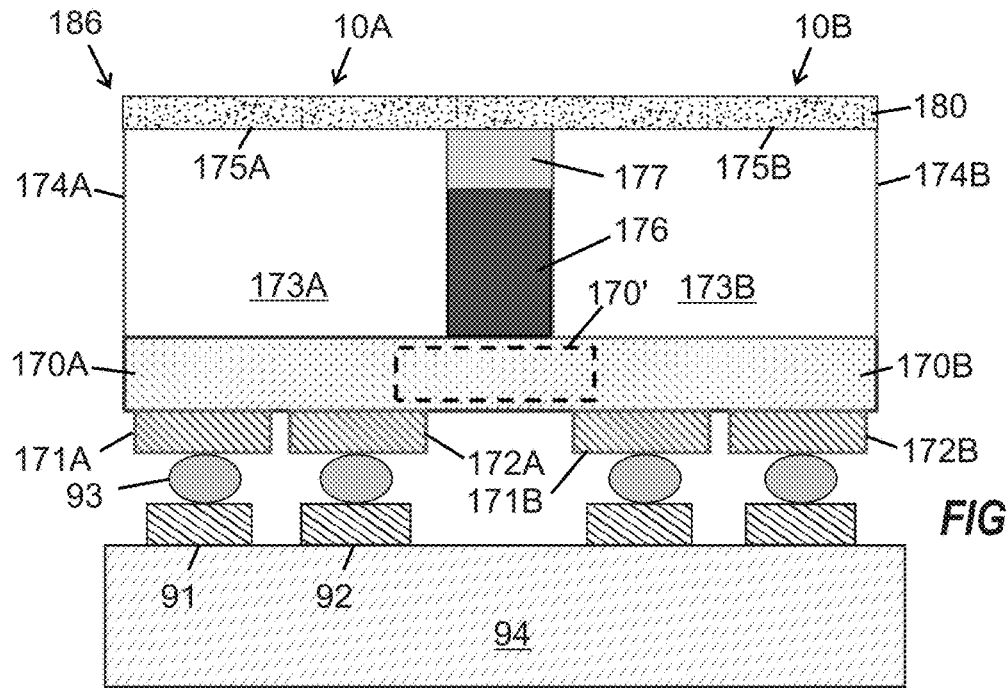
FIG._24B

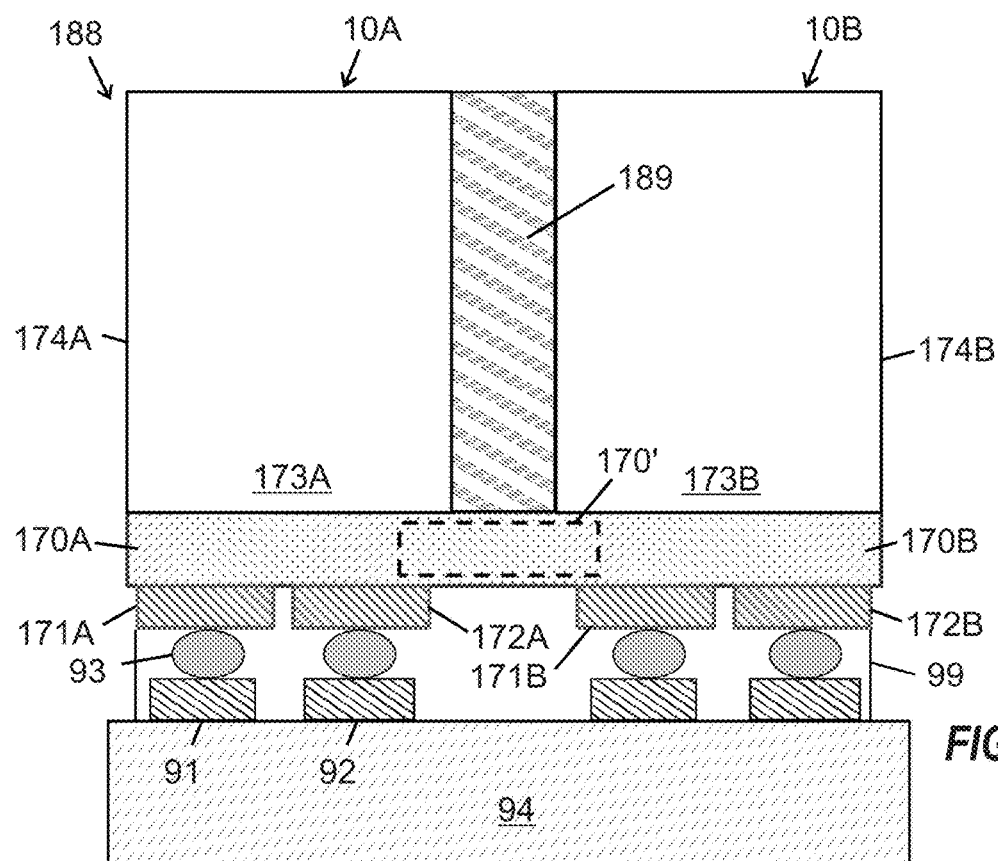
FIG._25A
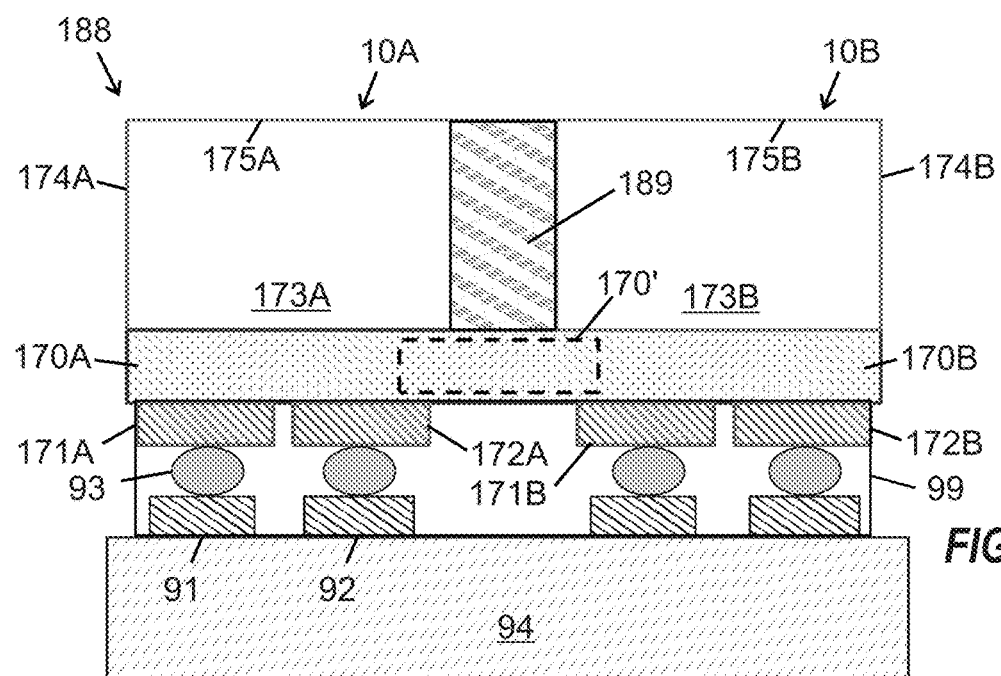
FIG._25B

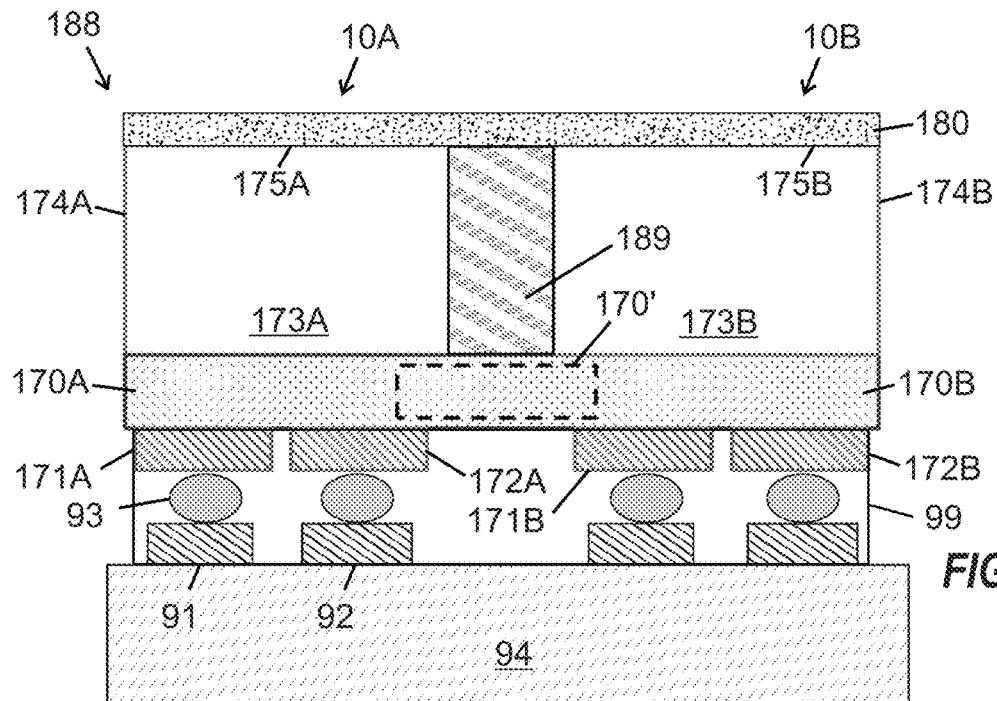
FIG._25C
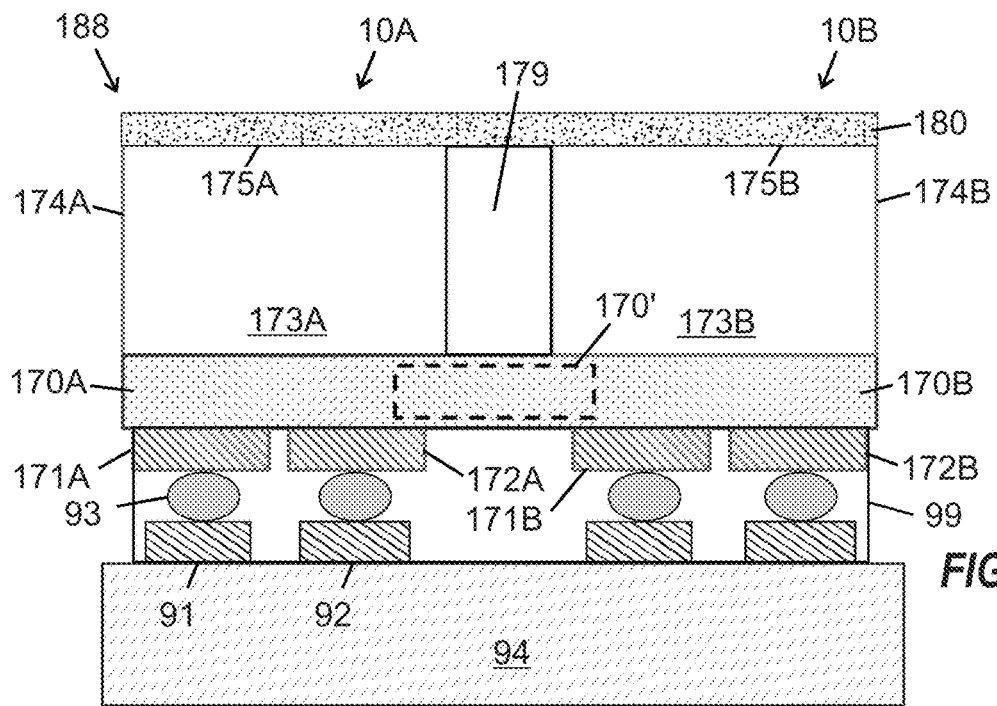
FIG._25D

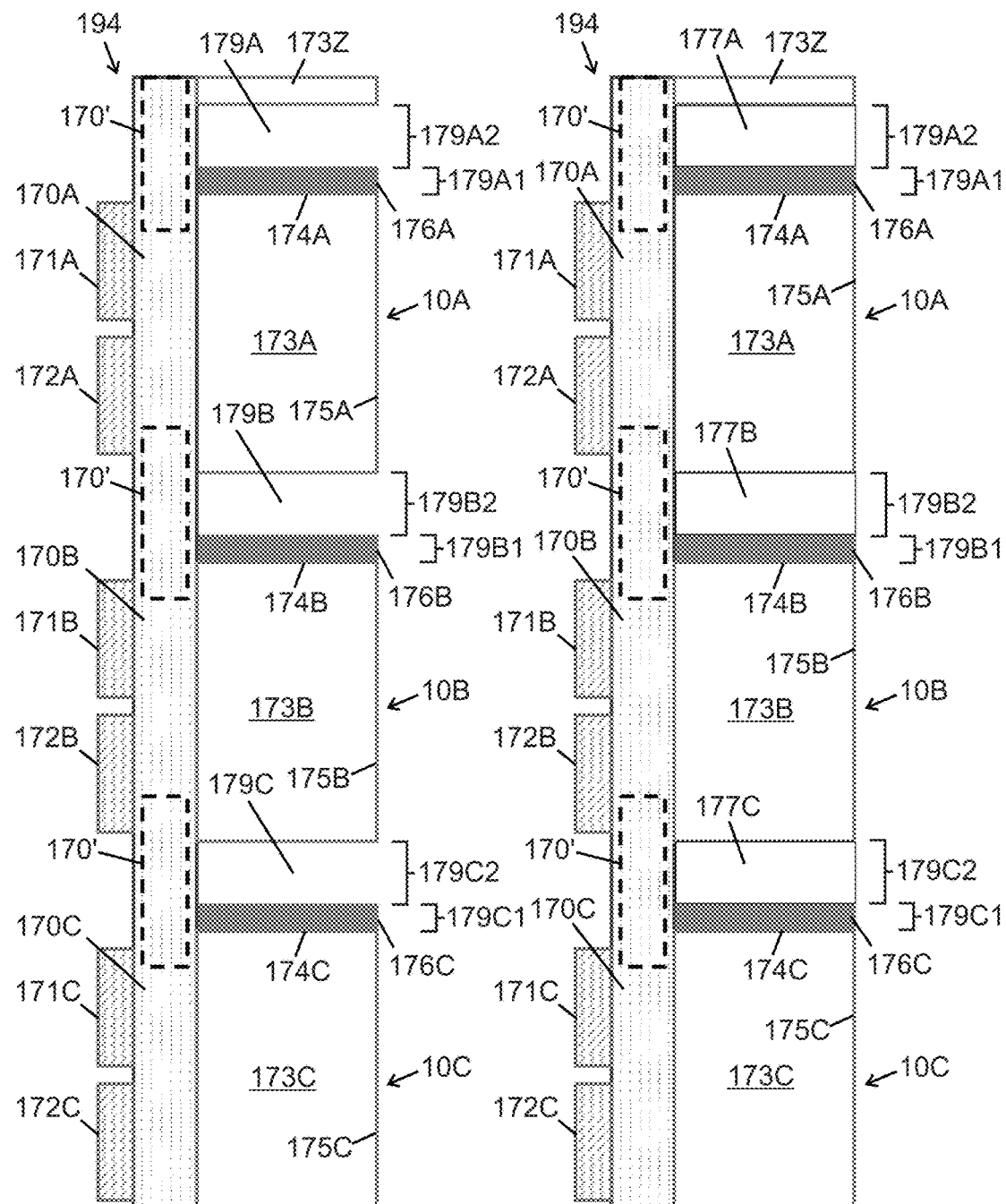
FIG._27A  FIG._27B

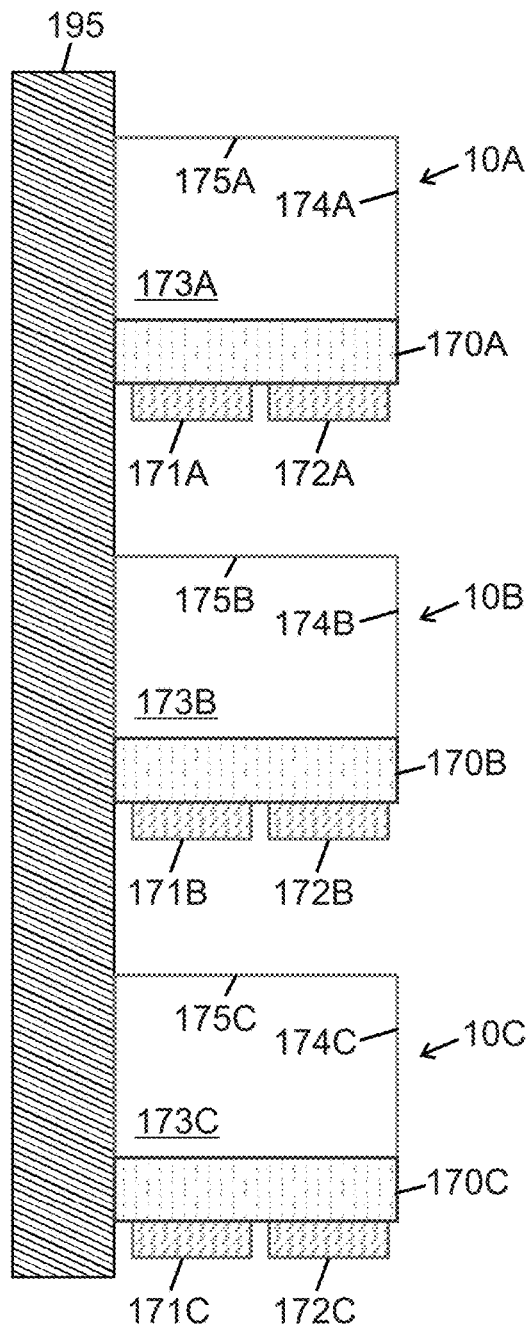 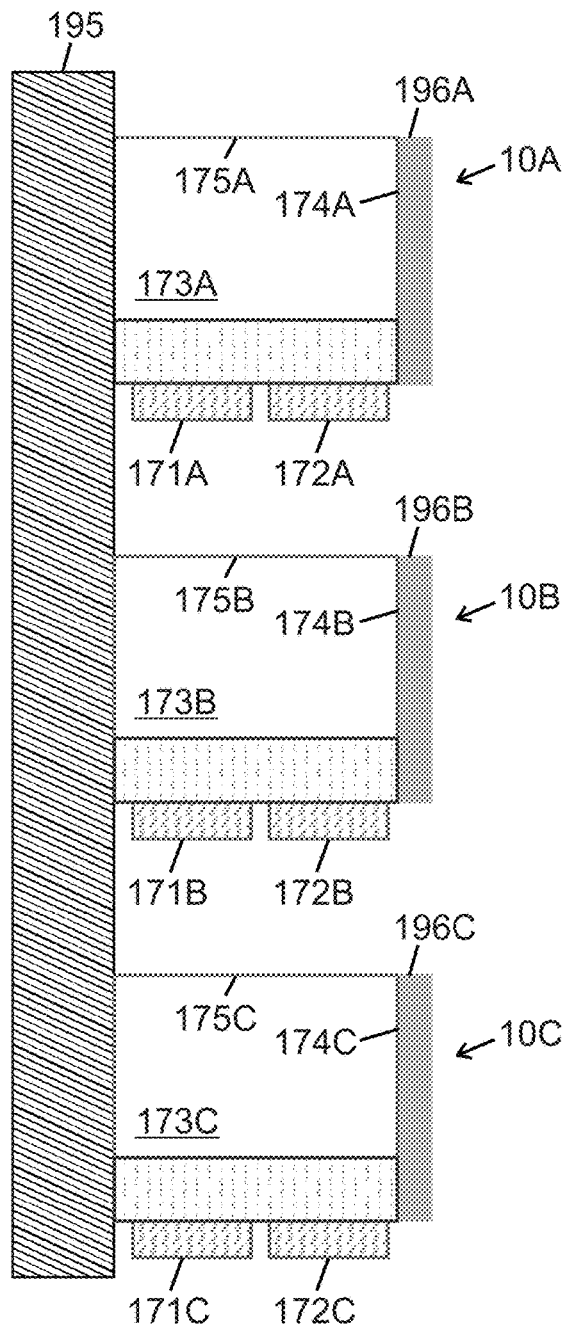
FIG._28A  FIG._28B

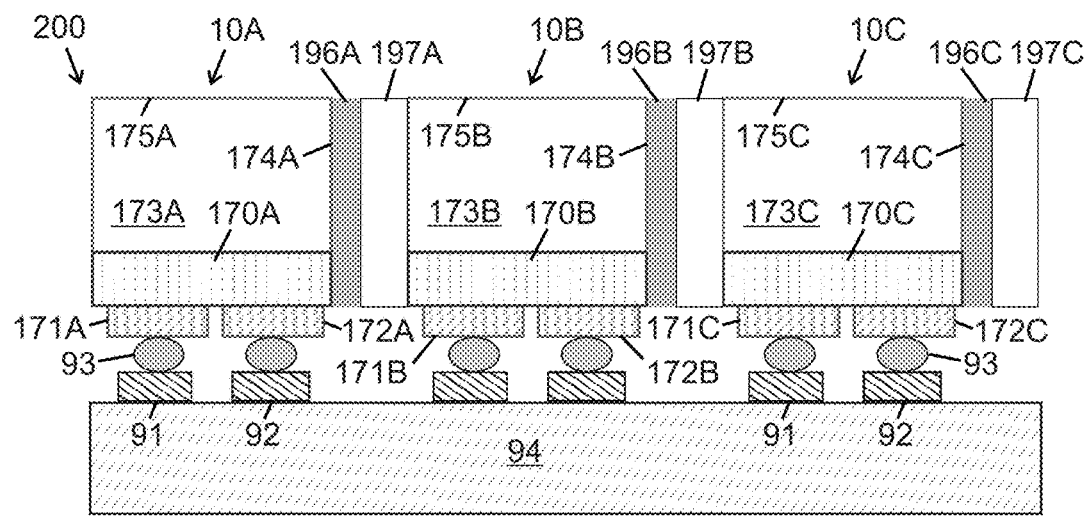
FIG._28C
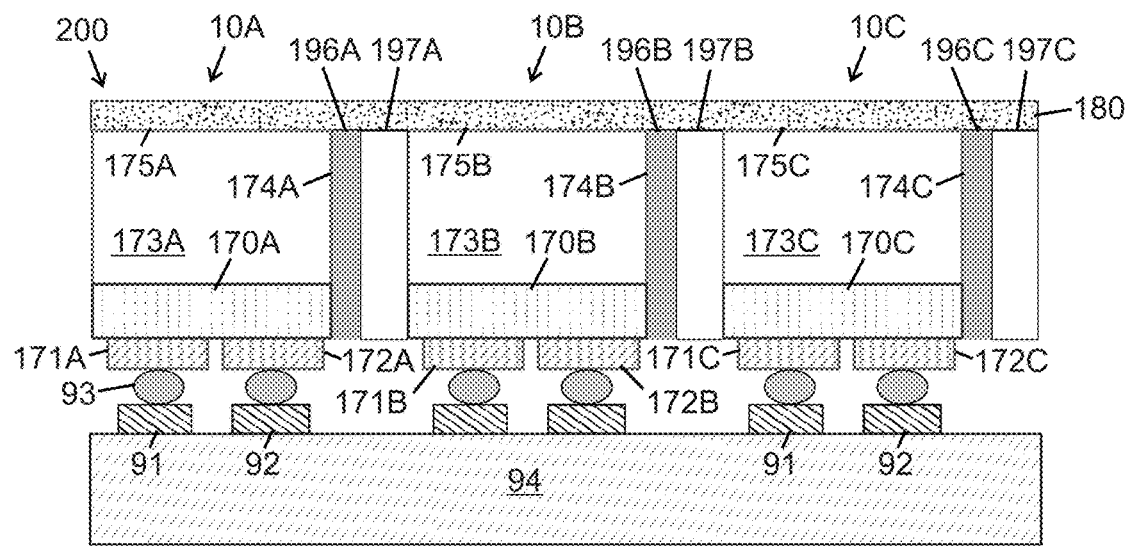
FIG._28D

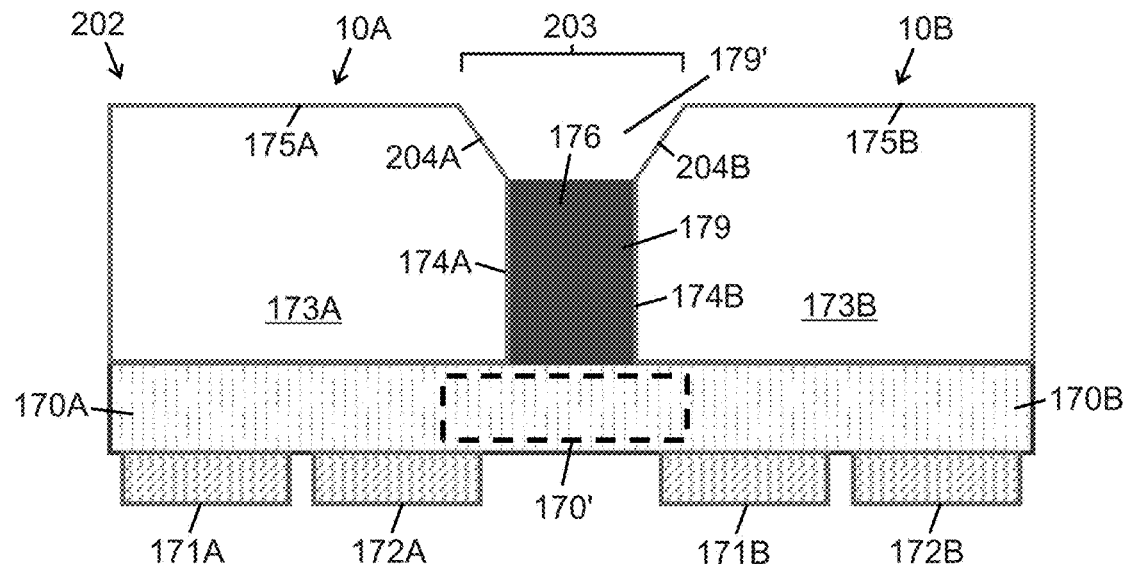
FIG._29A
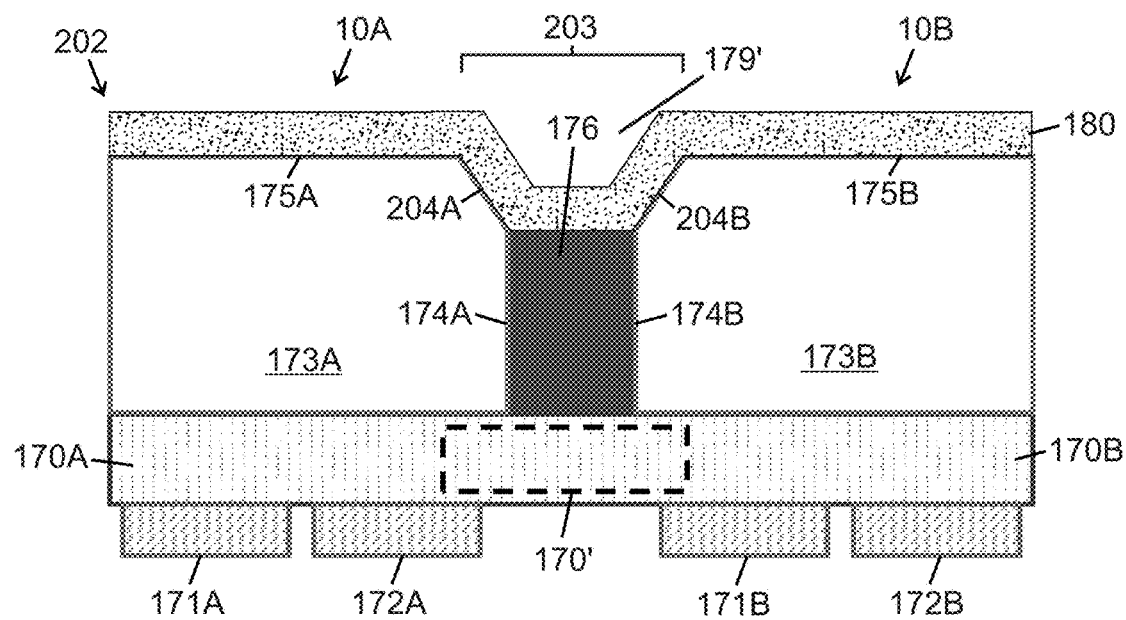
FIG._29B

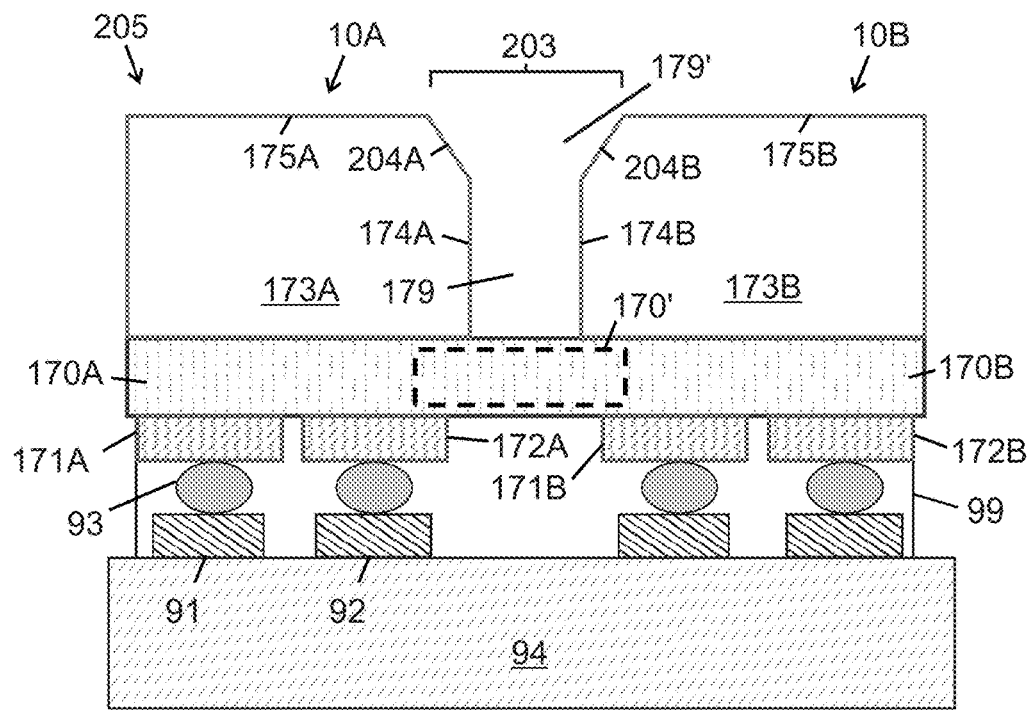
*FIG._30A*
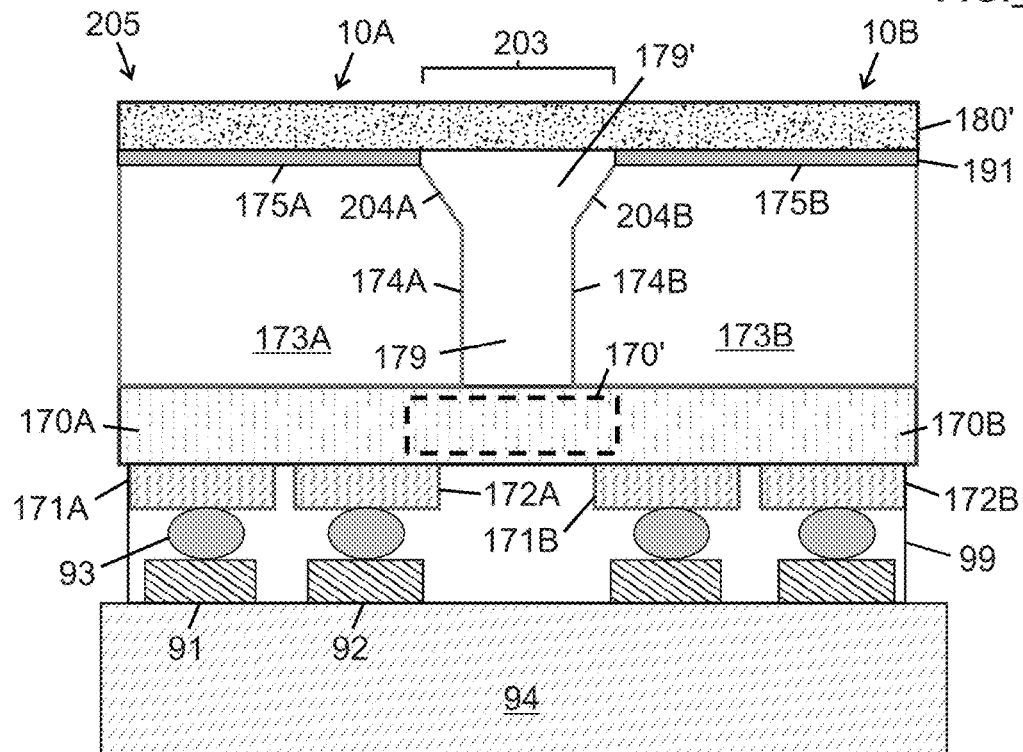
*FIG._30B*

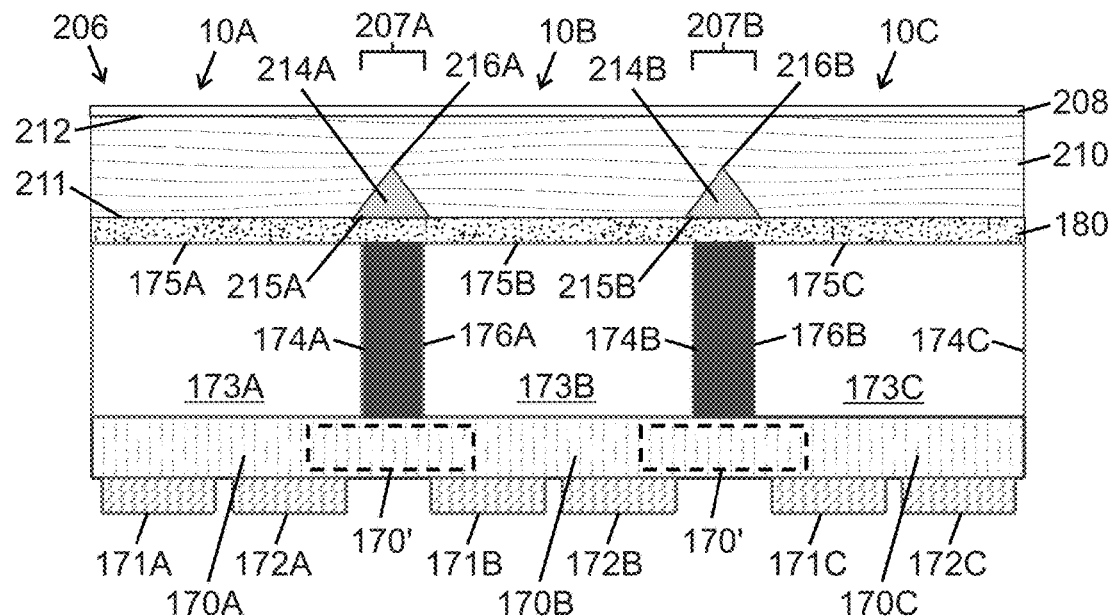
FIG._31
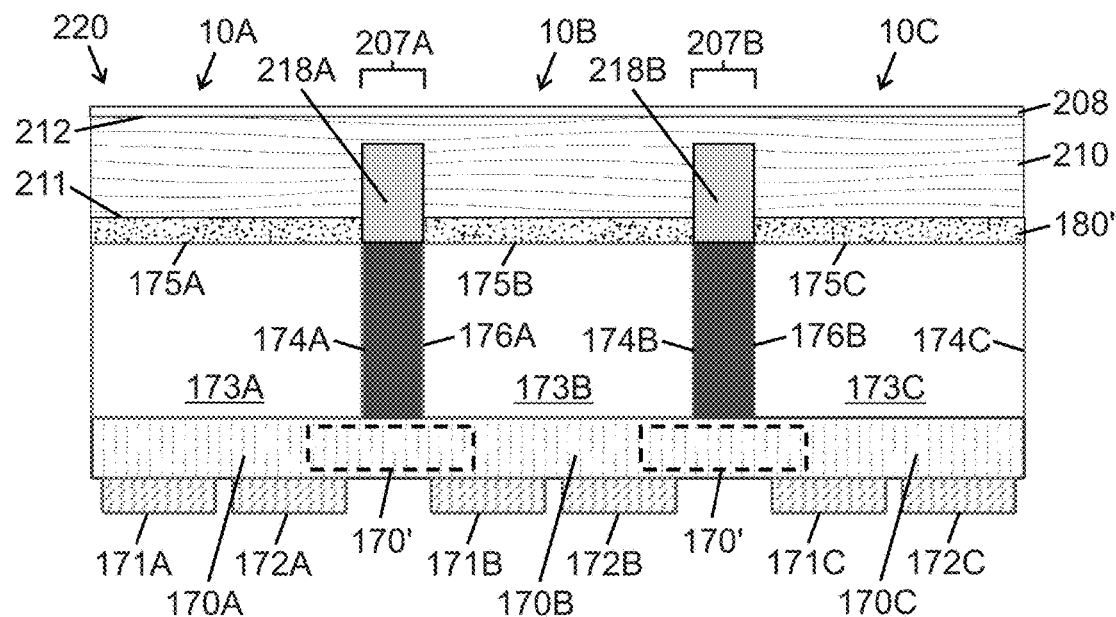
FIG._32

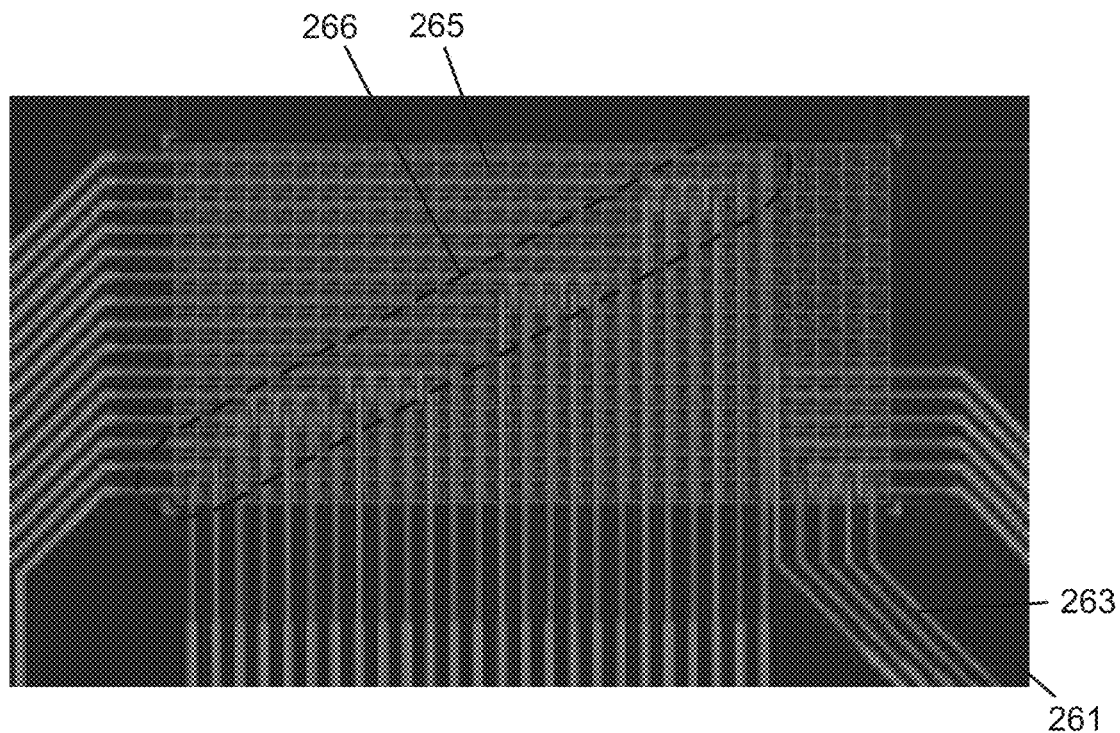
FIG._38A
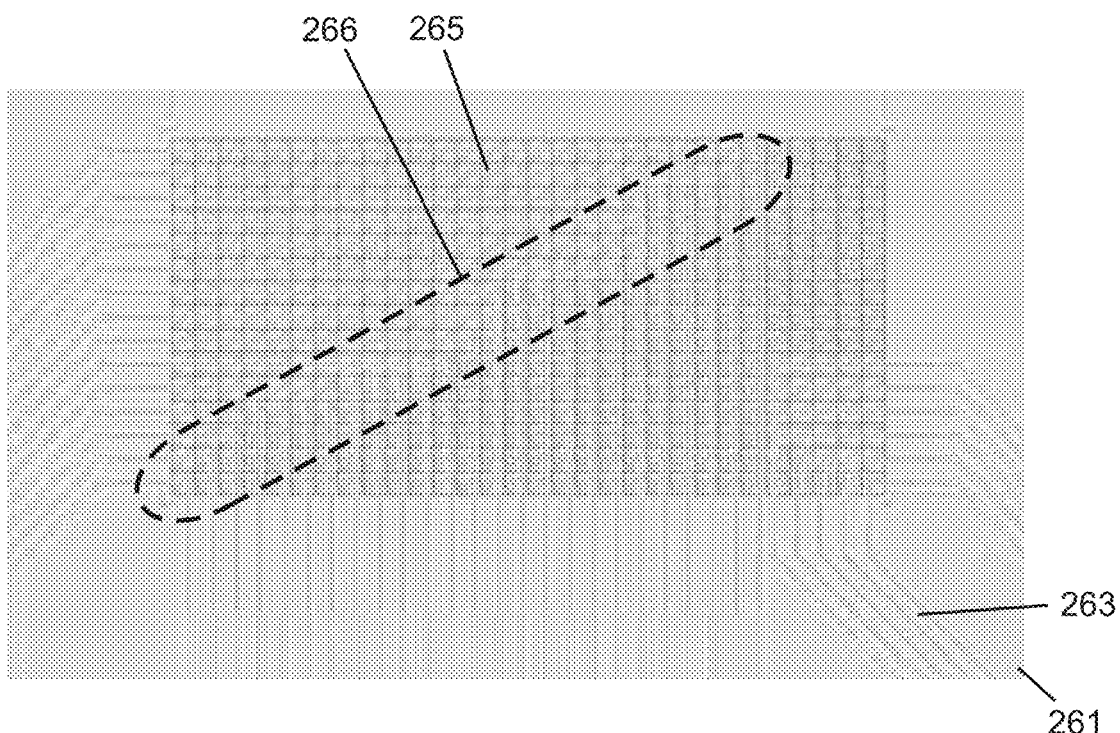
FIG._38B

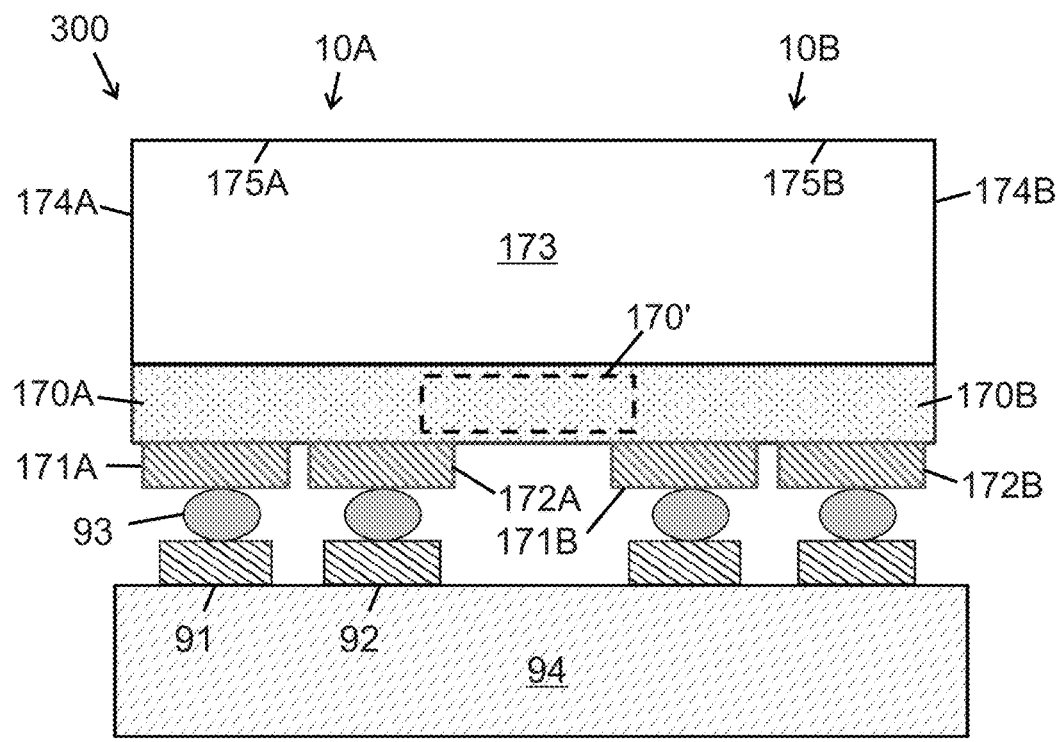
FIG._40A
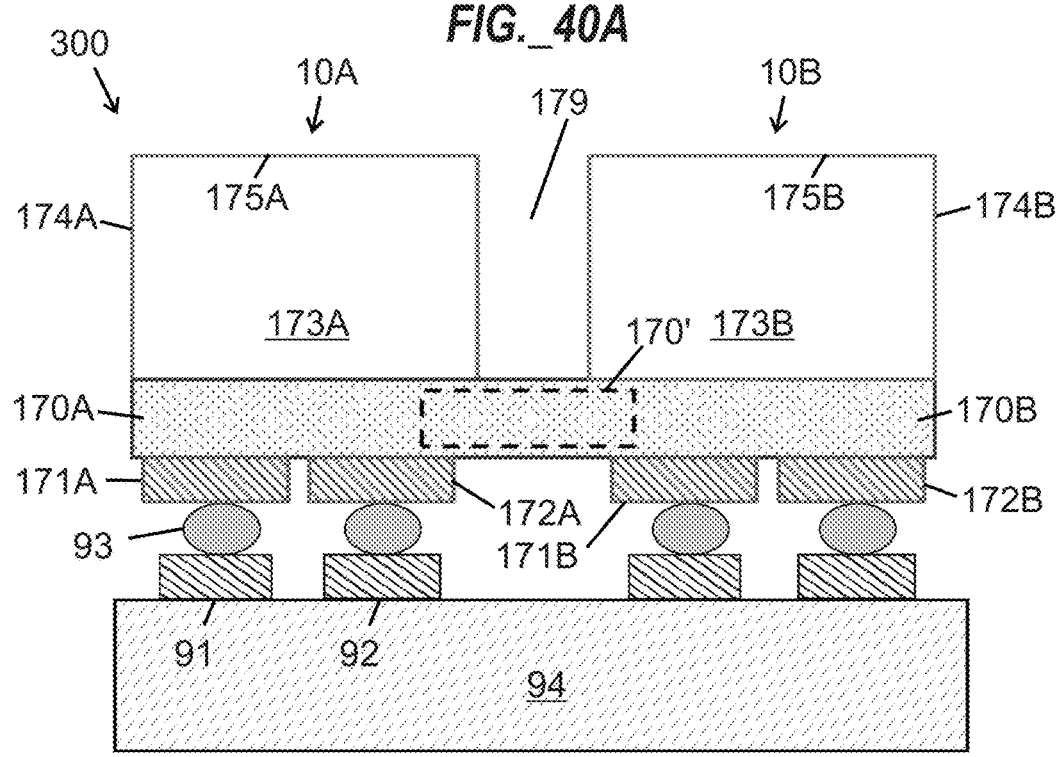
FIG._40B

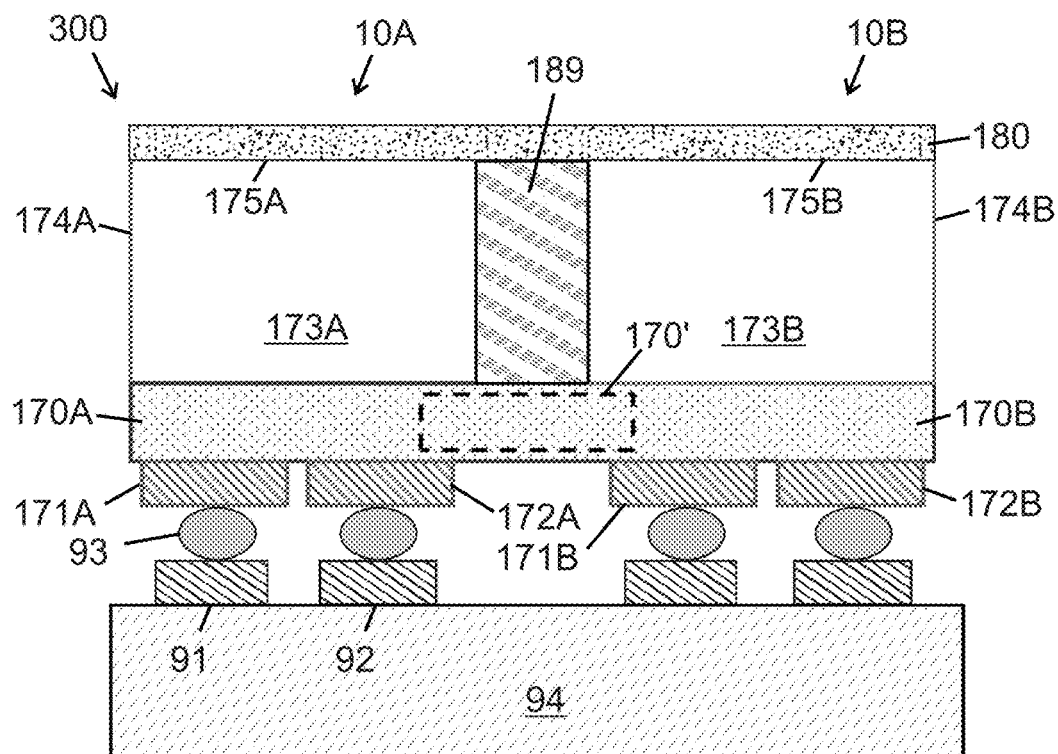
*FIG._40C*
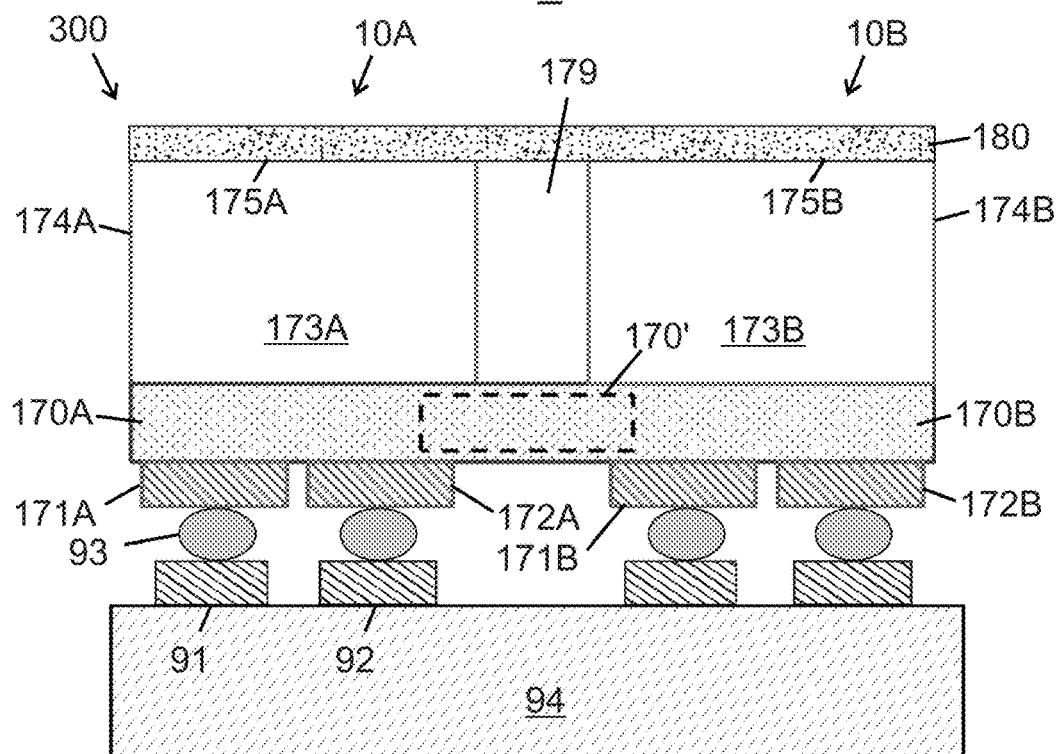
*FIG._40D*

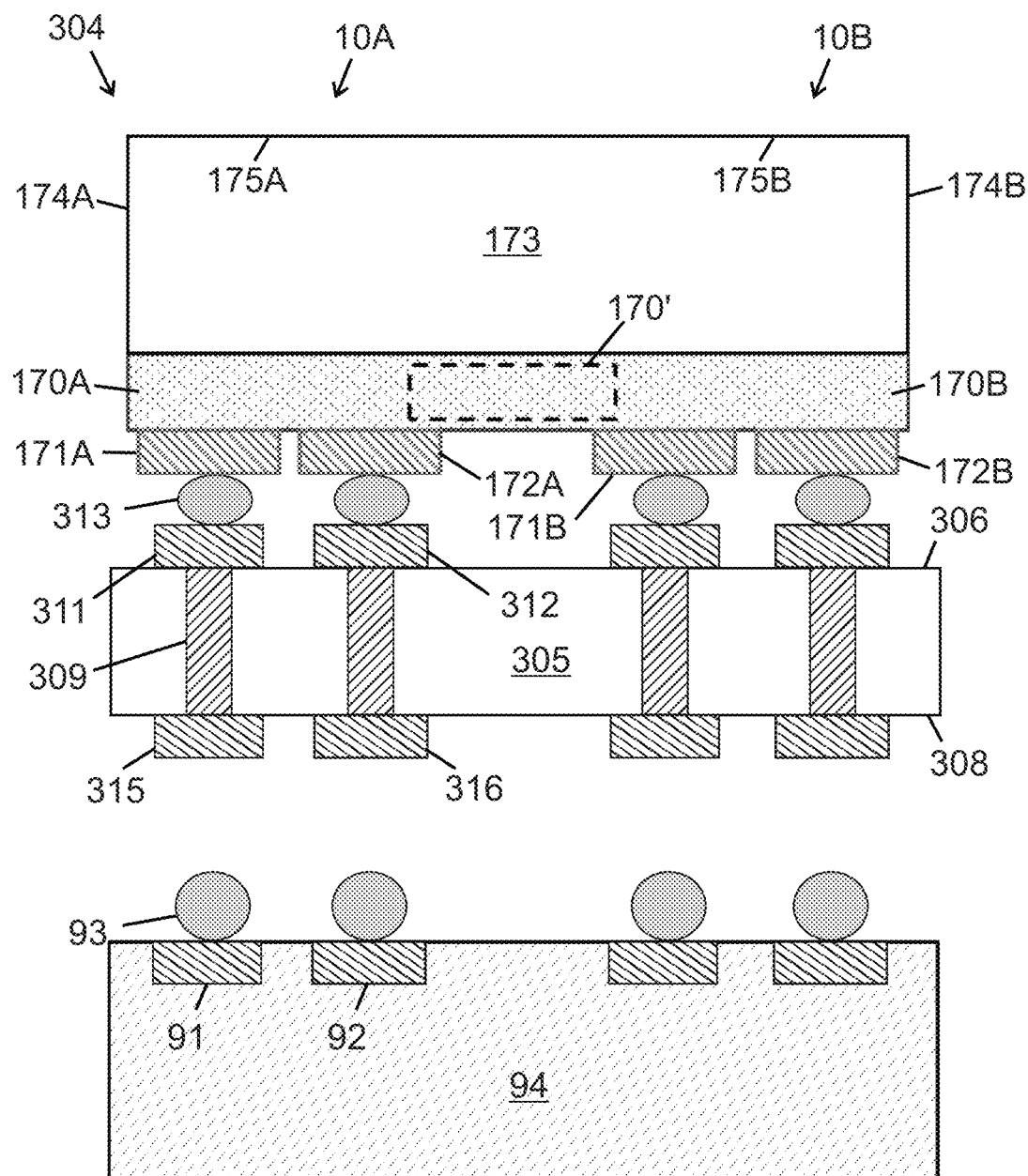
FIG._41

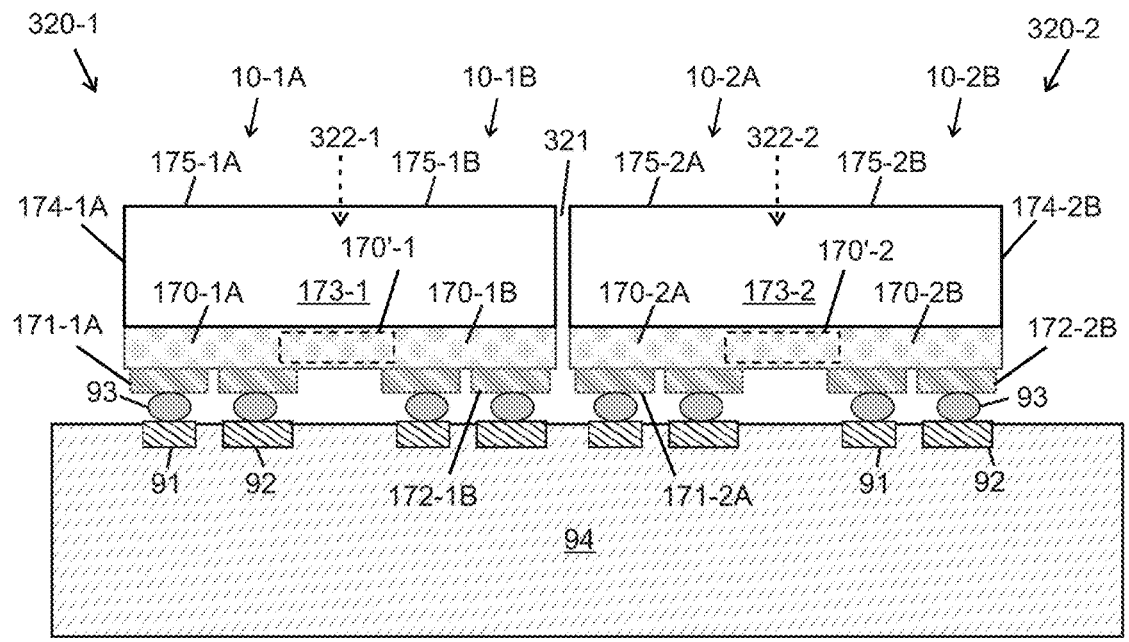
FIG._42
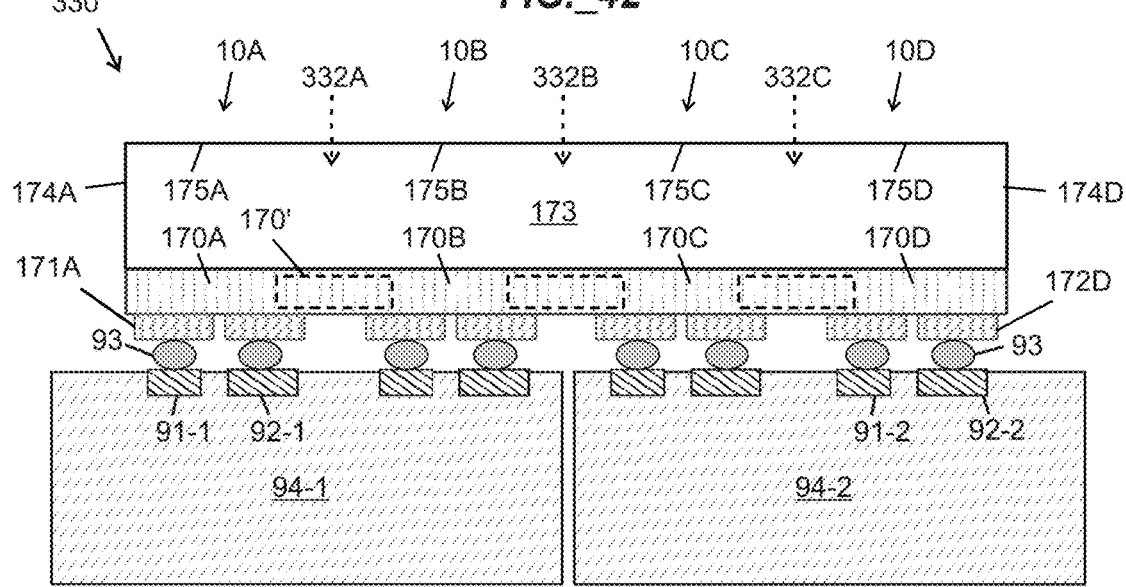
FIG._43

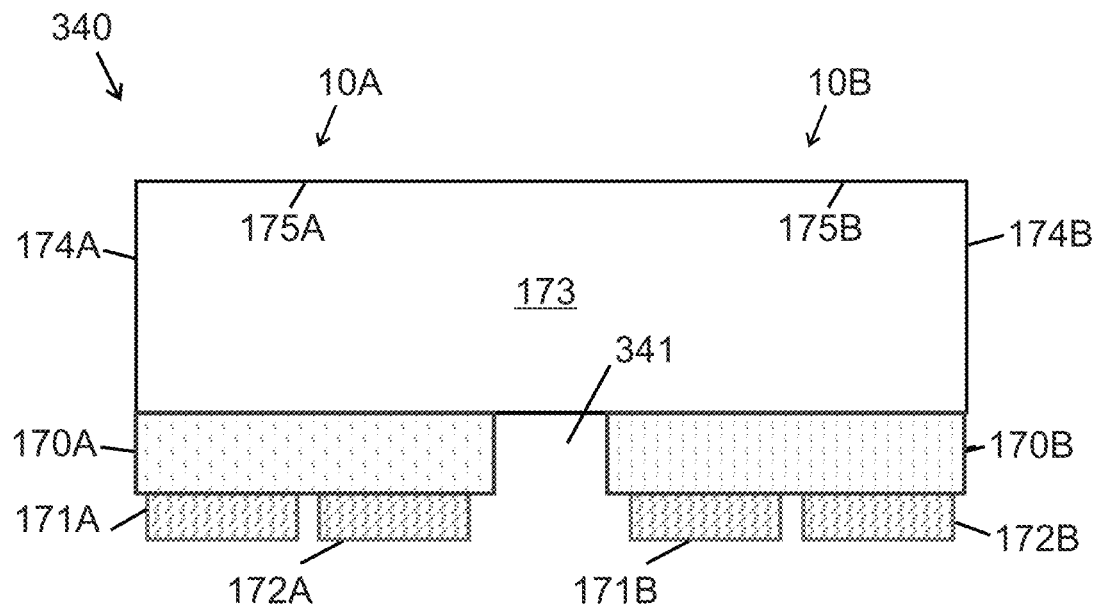
*FIG._44A*
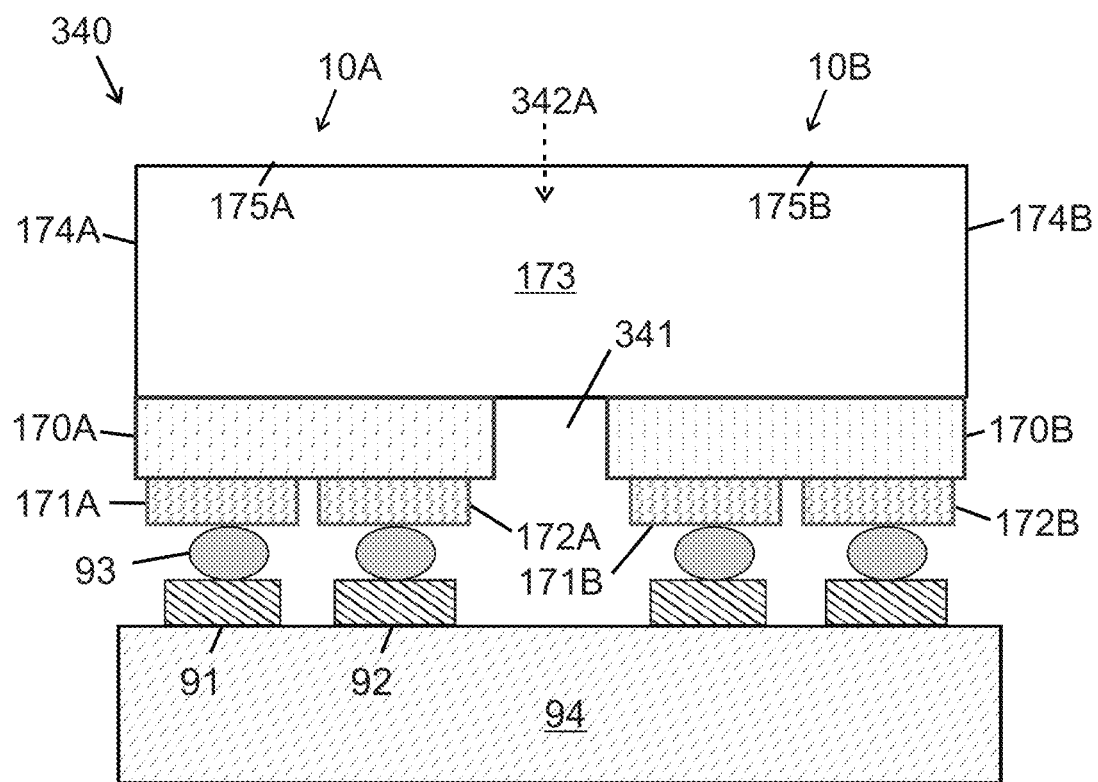
*FIG._44B*

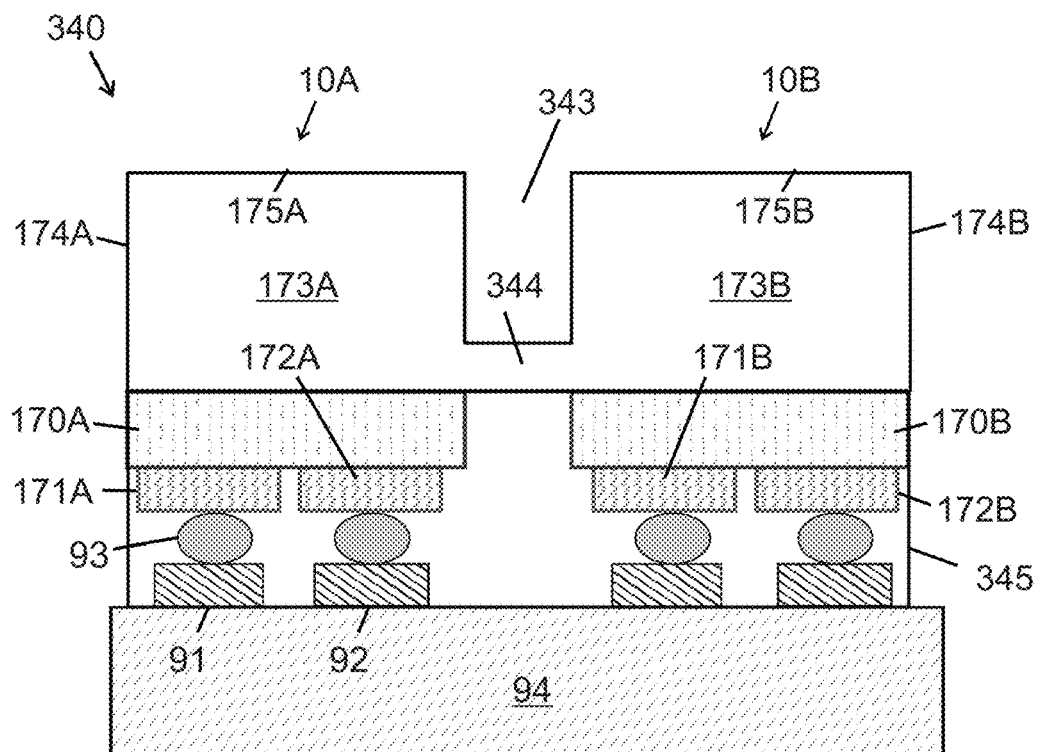
FIG._44C
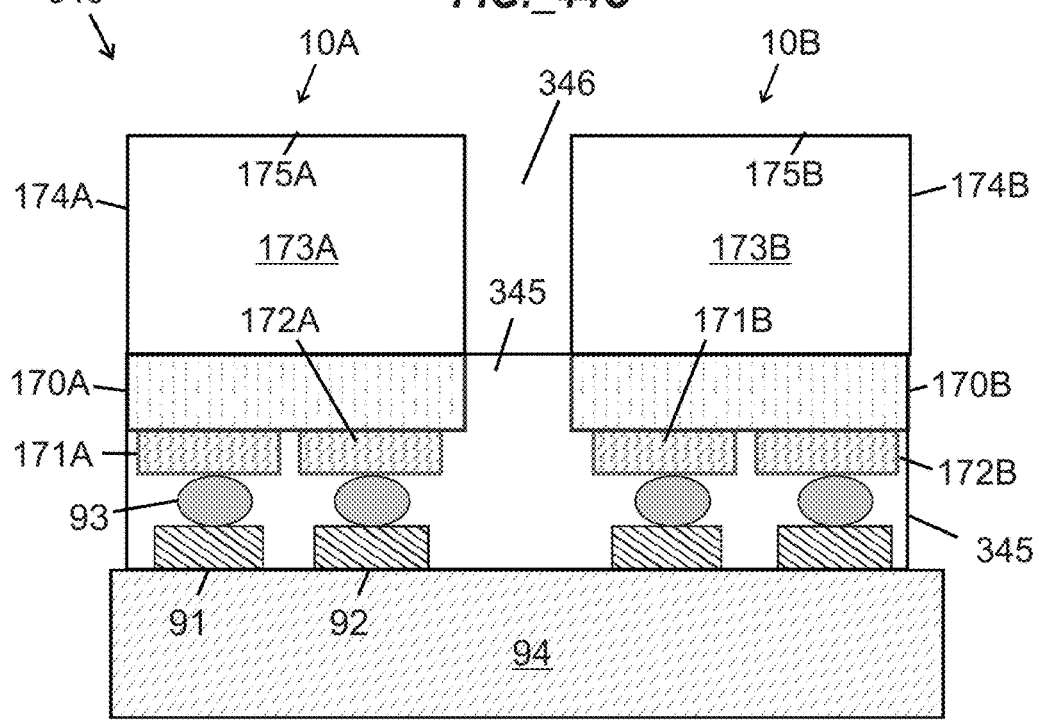
FIG._44D

HIGH DENSITY PIXELATED LED AND DEVICES AND METHODS THEREOF

CROSS-REFERENCE TO RELATED APPLICATION(S)

This application is a continuation of U.S. patent application Ser. No. 15/399,729 filed on Jan. 5, 2017, which is a non-provisional of U.S. Provisional Patent Application No. 62/321,514 filed on Apr. 12, 2016. The entire contents of the foregoing applications are hereby incorporated by reference herein.

TECHNICAL FIELD

Subject matter herein relates to solid state light-emitting devices, including addressable light emitting diode (LED) array chips with reduced interaction between emissions of adjacent emitters, devices incorporating one or more LED array chips, and LED displays and illumination apparatuses including such devices as well as related fabrication methods.

BACKGROUND

LEDs have been widely adopted in various illumination contexts, for backlighting of liquid crystal display (LCD) systems (e.g., as a substitute for cold cathode fluorescent lamps), and for sequentially illuminated LED displays. Applications utilizing LED arrays include vehicular headlamps, roadway illumination, light fixtures, and various indoor, outdoor, and specialty contexts. Desirable characteristics of LED devices include high luminous efficacy, long lifetime, and wide color gamut.

Conventional LCD systems require color filters (e.g., red, green, and blue) that inherently reduce light utilization efficiency. Sequential illuminated LED displays, which utilize self-emitting LEDS and dispense with the need for backlights and color filters, provide enhanced light utilization efficiency.

Large format multi-color sequentially illuminated LED displays (including full color LED video screens) typically include numerous individual LED panels, packages, and/or components providing image resolution determined by the distance between adjacent pixels or "pixel pitch." Sequentially illuminated LED displays include "RGB" three-color displays with arrayed red, green and blue LEDs, and "RG" two-color displays may include arrayed red and green LEDs. Other colors and combinations of colors may be used. Large format displays (e.g., electronic billboards and stadium displays) intended for viewing from great distances typically have relatively large pixel pitches and usually include discrete LED arrays with multi-color (e.g., red, green, and blue) LEDs that may be independently operated to form what appears to a viewer to be a full color pixel. Medium-sized displays with relatively shorter viewing distances require shorter pixel pitches (e.g., 3 mm or less), and may include panels with arrayed red, green, and blue LED components mounted on a single electronic device attached to a driver printed circuit board (PCB) that controls the LEDs.

Various LED array applications, including (but not limited to) high resolution displays suitable for very short viewing distances, as well as vehicular headlamps, may benefit from smaller pixel pitches; however, practical considerations have limited their implementation. Conventional pick-and-place techniques useful for mounting LED components and packages to PCBs may be difficult to implement in a reliable manner in high-density arrays with small pixel pitches. Additionally, due to the omnidirectional character of LED and phosphor emissions, it may be difficult to prevent emissions of one LED (e.g., a first pixel) from significantly overlapping emissions of another LED (e.g., a second pixel) of an array, which would impair the effective resolution of a LED array device. It may also be difficult to avoid non-illuminated or "dark" zones between adjacent LEDs (e.g., pixels) to improve homogeneity, particularly while simultaneously reducing crosstalk or light spilling between emissions of the adjacent LEDs. The art continues to seek improved LED array devices with small pixel pitches while overcoming limitations associated with conventional devices and production methods.

SUMMARY

The present disclosure relates in various aspects to solid state light emitting devices including at least one array of LEDs supported by a substrate, preferably including one or more lumiphoric materials arranged to receive emissions of at least some LEDs, and including light segregation elements configured to reduce interaction between emissions of different LEDs and/or lumiphoric material regions to reduce scattering and/or optical crosstalk, thereby preserving pixel-like resolution of the resulting emissions. In certain embodiments, a LED chip includes an array of multiple LEDs arranged on or over a growth substrate, a carrier substrate, and/or additional layers or substrates, with features promoting pixellation of emissions of the LED array. In certain embodiments, an array of LEDs is provided in a flip chip configuration.

In one aspect, a solid state light emitting device, optionally embodied in or incorporating a LED array chip, includes: an array of LEDs supported by a substrate and arranged to transmit LED emissions through a plurality of light-transmissive regions of the substrate; at least one lumiphoric material arranged on or over a light extraction surface of the substrate, wherein the at least one lumiphoric material is configured to receive at least a portion of the LED emissions and responsively generate lumiphor emissions, and wherein the at least one lumiphoric material includes a plurality of light output areas substantially registered with the plurality of light-transmissive regions; and a plurality of light segregation elements arranged at least partially within the substrate, wherein light segregation elements of the plurality of light segregation elements are arranged between different light-transmissive regions of the plurality of light-transmissive regions, and the plurality of light segregation elements is configured to reduce passage of LED emissions between the different light-transmissive regions.

In certain embodiments, each LED of the array of LEDs is provided in a flip chip configuration. In certain embodiments, each LED of the array of LEDs is individually addressable. In certain embodiments, the plurality of light segregation elements extends from the light extraction surface into an interior of the substrate.

In certain embodiments, the substrate includes a light injection surface that opposes the light extraction surface; and the plurality of light segregation elements extends from the light injection surface into an interior of the substrate. In certain embodiments, the substrate includes a light injection surface that opposes the light extraction surface; a first group of light segregation elements of the plurality of light segregation elements extends from the light injection surface into an interior of the substrate; and a second group of light segregation elements of the plurality of light segregation elements extends from the light extraction surface into the interior of the substrate.

In certain embodiments, the plurality of light segregation elements includes internal portions extending from an interior of the substrate to the light extraction surface, and includes external portions extending beyond the light extraction surface. In certain embodiments, the solid state light emitting device further includes a plurality of light extraction recesses bounded by the light extraction surface and the external portions of the plurality of light segregation elements, wherein the at least one lumiphoric material is arranged at least partially within the plurality of light extraction recesses. In certain embodiments, the external portions are discontinuous relative to the internal portions.

In certain embodiments, the light extraction surface defines a plurality of light extraction recesses, and the at least one lumiphoric material is arranged at least partially within the plurality of light extraction recesses.

In certain embodiments, the at least one lumiphoric material includes a first lumiphoric material corresponding to a first light output area of the plurality of light output areas, and a second lumiphoric material corresponding to a second light output area of the plurality of light output areas. In certain embodiments, the first lumiphoric material is arranged to produce lumiphor emissions with a first dominant wavelength, the second lumiphoric material is arranged to produce lumiphor emissions with a second dominant wavelength, and the second dominant wavelength differs from the first dominant wavelength by at least 20 nm.

In certain embodiments, the plurality of light segregation elements includes a light-reflective material. In certain embodiments, the plurality of light segregation elements includes a light-absorptive material.

In certain embodiments, the light extraction surface is patterned, roughened, or textured to provide a varying surface to increase extraction of light out of the substrate. In certain embodiments, the plurality of light segregation elements is registered with boundaries between at least some LEDs of the array of LEDs. In certain embodiments, the substrate comprises a growth substrate over which active layers of the array of LED were grown. In certain embodiments, the substrate comprises a carrier substrate differing from a growth substrate over which active layers of the array of LED were grown. In certain embodiments, the substrate is substantially continuous.

In certain embodiments, the solid state light emitting device further includes a plurality of microlenses arranged over the at least one lumiphoric material, wherein each microlens is arranged over a different light output area of the plurality of light output areas. In certain embodiments, the plurality of microlenses includes different microlenses arranged to output light beams centered in different directions.

In certain embodiments, the present disclosure relates to a multi-color sequentially illuminated LED display including the solid state light emitting device as disclosed herein. In certain embodiments, the present disclosure relates to a light fixture including the solid state light emitting device as disclosed herein. In certain embodiments, the present disclosure relates to a vehicular (e.g., automotive) headlamp including the solid state light emitting device as disclosed herein.

In certain embodiments, the LED emissions in combination with the lumiphor emissions are configured to produce white light.

In another aspect, a solid state light emitting device, optionally embodied in or incorporating a LED array chip, includes: an array of LEDs arranged to transmit LED emissions through light-transmissive portions of a substrate; at least one lumiphoric material arranged on or over a light extraction surface of the substrate, wherein the at least one lumiphoric material is configured to receive at least a portion of the LED emissions and responsively generate lumiphor emissions, wherein the at least one lumiphoric material includes a plurality of light output areas; and a plurality of light segregation elements registered with boundaries between at least some LEDs of the array of LEDs, wherein at least portions of the plurality of light segregation elements are arranged on or over portions of the light extraction surface and extend beyond the plurality of light output areas. In certain embodiments, each LED of the array of LEDs comprises a flip chip LED.

In certain embodiments, a plurality of light extraction recesses are bounded by the plurality of light segregation elements and the light extraction surface, wherein the at least one lumiphoric material is arranged at least partially within the plurality of light extraction recesses.

In certain embodiments, the light extraction surface defines a plurality of light extraction recesses, and the at least one lumiphoric material is arranged at least partially within the plurality of light extraction recesses. In certain embodiments, portions of the plurality of light segregation elements extend into an interior of the substrate.

In certain embodiments, the at least one lumiphoric material includes a first lumiphoric material and a second lumiphoric material, the first lumiphoric material is arranged to cover a first portion of the light extraction surface, and the second lumiphoric material is arranged to cover a second portion of the light extraction surface.

In another aspect, the present disclosure relates to a method of fabricating a solid state light emitting device, optionally embodied in or incorporating a LED array chip, the method including: defining a plurality of recesses or grooves in at least one surface of a light-transmissive substrate supporting an array of LEDs, wherein the plurality of recesses or grooves is registered with boundaries between at least some LEDs of the array of LEDs; depositing a light-affecting (e.g., light-reflective or (less preferably) light-absorptive material) in the plurality of recesses or grooves to yield a plurality of primary light segregation elements arranged at least partially within the substrate, wherein the plurality of primary light segregation elements is configured to reduce passage of LED emissions between different light-transmissive regions of a plurality of light-transmissive regions of the light-transmissive substrate; and providing at least one lumiphoric material on or over a light extraction surface of the substrate.

In certain embodiments, each LED of the array of LEDs is provided in a flip chip configuration. In certain embodiments, said plurality of recesses or grooves is defined by mechanical sawing. In certain embodiments, said plurality of recesses or grooves is defined by etching.

In certain embodiments, the method further includes defining a plurality of light extraction recesses in the light extraction surface, wherein said providing at least one lumiphoric material on or over the light extraction surface includes depositing at least a portion of the at least one lumiphoric material in the plurality of light extraction recesses.

In certain embodiments, the at least one lumiphoric material includes a plurality of light output areas, and the method further includes depositing a light affecting (e.g., light-reflective or light-absorptive) material over the at least one lumiphoric material to form a plurality of secondary light segregation elements arranged to segregate the plurality of light output areas.

In another aspect, the present disclosure relates to a method of fabricating a solid state light emitting device, optionally embodied in or incorporating a LED array chip, the method including: forming a plurality of light extraction recesses in a light extraction surface of a substrate supporting an array of LEDs; and providing at least one lumiphoric material arranged at least partially within the plurality of light extraction recesses.

In certain embodiments, each LED of the array of LEDs is provided in a flip chip configuration. In certain embodiments, the method further includes providing a plurality of light segregation elements arranged at least partially within the substrate, wherein the plurality of light segregation elements is configured to reduce passage of LED emissions between different light-transmissive regions of a plurality of light-transmissive regions of the substrate.

In certain embodiments, the method further includes forming a plurality of light segregation elements on or over at least a portion of the light extraction surface. In certain embodiments, the method further includes forming a plurality of light segregation elements on or over at least a portion of the at least one lumiphoric material.

In certain embodiments, the plurality of light segregation elements is registered with boundaries between at least some LEDs of the array of LEDs.

In another aspect, the present disclosure relates to a display device including a single light emitting device or a plurality of solid state light emitting devices as described herein.

In another aspect, the present disclosure relates to a method of displaying at least one of text and visual images using a display device as described herein.

In another aspect, the present disclosure relates to a method comprising illuminating an object, a space, or an environment, utilizing a solid state lighting device as described herein.

In another aspect, a solid state light emitting device (optionally embodied in or incorporating a LED array chip) includes: an array of LEDs arranged to transmit LED emissions through a plurality of light-transmissive portions of at least one substrate; a plurality of light segregation elements arranged at least partially within the at least one substrate, wherein light segregation elements of the plurality of light segregation elements are arranged between different light-transmissive portions of the plurality of light-transmissive portions, the plurality of light segregation elements is configured to reduce passage of LED emissions between the different light-transmissive portions, and the plurality of light-transmissive portions is configured to be illuminated by the array of LEDs to define a plurality of pixels that includes a plurality of border portions, wherein each pixel of the plurality of pixels includes at least one border portion of the plurality of border portions; and a plurality of inter-pixel light spreading regions configured to transmit light through border portions of the plurality of border portions to enhance inter-pixel illumination at light-emitting surface portions of the solid state light emitting device that are registered with or proximate to the plurality of light segregation elements.

In certain embodiments, the plurality of light segregation elements comprises at least one light-affecting (e.g., light-reflective or light-absorptive) material, and the plurality of inter-pixel light spreading regions comprises at least one light-transmissive material arranged in contact with the at least one light-reflective or light-absorptive material.

In certain embodiments, the plurality of light segregation elements is arranged entirely within the at least one substrate; and the plurality of inter-pixel light spreading regions includes at least one light-transmissive material arranged at least partially within the at least one substrate and over the plurality of light segregation elements.

In certain embodiments, the plurality of inter-pixel light spreading regions includes at least one light-transmissive material region that is elevated relative to a surface of the at least one substrate and that is at least partially registered with the plurality of light segregation elements.

In certain embodiments, the plurality of light segregation elements comprises a plurality of unfilled voids within portions of the at least one substrate.

In certain embodiments, the solid state light emitting device further includes at least one lumiphoric material arranged on or over a light extraction surface of the at least one substrate, wherein the at least one lumiphoric material is configured to receive at least a portion of the LED emissions and responsively generate lumiphor emissions. In certain embodiments, the at least one lumiphoric material is further arranged over the plurality of inter-pixel light spreading regions. In certain embodiments, the at least one lumiphoric material comprises a lumiphoric material film that is adhered on or over the light extraction surface of the at least one substrate.

In certain embodiments, each inter-pixel light spreading region of the plurality of inter-pixel light spreading regions comprises at least one wavelength-selective light-transmissive surface portion of the at least one substrate. In certain embodiments, each inter-pixel light spreading region of the plurality of inter-pixel light spreading regions is selected from the group consisting of optical filters and optical reflectors.

In certain embodiments, each inter-pixel light spreading region of the plurality of inter-pixel light spreading regions comprises a one-way mirror.

In certain embodiments, each light-transmissive portion of the plurality of light-transmissive portions of the at least one substrate is separated from at least one other light-transmissive portion of the plurality of light-transmissive portions of the at least one substrate by a gap that: (i) has a width and a depth, (ii) is partially filled with a light segregation element of the plurality of light segregation elements, and (iii) is partially filled with at least one light-transmissive material defining an inter-pixel light spreading region of the plurality of inter-pixel light spreading regions.

In certain embodiments, the gap includes a first portion of the width that is filled with the light segregation element, and includes a second portion of the width that is filled with the at least one light-transmissive material. In certain embodiments, the gap includes a first portion of the depth that is filled with the light segregation element, and includes a second portion of the depth that is filled with the at least one light-transmissive material. In certain embodiments, the solid state light emitting device further includes at least one light-transmissive material region that is elevated relative to a surface of the at least one substrate and that is at least partially registered with at least one of the light segregation element or the inter-pixel light spreading region.

In certain embodiments, each light-transmissive portion of the plurality of light-transmissive portions of the at least one substrate comprises at least one beveled edge forming an inter-pixel light spreading region of the plurality of inter-pixel light spreading regions. In certain embodiments, the at least one substrate includes at least one light extraction surface including the at least one beveled edge, and at least one lumiphoric material arranged on or over the at least one light extraction surface, wherein the at least one lumiphoric material is configured to receive at least a portion of the LED emissions and responsively generate lumiphor emissions.

In certain embodiments, the solid state light emitting device further includes a light-transmissive secondary substrate arranged over the at least one substrate; and a lumiphoric material arranged between the light-transmissive secondary substrate and the at least one substrate, wherein the lumiphoric material is configured to receive at least a portion of the LED emissions and responsively generate lumiphor emissions.

In certain embodiments, the solid state light emitting device further includes a light scattering layer arranged on the light-transmissive secondary substrate. In certain embodiments, the light-transmissive secondary substrate is arranged between the lumiphoric material and the light scattering layer.

In certain embodiments, the light-transmissive secondary substrate comprises a sapphire wafer.

In certain embodiments, the plurality of inter-pixel light spreading regions is arranged at least partially within the light-transmissive secondary substrate.

In certain embodiments, the plurality of inter-pixel light spreading regions comprises a plurality of light redirecting regions within the light-transmissive secondary substrate. In certain embodiments, the plurality of light redirecting regions comprises a plurality of voids defined within the light-transmissive secondary substrate. In certain embodiments, each light redirecting region of the plurality of light redirecting regions comprises a further light-transmissive material that differs in composition from a material of the light-transmissive secondary substrate.

In certain embodiments, each light redirecting region of the plurality of light redirecting regions comprises a rectangular cross-sectional shape.

In certain embodiments, each light redirecting region of the plurality of light redirecting regions comprises a triangular cross-sectional shape, the triangular cross-sectional shape includes an apex and a base, and the apex is closer than the base to the at least one substrate. In certain embodiments, each light redirecting region of the plurality of light redirecting regions comprises a triangular cross-sectional shape, the triangular cross-sectional shape includes an apex and a base, and the base is closer than the apex to the at least one substrate. In certain embodiments, multiple layers, adjacent layers, multiple substrates, and/or adjacent substrates may contain the same structures or different structures that form portions of overall light redirecting and/or light segregating features having the features described herein.

In certain embodiments, the at least one substrate comprises a plurality of substrates, and each LED of the array of LEDs is joined to a different substrate of the plurality of substrates.

In certain embodiments, the at least one substrate consists of a single, continuous substrate supporting each LED of the array of LEDs.

In certain embodiments, the array of LEDs comprises a plurality of flip chip LEDs.

In another aspect, a solid state light emitting device, optionally embodied in or incorporating a LED array chip, includes: an array of LEDs arranged to transmit LED emissions through a plurality of light-transmissive portions of at least one substrate; a plurality of light segregation elements arranged at least partially within the at least one substrate, wherein light segregation elements of the plurality of light segregation elements are arranged between different light-transmissive portions of the plurality of light-transmissive portions, the plurality of light segregation elements is configured to reduce passage of LED emissions between the different light-transmissive portions; a light-transmissive secondary substrate arranged over the at least one substrate; a lumiphoric material arranged between the light-transmissive secondary substrate and the at least one substrate, wherein the lumiphoric material is configured to receive at least a portion of the LED emissions and responsively generate lumiphor emissions; and a plurality of light redirecting regions arranged at least partially within the light-transmissive secondary substrate, wherein each light redirecting region of the plurality of light redirecting regions is configured to enhance illumination of light emitting surface portions of the solid state light emitting device that are overlying and registered with the plurality of light segregation elements.

In certain embodiments, the plurality of light segregation elements comprises at least one light-reflective or light-absorptive material.

In certain embodiments, the solid state light emitting device further includes a light scattering layer arranged on the light-transmissive secondary substrate. In certain embodiments, the light-transmissive secondary substrate is arranged between the lumiphoric material and the light scattering layer.

In certain embodiments, a portion of each light redirecting region extends into or through a lumiphoric material layer containing the lumiphoric material.

In certain embodiments, the light-transmissive secondary substrate comprises a sapphire wafer.

In certain embodiments, the plurality of light redirecting regions comprises a plurality of voids defined within the light-transmissive secondary substrate.

In certain embodiments, each light redirecting region of the plurality of light redirecting regions comprises a further light-transmissive material that differs in composition from a material of the light-transmissive secondary substrate.

In certain embodiments, each light redirecting region of the plurality of light redirecting regions comprises a rectangular cross-sectional shape.

In certain embodiments, each light redirecting region of the plurality of light redirecting regions comprises a triangular cross-sectional shape, the triangular cross-sectional shape includes an apex and a base, and the apex is closer than the base to the at least one substrate. In certain embodiments, each light redirecting region of the plurality of light redirecting regions comprises a triangular cross-sectional shape, the triangular cross-sectional shape includes an apex and a base, and the base is closer than the apex to the at least one substrate.

In certain embodiments, the at least one substrate comprises a plurality of substrates, and each LED of the array of LEDs is joined to a different substrate of the plurality of substrates.

In certain embodiments, the at least one substrate consists of a single, continuous substrate supporting each LED of the array of LEDs.

In certain embodiments, the plurality of light segregation elements comprises a plurality of unfilled voids defined in the at least one substrate.

In certain embodiments, the at least one substrate includes a plurality of anode-cathode pairs in conductive electrical communication with the array of LEDS; and the at least one substrate is mounted over a carrier substrate or submount that includes a plurality of electrode pairs, wherein the plurality of anode-cathode pairs is in conductive electrical communication with the plurality of electrode pairs.

In another aspect, a method for fabricating a solid state light emitting device (optionally embodied in or incorporating a LED array chip) comprises: defining a plurality of recesses or grooves in at least one substrate supporting an array of LEDs, wherein recesses or grooves of the plurality of recesses or grooves are arranged generally between LEDs of the array of LEDs, and the at least one substrate includes a plurality of anode-cathode pairs in conductive electrical communication with the array of LEDs; mounting the at least one substrate over a carrier substrate or submount that includes a plurality of electrode pairs, wherein the mounting comprises establishing electrically conductive paths between the plurality of anode-cathode pairs and the plurality of electrode pairs; thinning the at least one substrate after said mounting of the at least one substrate over the carrier substrate or submount; and applying at least one lumiphoric material over the at least one substrate, wherein the at least one lumiphoric material is configured to receive at least a portion of emissions of the array of LEDs and responsively generate lumiphor emissions.

In certain embodiments, the array of LEDs is arranged to transmit LED emissions through a plurality of light-transmissive portions of the at least one substrate;

and the method further comprises forming a plurality of light segregation elements in the at least one substrate configured to reduce passage of LED emissions between different light-transmissive portions of the plurality of light-transmissive portions.

In certain embodiments, the forming of the plurality of light segregation elements comprises adding at least one light reflective material to the plurality of grooves or recesses. In certain embodiments, the forming of the plurality of light segregation elements comprises forming a plurality of unfilled voids within the plurality of grooves or recesses. In certain embodiments, the forming of the plurality of unfilled voids comprises: depositing a removable material into the plurality of grooves or recesses; and after said applying of at least one lumiphoric material over the at least one substrate, removing the removable material from the plurality of grooves or recesses to yield the plurality of unfilled voids. In certain embodiments, the removing of the removable material from the plurality of grooves or recesses comprises removal by at least one of chemical, mechanical, or thermal means.

In certain embodiments, the plurality of light-transmissive portions is configured to be illuminated by the array of LEDs to define a plurality of pixels that includes a plurality of border portions, wherein each pixel of the plurality of pixels includes at least one border portion of the plurality of border portions; and the method further comprises forming a plurality of inter-pixel light spreading regions configured to transmit light through border portions of the plurality of border portions to enhance inter-pixel illumination at light-emitting surface portions of the solid state light emitting device that are registered with or proximate to the plurality of light segregation elements. In certain embodiments, the forming of the plurality of inter-pixel light spreading regions comprises forming beveled edge portions of the at least one substrate adjacent to the plurality of grooves or recesses.

In certain embodiments, the carrier substrate or submount comprises a semiconductor wafer, and the plurality of electrode pairs is arranged in, on, or over the semiconductor wafer. In certain embodiments, the carrier substrate or submount comprises at least one circuit configured to control operation of the array of LEDs.

In another aspect, a solid state light emitting device, optionally embodied in or incorporating a LED array chip, comprises: an array of LEDs supported by at least one substrate; a plurality of light segregation elements arranged between different LEDs of the array of LEDs; a plurality of anode-cathode pairs supported by the at least one substrate and in conductive electrical communication with the array of LEDs; and a carrier substrate or submount comprising a semiconductor wafer and a plurality of electrode pairs arranged in, on, or over the semiconductor wafer; wherein the plurality of anode-cathode pairs is in conductive electrical communication with the plurality of electrode pairs.

In certain embodiments, the array of LEDs is arranged to transmit LED emissions through a plurality of light-transmissive portions of the at least one substrate. In certain embodiments, the array of LEDs comprises a plurality of flip chip LEDs. In certain embodiments, the at least one substrate consists of a single, continuous substrate supporting each LED of the array of LEDs.

In certain embodiments, each anode of the plurality of anode-cathode pairs comprises a height that differs from each cathode of the plurality of anode-cathode pairs. In certain embodiments, the carrier substrate or submount comprises at least one circuit configured to control operation of the array of LEDs.

In another aspect, the disclosure relates to a method for fabricating a multi-emitter solid state lighting device, the method comprising: mounting a multi-LED chip over an interface element comprising a plurality of electrode pairs, wherein the multi-LED chip comprises an array of LEDs supported by a substrate and comprises a plurality of anode-cathode pairs arranged between the substrate and the interface element, and said mounting comprises establishing electrically conductive paths between the plurality of anode-cathode pairs and the plurality of electrode pairs; and following said mounting, forming one or more items of the following items (i) to (iv) on, in, or over the substrate: (i) a plurality of light-affecting elements, (ii) a plurality of light processing elements, (iii) a plurality of light segregation elements, or (iv) a plurality of light steering structures.

In certain embodiments, the method further comprises applying at least one lumiphoric material over the substrate, wherein the at least one lumiphoric material is configured to receive at least a portion of emissions of the array of LEDs and responsively generate lumiphor emissions. In certain embodiments, the method further comprises providing an underfill material between the substrate and the interface element. In certain embodiments, the interface element comprises a carrier substrate, or comprises an ASIC.

In certain embodiments, the forming of one or more items comprises forming a plurality of light segregation elements at least partially within the substrate, wherein the forming of a plurality of light segregation elements at least partially within the substrate comprises defining a plurality of recesses or grooves in the substrate. In certain embodiments, the method further comprises depositing at least one light-affecting material within the plurality of recesses or grooves.

In certain embodiments, the method further comprises thinning the substrate following said mounting. In certain embodiments, the interface element comprises a semiconductor wafer.

In another aspect, the disclosure relates to a method for fabricating a multi-emitter solid state lighting device comprising a multi-LED chip incorporating an array of LEDs supported by a substrate, the method comprising: selectively removing portions of epitaxial layers of the multi-LED chip (e.g., via etching, or alternatively via sawing or other cutting methods) to segregate active regions of LEDs of the array of LEDs; and following said removing of portions of epitaxial layers, mounting the multi-LED chip over an interface element comprising a plurality of electrode pairs, wherein the multi-LED chip comprises a plurality of anode-cathode pairs arranged between the substrate and the interface element, and said mounting comprises establishing electrically conductive paths between the plurality of anode-cathode pairs and the plurality of electrode pairs.

In certain embodiments, the method further comprises, after said mounting, forming one or more items of the following items (i) to (iv) on, in, or over the substrate: (i) a plurality of light-affecting elements, (ii) a plurality of light processing elements, (iii) a plurality of light segregation elements, or (iv) a plurality of light steering structures.

In certain embodiments, the method further comprises applying at least one lumiphoric material over the substrate, wherein the at least one lumiphoric material is configured to receive at least a portion of emissions of the array of LEDs and responsively generate lumiphor emissions. In certain embodiments, the method further comprises providing an underfill material between the substrate and the interface element. In certain embodiments, the interface element comprises a carrier substrate or an ASIC.

In certain embodiments, the method further comprises defining a plurality of recesses or grooves in the substrate, wherein at least some recesses or grooves of the plurality of recesses or grooves are substantially registered with regions of the multi-LED chip in which portions of the epitaxial layers were selectively removed. In certain embodiments, the at least some recesses or grooves extend through an entire thickness of the substrate. In other embodiments, the at least some recesses or grooves extend through less than an entire thickness of the substrate (e.g., leaving a thin web or membrane of substrate material adjacent to regions in which the epitaxial layers were selectively removed). In certain embodiments, the method further comprises depositing at least one light-affecting material within the plurality of recesses or grooves. In certain embodiments, the method further comprises thinning the substrate following said mounting. In certain embodiments, the interface element comprises a semiconductor wafer.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 2A is a plan view photograph of a flip chip LED, with a transparent substrate facing upward, useable in flip chip arrays according to embodiments of the present disclosure.

FIG. 2B is a plan view photograph of the flip chip LED of FIG. 2A, with electrodes facing upward.

FIG. 3A is a plan view photograph of a multi-LED chip including an array of four flip chip type LEDs on a single transparent substrate facing upward, useable in embodiments of the present disclosure.

FIG. 3B is a plan view photograph of the multi-LED chip of FIG. 3A, with electrodes facing upward.

FIG. 4A is a plan view photograph of a multi-LED chip including an array of one hundred flip chip LEDs on a single transparent substrate facing upward, useable in embodiments of the present disclosure.

FIG. 4B is a plan view photograph of the multi-LED chip of FIG. 4A, with electrodes facing upward.

FIGS. 5A-5C are plan view illustrations of a multi-LED chip including an array of sixteen flip chip LEDs on a single transparent substrate facing upward in various states of fabrication, to define grooves or recesses between flip chip LEDs to enable formation of light segregation elements extending from a light extraction surface into an interior of the substrate and to deposit a lumiphoric material on the light extraction surface, according to certain embodiments of the present disclosure.

FIGS. 6A-6C are side cross-sectional view illustrations of the multi-LED chip of FIGS. 5A-5C with a single transparent substrate facing downward in various states of fabrication, to form light segregation elements extending from a light extraction surface of the substrate into an interior of the substrate and to deposit a lumiphoric material on the light extraction surface, according to an embodiment of the present disclosure.

FIG. 7A is a side cross-sectional view illustration of a light emitting device (e.g., a multi-LED chip) including an array of flip chip LEDs on a single transparent substrate facing downward, including light segregation elements extending from a light injection surface into an interior of the substrate, and including a lumiphoric material arranged on the light extraction surface, according to an embodiment of the present disclosure.

FIG. 7B is a side cross-sectional view illustration of a light emitting device (e.g., a multi-LED chip) including an array of flip chip LEDs on a single transparent substrate facing downward, including light segregation elements extending from a textured light extraction surface into an interior of the substrate, and including a lumiphoric material arranged on the light extraction surface, according to an embodiment of the present disclosure.

FIG. 7C is a side cross-sectional view illustration of a light emitting device (e.g., a multi-LED chip) including an array of flip chip LEDs on a single transparent substrate facing downward, a first group of light segregation elements extending from a light injection surface of the substrate into an interior of the substrate, a second group of light segregation elements extending from a light extraction surface of the substrate into an interior of the substrate, and a lumiphoric material arranged on the light extraction surface, according to an embodiment of the present disclosure.

FIGS. 8A-8D are side cross-sectional view illustrations of a light emitting device (e.g., a multi-LED chip) including an array of flip chip LEDs on a single transparent substrate facing downward, including light segregation elements extending from a light extraction surface of the substrate into an interior of the substrate, with the device in various states of fabrication to: form light extraction recesses in the light extraction surface, deposit one or more lumiphoric materials in the light extraction recesses, and form lenses over the one or more lumiphoric materials deposited in the light extraction recesses, according to an embodiment of the present disclosure.

FIGS. 9A-9C are side cross-sectional view illustrations of a light emitting device (e.g., a multi-LED chip) including an array of flip chip LEDs on a single transparent substrate facing downward, a first group of light segregation elements extending from a light injection surface of the substrate into an interior of the substrate, and a second group of light segregation elements extending from a light extraction surface of the substrate into an interior of the substrate, with the device in various states of fabrication to: form raised features on the light extraction surface, deposit one or more lumiphoric materials between the raised features, and form lenses over the one or lumiphoric materials deposited in the light extraction recesses, according to an embodiment of the present disclosure.

FIGS. 10A-10C are side cross-sectional view illustrations of a light emitting device (e.g., a multi-LED chip) including an array of flip chip LEDs on a single transparent substrate including a first group of light segregation elements extending from a light injection surface of the substrate into an interior of the substrate, and a second group of light segregation elements extending from a light extraction surface of the substrate into an interior of the substrate, with the array in various states of fabrication to: form raised features on the light extraction surface, deposit one or more lumiphoric materials between the raised features, and form lenses over the one or lumiphoric materials, according to an embodiment of the present disclosure.

FIG. 11A is a side cross-sectional exploded view illustration of the multi-LED chip of FIG. 6C arranged proximate to an interface element (optionally embodied in an application specific integrated circuit (ASIC) or carrier substrate or submount) and solder bumps.

FIG. 11B is a side cross-sectional view of the multi-LED chip and interface element of FIG. 11A following completion of a solder bump bonding process and addition of an underfill material between the multi-LED chip and the interface element.

FIG. 12A is a plan view illustration of a light emitting device (e.g., a multi-LED chip) including an array of sixteen flip chip LEDs on a single transparent substrate with electrodes facing upward.

FIG. 12B is a plan view illustration of a lower layer of an electrical interface for the light emitting device of FIG. 12A, with multiple horizontal string series connections each including multiple electrically conductive vias for coupling with anodes of the light emitting device, and with the lower layer further including openings permitting passage of conductive vias defined in an upper layer of the electrical interface.

FIG. 12C is a plan view illustration of an upper layer of an electrical interface for the light emitting device of FIG. 12A, with multiple vertical string series connections each including multiple electrically conductive vias for coupling with cathodes of the light emitting device, FIG. 12D is a plan view illustration of the upper layer of FIG. 12C superimposed over the lower layer of FIG. 12B to form an electrical interface for the light emitting device of FIG. 12A.

FIG. 12E is a plan view illustration of the electrical interface of FIG. 12D coupled with the light emitting device of FIG. 12A.

FIG. 13A is a plan view illustration of a light emitting device (e.g., a multi-LED chip) including an array of sixteen flip chip LEDs on a single transparent substrate with electrodes facing upward.

FIG. 13B is a plan view illustration of a lower layer of an electrical interface for the light emitting device of FIG. 13A, with multiple horizontal string series connections each including multiple electrically conductive vias for coupling with anodes of the light emitting device, and with the lower layer further including openings permitting passage of conductive vias defined in an upper layer of the electrical interface.

FIG. 13C is a plan view illustration of an upper layer of an electrical interface for the light emitting device of FIG. 13A, with multiple vertically arranged parallel connections each including multiple electrically conductive vias for coupling with cathodes of the light emitting device.

FIG. 13D is a plan view illustration of the upper layer of FIG. 13C superimposed over the lower layer of FIG. 13B to form an electrical interface for the light emitting device of FIG. 13A.

FIG. 13E is a plan view illustration of the electrical interface of FIG. 13D coupled with the light emitting device of FIG. 13A, according to an embodiment of the present disclosure.

FIG. 14A is a plan view diagram of an addressable multi-LED light emitting device (e.g., a multi-LED chip) configured to produce a first combination of colors, according to an embodiment of the present disclosure.

FIG. 14B is a plan view diagram of an addressable multi-LED light emitting device (e.g., a multi-LED chip) configured to produce a second combination of colors, according to an embodiment of the present disclosure.

FIG. 14C is a plan view diagram of an addressable multi-LED light emitting device (e.g., a multi-LED chip) configured to produce a third combination of colors, according to an embodiment of the present disclosure.

FIG. 14D is a plan view diagram of an addressable multi-LED light emitting device (e.g., a multi-LED chip) configured to produce a fourth combination of colors, according to an embodiment of the present disclosure.

FIG. 15 is a simplified schematic diagram showing interconnections between components of a light emitting device including two emitter arrays (e.g., optionally embodied in two multi-LED chips) each including individually addressable flip chip LEDs.

FIG. 16 is a side cross-sectional view illustration of a light emitting device including an array of flip chip LEDs on a single transparent substrate facing downward and joined to a carrier, with a first group of light segregation elements extending from a light injection surface of the substrate into an interior of the substrate, a second group of light segregation elements extending from a light extraction surface of the carrier into an interior of the carrier, and a lumiphoric material arranged on the light extraction surface of the carrier, according to an embodiment of the present disclosure.

FIG. 17 is a side cross-sectional view illustration of a light emitting device including a first array of flip chip LEDs on a first transparent substrate (e.g., embodied in a first multi-LED chip) and a second array of flip chip LEDs on a second transparent substrate (e.g., embodied in a second multi-LED chip) both joined to a carrier, wherein each substrate includes a first group of light segregation elements extending from a light injection surface of the substrate into an interior of the substrate and a second group of light segregation elements extending from a light extraction surface of the substrate into an interior of the substrate, the carrier includes another group of light segregation elements extending from a light injection surface of the carrier into an interior of the carrier, and a lumiphoric material is arranged on a textured or patterned light extraction surface of the carrier, according to an embodiment of the present disclosure.

FIG. 18 is a side cross-sectional view illustration of a light emitting device including a first array of flip chip LEDs on a first transparent substrate (e.g., embodied in a first multi-LED chip) and a second array of flip chip LEDs on a second transparent substrate (e.g., embodied in a second multi-LED chip), a lumiphoric material layer arranged in contact with a light extraction surface of each substrate, and a carrier arranged to support the lumiphoric material layer and each substrate, wherein each substrate includes a first group of light segregation elements extending from a light injection surface of the substrate into an interior of the substrate and a second group of light segregation elements extending from a light extraction surface of the substrate into an interior of the substrate, the carrier includes another group of light segregation elements extending from a light injection surface of the carrier into an interior of the carrier, and the carrier includes a textured or patterned light extraction surface, according to an embodiment of the present disclosure.

FIG. 19 is a top plan view of a light emitting device including a carrier supporting four individually addressable arrays of light emitting devices (e.g., embodied in four multi-LED chips) each including light segregation elements between individual LEDs, according to an embodiment of the present disclosure.

FIG. 20A is a top plan view digital photograph of a light emitting device (e.g., a multi-LED chip) including an array of sixteen LEDs (e.g., sixteen pixels) with light segregation elements between individual LEDs forming a dark grid, and with each LED shown in a non-illuminated state.

FIG. 20B is a top plan view digital photograph of the light emitting device of FIG. 20A with current supplied to the rightmost column of four LEDs, showing the rightmost column of four LEDs being illuminated, showing an adjacent column of LEDs being partially illuminated due to spillover of light from the rightmost column of LEDs, and showing non-illuminated or "dark" zones between adjacent illuminated LEDs.

FIG. 20C is a color inverted version of the digital photograph of FIG. 20B.

FIG. 21A is a top view intensity mapped image of an eight-pixel portion of a light emitting device (e.g., a multi-LED chip) including an array of multiple LEDs, showing a leftmost column of four LEDs being illuminated, showing an adjacent column of four LEDs being partially illuminated due to spillover of light from the leftmost column of LEDs, and showing non-illuminated or "dark" zones between adjacent illuminated LEDs.

FIG. 22A is a side cross-sectional schematic view of a portion of a solid state light emitting device (e.g., a multi-LED chip) during fabrication including two LEDs following formation of a recess or groove in at least a portion of a substrate.

FIG. 22B is a side cross-sectional schematic view of the solid state light emitting device portion of FIG. 22A following sequential addition of a light segregation element and a light-transmissive material in the recess or groove, with the light-transmissive material serving to enhance inter-pixel illumination at a light emitting surface of the solid state light emitting device to reduce appearance of non-illuminated or "dark" regions between the LEDs when they are illuminated.

FIG. 22C is a side cross-sectional schematic view of the solid state light emitting device portion of FIG. 22B following application of a lumiphoric material over the substrate and over the light-transmissive material within the recess or groove.

FIG. 23A is a side cross-sectional schematic view of a portion of a solid state light emitting device (e.g., a multi-LED chip) including multiple LEDs and a substrate, with a recess or groove in at least a portion of the substrate that is sequentially filled with a light segregation element and a light-transmissive material, with a light-transmissive material region that is elevated relative to a surface of the substrate, and with a lumiphoric material arranged over the substrate and the elevated light-transmissive material region.

FIG. 23B is a top plan view of at least a portion of the solid state light emitting device portion of FIG. 23A including four LEDs, with dashed lines depicting the elevated light-transmissive material region.

FIG. 24A is a side cross-sectional schematic view of a portion of a solid state light emitting device (e.g., a multi-LED chip) including multiple LEDs and a substrate during fabrication, with substrate portions including excess thickness and including a recess or groove that is sequentially filled with a first material providing light segregation utility and a second material providing light spreading or light redirecting utility, and with a carrier substrate or submount having multiple electrode pairs positioned below, but not in contact with, anode-cathode pairs of the solid state light emitting device.

FIG. 24B is a side cross-sectional schematic view of the solid state light emitting device portion of FIG. 24A, following mounting of the anode-cathode pairs to electrode pairs of the carrier substrate or submount, thinning of the substrate and materials embedded therein, and formation of a lumiphoric material layer over the substrate.

FIG. 25A is a side cross-sectional schematic view of a portion of a solid state light emitting device (e.g., a multi-LED chip) including multiple LEDs and a substrate during fabrication, with substrate portions including excess thickness and including a recess or groove that is filled with a removable (e.g., sacrificial) material, with multiple anode-cathode pairs mounted in conductive electrical communication with multiple electrode pairs of an interface element (e.g., ASIC, or carrier substrate or submount), and with an underfill material arranged between the multi-LED chip and the interface element.

FIG. 25B is a side cross-sectional schematic view of the solid state light emitting device portion of FIG. 25A, following thinning of the substrate and the removable material embedded therein.

FIG. 25C is a side cross-sectional schematic view of the solid state light emitting device portion of FIG. 25B, following formation of a lumiphoric material layer over the substrate.

FIG. 25D is a side cross-sectional schematic view of the solid state light emitting device portion of FIG. 25C, following removal of the removable material from the substrate.

FIG. 27A is a side cross-sectional view of a portion of a solid state light emitting device (e.g., a multi-LED chip) including three LEDs and a substrate following performance of certain fabrication steps, with recesses or grooves being defined in portions of the substrate between adjacent LEDs, and with a first portion of a width of each recess or groove being filled with a light segregation element.

FIG. 27B is a side cross-sectional view of the portion of the solid state light emitting device of FIG. 27A, following addition of at least one light-transmissive material to fill a second portion of the width of each recess or groove, with the at least one light-transmissive material being in contact with the light segregation element in each recess or groove.

FIG. 28A is a side cross-sectional view of three LEDs, each including a substrate portion and being mounted along a first lateral surface thereof to a carrier.

FIG. 28B is a side cross-sectional view of the three LEDs and carrier of FIG. 28A following formation of at least one light-affecting element on a second lateral surface of each LED and corresponding substrate portion.

FIG. 28C is a side cross-sectional view of a portion of a solid state light emitting device incorporating the LEDs of FIG. 28B following mounting of the three LEDs to a carrier substrate or submount, and following formation of a light-transmissive material between lateral surfaces of adjacent LEDs.

FIG. 28D is a side cross-sectional view of the solid state light emitting device portion of FIG. 28C following application of a lumiphoric material over the substrate portion of each LED and over the at least one light-affecting element and light-transmissive material between adjacent LEDs.

FIG. 29A is a side cross-sectional view of a portion of a solid state light emitting device (e.g., a multi-LED chip) including two LEDs and a substrate defining a recess or groove containing a light segregation element, and with the substrate including beveled edge portions arranged proximate to the light segregation element.

FIG. 29B is a side cross-sectional view of the solid state light emitting device portion of FIG. 29A following application of a lumiphoric material over the substrate, the beveled edge portions, and the light segregation element, with the beveled edge portions serving to enhance inter-pixel illumination at a light emitting surface of the solid state light emitting device to reduce appearance of non-illuminated or "dark" regions between the LEDs when they are illuminated.

FIG. 30A is a side cross-sectional schematic view of a portion of a solid state light emitting device (e.g., a multi-LED chip) including multiple LEDs and a substrate mounted over an interface element (e.g., ASIC, or carrier substrate or submount), with an unfilled recess or groove defined in the substrate, beveled edge portions of the substrate proximate to the recess or groove, and an underfill material arranged between the multi-LED chip and the interface element.

FIG. 30B is a side cross-sectional schematic view of the solid state light emitting device portion of FIG. 30A, following addition of an adhesion promoting material over the substrate, and adhesion of a lumiphoric material film over the adhesion promoting material.

FIG. 31 is a side cross-sectional view of a portion of a solid state light emitting device including three LEDs and a substrate (e.g., a multi-LED chip), with recesses or grooves being defined in portions of the substrate between adjacent LEDs, each recess or groove being filled with a light segregation element, a lumiphoric material layer arranged over the substrate and the light segregation elements, a secondary substrate arranged over the lumiphoric material layer and including triangular light redirecting regions therein proximate to the lumiphoric material layer, and a light scattering material arranged over the secondary substrate.

FIG. 32 is a side cross-sectional view of a portion of a solid state light emitting device including three LEDs and a substrate (e.g., a multi-LED chip), with recesses or grooves being defined in portions of the substrate between adjacent LEDs, each recess or groove being filled with a light segregation element, a lumiphoric material film layer arranged over the substrate, a secondary substrate arranged over the lumiphoric material film layer and including rectangle-shaped light redirecting regions in the secondary substrate and extending through the lumiphoric material film layer, and a light scattering material arranged over the secondary substrate, with the light redirecting regions being substantially the same width as the light segregation elements.

FIG. 38A is a magnified portion of the carrier substrate or submount of FIGS. 37A and 37B, and FIG. 38B is a color inverted version of FIG. 38A.

FIG. 40A is a side cross-sectional schematic view of a portion of a solid state light emitting device (e.g., a multi-LED chip) including multiple LEDs and a substrate mounted over an interface element (e.g., ASIC or carrier substrate or submount), prior to defining of a recess or groove defined in a substrate connecting the LEDs.

FIG. 40B is a side cross-sectional schematic view of the solid state light emitting device portion of FIG. 40A following formation of a recess or groove in the substrate.

FIG. 40C is a side cross-sectional schematic view of the solid state light emitting device portion of FIG. 40B following addition of a removable (e.g., sacrificial) material to the recess or groove, and following formation of a lumiphoric material layer over the substrate and the removable material.

FIG. 40D is a side cross-sectional schematic view of the solid state light emitting device portion of FIG. 40C following removal of the removable material from the recess or groove.

FIG. 41 is a side cross-sectional schematic view of a solid state light emitting device (e.g., a multi-LED chip) including multiple LEDs and a substrate mounted over a first interface element embodied in a carrier substrate or submount including electrical contacts arranged on first and second major surfaces with electrically conductive vias arranged therebetween, and with the carrier substrate or submount positioned over a second interface element embodied in an ASIC to enable mounting of the carrier substrate or submount between the multi-LED chip and the ASIC.

FIG. 42 is a side cross-sectional schematic view of two solid state light emitting devices (e.g., multi-LED chips) mounted over a single interface element (e.g., ASIC, or carrier substrate or submount), prior to defining of recesses or grooves in substrates of the multi-LED chips.

FIG. 43 is a side cross-sectional schematic view of a single solid state light emitting device (e.g., a multi-LED chip) mounted over multiple interface elements (e.g., ASICs, or carrier substrates or submounts), prior to defining of recesses or grooves in a substrate connecting LEDs of the multi-LED chip.

FIG. 44A is a side cross-sectional schematic view of a portion of a solid state light emitting device (e.g., a multi-LED chip) including a groove or recess defined between epitaxial layers of different LEDs of the multi-LED chip.

FIG. 44B is a side cross-sectional schematic view of the solid state light emitting device portion of FIG. 44A after being mounted over an interface element (e.g., ASIC, or carrier substrate or submount).

FIG. 44C is a side cross-sectional schematic view of the solid state light emitting device portion of FIG. 44B following addition of an underfill material between the multi-LED chip and the interface element, and formation of a recess or groove in the substrate, with the recess or groove extending through a majority but less than an entirety of the substrate.

FIG. 44D is a side cross-sectional schematic view of the solid state light emitting device portion of FIG. 44B following addition of an underfill material between the multi-LED chip and the interface element, and formation of a recess or groove in the substrate, with the recess or groove extending through the entire thickness of the substrate to reach the underfill material.

DETAILED DESCRIPTION

Figure 1:
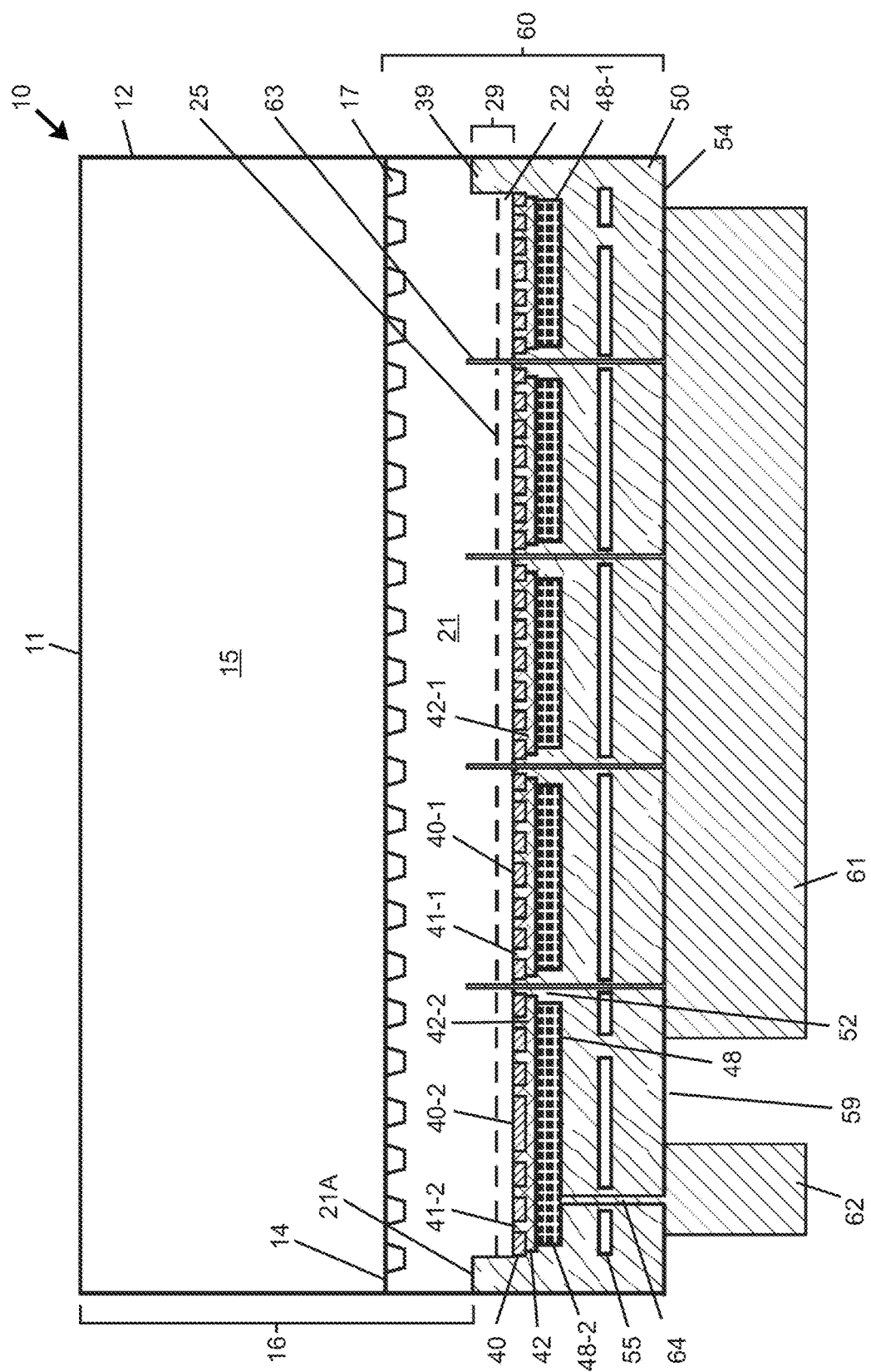
FIG. 1 is a side cross-sectional illustration of a single flip chip LED including a light-transmissive surface that is patterned proximate to semiconductor layers of the LED, including a multi-layer reflector proximate to the semiconductor layers, and including a passivation layer between the multi-layer reflector and electrical contacts of the LED, with the single LED being representative of flip chips useable in flip chip LED arrays according to embodiments of the present disclosure.

The art continues to seek improved LED array devices with small pixel pitches while overcoming limitations associated with conventional devices and production methods. Various embodiments disclosed herein relate to solid state light emitting devices including at least one array of LEDs supported by a substrate (optionally embodied in a multi-LED chip), preferably including one or more lumiphoric materials arranged to receive emissions of at least some flip chip LEDs, and including light segregation elements configured to reduce interaction between emissions of different LEDs and/or lumiphoric material regions to reduce scattering and/or optical crosstalk, thereby preserving pixel-like resolution of the resulting emissions. In certain embodiments, each LED of the array of LEDs is in a flip chip configuration. In certain embodiments, light segregation elements are arranged at least partially within the substrate supporting multiple LEDs, and are positioned between different light-transmissive regions of the substrate. In certain embodiments, light segregation elements are arranged on or over portions of a light extraction surface of a substrate, and are generally registered with boundaries between LEDs. Absent the presence of light segregation elements, the omnidirectional character of LED and/or lumiphor emissions would detrimentally affect resolution (e.g., pixel resolution) of an array of LEDs with one or more lumiphoric materials supported by a single substrate. In certain embodiments, the LEDs define multiple pixels, and multiple inter-pixel light spreading regions are configured to transmit light through border portions of the pixels to enhance inter-pixel illumination at light-emitting surface portions that are registered with or proximate to the light segregation elements. In certain embodiments, multiple light redirecting regions are arranged at least partially within a light-transmissive secondary substrate overlying a lumiphoric material that is arranged over a substrate that includes light segregation elements, with the light redirecting regions being configured to enhance illumination of light emitting surface portions of the solid state light emitting device that are overlying and registered with the light segregation elements. The foregoing inter-pixel light spreading regions and/or light redirecting regions are preferably configured to reduce appearance of non-illuminated or "dark" regions between the LEDs when they are illuminated. Solid state light emitting devices (e.g., embodying or including multi-LED chips) including light segregation elements as disclosed herein may be used in various applications such as sequentially illuminated LED displays, vehicular headlamps, roadway illumination, light fixtures, and various indoor, outdoor, and specialty contexts. Methods for fabricating solid state light emitting devices disclosed herein are also provided.

The embodiments set forth herein represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element, or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below," "above," "upper," "lower," "horizontal," or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, an "active region" of a solid state light emitting device refers to the region in which majority and minority electronic carriers (e.g., holes and electrons) recombine to produce light. In general, an active region according to embodiments disclosed herein can include a double heterostructure or a well structure, such as a quantum well structure.

Solid state light emitting devices disclosed herein may include at least one solid state light source (e.g., a LED) and one or more lumiphoric materials (also referred to herein as lumiphors) arranged to receive emissions of the at least one solid state light source. A lumiphoric material may include one or more of a phosphor, a scintillator, a lumiphoric ink, a quantum dot material, a day glow tape, or the like. In certain embodiments, a lumiphoric material may be in the form of one or more phosphors and/or quantum dots arranged in a binder such as silicon or glass, arranged in the form of a single crystalline plate or layer, arranged in the form of a polycrystalline plate or layer, and/or arranged in the form of a sintered plate. In certain embodiments, a lumiphoric material such as a phosphor may be spin coated or sprayed on a surface of a LED array. In certain embodiments, a lumiphoric material may be located on a growth substrate, on epitaxial layers, and/or on a carrier substrate of a LED array. Multiple pixels including one or more lumiphoric materials may be manufactured in a single plate. In general, a solid state light source may generate light having a first dominant wavelength. At least one lumiphor receiving at least a portion of the light generated by the solid state light source may re-emit light having a second dominant wavelength that is different from the first dominant wavelength.

A solid state light source and one or more lumiphoric materials may be selected such that their combined output results in light with one or more desired characteristics such as color, color point, intensity, etc. In certain embodiments, aggregate emissions of one or more flip chip LEDs, optionally in combination with one or more lumiphoric materials, may be arranged to provide cool white, neutral white, or warm white light, such as within a color temperature range of from 2500K to 10,000K. In certain embodiments, lumiphoric materials having cyan, green, amber, yellow, orange, and/or red dominant wavelengths may be used. In certain embodiments, lumiphoric materials may be added to one or more emitting surfaces (e.g., top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium.

As used herein, a layer or region of a light emitting device may be considered to be "transparent" when at least 90% of emitted radiation that impinges on the transparent layer or region emerges through the transparent region. Moreover, as used herein, a layer or region of an LED is considered to be "reflective" or embody a "reflector" when at least 90% of the angle averaged emitted radiation that impinges on the layer or region is reflected. For example, in the context of gallium nitride-based blue and/or green LEDs, silver (for example, at least 90% reflective) may be considered a reflective material. In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

Certain embodiments disclosed herein relate to the use of flip chip LED devices in which a light transmissive substrate represents the exposed light emitting surface. In certain embodiments, the light transmissive substrate embodies or includes a LED growth substrate, wherein multiple LEDs are grown on the same substrate that forms a light emitting surface or region. In certain embodiments, a monolithic multi-LED chip includes LEDs that are all grown on the same growth substrate, with the LEDs also sharing the same n-GaN layer and/or other functional layers. In certain embodiments, one or more portions (or the entirety) of a growth substrate and/or portions of epitaxial layers may be thinned or removed. In certain embodiments, a second substrate (also known as a carrier) may be added to a multi-LED chip, whether or not a growth substrate has been partially or fully removed. In certain embodiments, a light transmissive substrate includes silicon carbide (SiC), sapphire, or glass. Multiple LEDs (e.g., flip chip LEDs) may be grown on a substrate and incorporated into a light emitting device. In certain embodiments, a substrate (e.g., silicon) may include vias arranged to make contact with LED chips mounted or grown thereon. In certain embodiments, as an alternative to using flip chips, individual LEDs or LED packages may be individually placed and mounted on or over a substrate to form an array. For example, multiple wafer level packaged LEDs may be used to form LED arrays or subarrays.

When LEDs embodying a flip chip configuration are used, desirable flip chip LEDs incorporate multi-layer reflectors and incorporate light transmissive (preferably transparent) substrates patterned along an internal surface adjacent to semiconductor layers. A flip chip LED includes anode and cathode contacts that are spaced apart and extend along the same face, with such face opposing a face defined by the light transmissive (preferably transparent) substrate. A flip chip LED may be termed a horizontal structure, as opposed to a vertical structure having contacts on opposing faces of a LED chip. In certain embodiments, the transparent substrate may be patterned, roughened, or otherwise textured to provide a varying surface that increases the probability of refraction over internal reflection, so as to enhance light extraction. A substrate may be patterned or roughened by any of various methods known in the art, including (but not limited to) formation of nano-scale features by etching (e.g., photolithographic etching) using any suitable etchants, optionally in combination with one or more masks.

Patterning or texturing of a substrate may depend on the substrate material as well as implications on light extraction efficiency and/or pixel separation. If a silicon carbide substrate bearing multiple LEDs (e.g., flip chip LEDs) is used, then the index of refraction of the silicon carbide is well-matched to a gallium nitride-based active region of a LED, so light emissions of the active region tend to enter the substrate easily. If a sapphire substrate bearing multiple LEDs (e.g., flip chip LEDs) is used, then it may be desirable to provide a patterned, roughened, or textured interface between the active region and the substrate to promote passage of LED emissions into the substrate. With respect to a light extraction surface of a substrate, in certain embodiments it may be desirable to provide a patterned, roughened, or textured surface to promote extraction of light from the substrate.

In certain embodiments, LEDs may be grown on a first substrate of a first material (e.g., silicon, silicon carbide or sapphire), the first (growth) substrate may be partially removed (e.g., thinned) or fully removed, and the LEDs may be bonded to, mounted to, or otherwise supported by a second substrate of a second material (e.g., glass, sapphire, etc.) through which LED emissions are transmitted, wherein the second material is preferably more transmissive of LED emissions than the first material. Removal of the first (growth) substrate may be done by any appropriate method, such as use of an internal parting region or parting layer that is weakened and/or separated by: application of energy (e.g., laser rastering, sonic waves, heat, etc.), fracturing, one or more heating and cooling cycles, chemical removal, and/or mechanical removal (e.g., including one or more grinding, lapping, and/or polishing steps), or by any appropriate combination of techniques. In certain embodiments, one or more substrates may be bonded or otherwise joined to a carrier. Bonding of one or more LEDs to a substrate, or bonding of substrates to a carrier, may be performed by any suitable methods. Any suitable wafer bonding technique known in the art may be used, such as may rely on van der Waals bonds, hydrogen bonds, covalent bonds, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. In certain embodiments, one or more adhesion promoting materials may additionally or alternatively be used.

In certain embodiments, a LED array is monolithic and includes multiple flip chip LEDs grown on a single first (or growth) substrate, with the growth substrate removed from the LEDs, and a second substrate (or carrier) added to the LEDs, with the second substrate including one or more reflective layers, vias, and a phosphor layer (e.g., spin-coated phosphor layer). In certain embodiments, a LED array is monolithic and includes multiple flip chip LEDs grown on a single growth substrate, wherein grooves, recesses, or other features are defined in the growth substrate and/or a carrier, and are used to form light-affecting elements, optionally being filled with one or more materials such as to form a grid between individual LEDs or pixels.

In certain embodiments utilizing flip chip LEDs (e.g., embodied in a single multi-LED array), a light-transmissive substrate, a plurality of semiconductor layers, a multi-layer reflector, and a passivation layer may be provided. The light-transmissive substrate is preferably transparent with a patterned surface including a plurality of recessed features and/or a plurality of raised features. The plurality of semiconductor layers is adjacent to the patterned surface, and includes a first semiconductor layer comprising doping of a first type and a second semiconductor layer comprising doping of a second type, wherein a light emitting active region is arranged between the first semiconductor layer and the second semiconductor layer. A multi-layer reflector arranged proximate to the plurality of semiconductor layers includes a metal reflector layer and a dielectric reflector layer, wherein the dielectric reflector layer is arranged between the metal reflector layer and the plurality of semiconductor layers. A passivation layer is arranged between the metal reflector layer and first and second electrical contacts, wherein the first electrical contact is arranged in conductive electrical communication with the first semiconductor layer, and the second electrical contact is arranged in conductive electrical communication with the second semiconductor layer. In certain embodiments, a first array of conductive microcontacts extends through the passivation layer and provides electrical communication between the first electrical contact and the first semiconductor layer, and a second array of conductive microcontacts extends through the passivation layer. In certain embodiments, a substrate useable for forming and supporting an array of flip chip LEDs may include sapphire; alternatively, the substrate may include silicon, silicon carbide, a Group III-nitride material (e.g., GaN), or any combination of the foregoing materials (e.g., silicon on sapphire, etc.). Further details regarding fabrication of flip chip LEDs are disclosed in U.S. Provisional Patent Application No. 62/235,908, with the entire contents thereof being hereby incorporated by reference herein.

FIG. 1 illustrates a single flip chip LED 10 including a substrate 15, first and second electrical contacts 61, 62, and a functional stack 60 arranged therebetween. The flip chip LED 10 includes an internal light-transmissive surface 14 that is patterned (with multiple recessed and/or raised features 17) proximate to semiconductor layers of the LED 10, including a multi-layer reflector proximate to the semiconductor layers according to one embodiment. The light transmissive (preferably transparent) substrate 15 has an outer major surface 11, side edges 12, and the patterned surface 14. Multiple semiconductor layers 21, 22 sandwiching a light emitting active region 25 are adjacent to the patterned surface 14, and may be deposited via vapor phase epitaxy or any other suitable deposition process. In one implementation, a first semiconductor layer 21 proximate to the substrate 15 embodies an n-doped material (e.g., n-GaN), and the second semiconductor layer 22 embodies a p-doped material (e.g., p-GaN). A central portion of the multiple semiconductor layers 21, 22 including the active region 25 extends in a direction away from the substrate 15 to form a mesa 29 that is laterally bounded by at least one recess 39 containing a passivation material (e.g., silicon nitride as part of a passivation layer 50), and that is vertically bounded by surface extensions 21A of the first semiconductor layer 21.

A multi-layer reflector is arranged proximate to (e.g., on) the second semiconductor layer 22, with the multi-layer reflector consisting of a dielectric reflector layer 40 and a metal reflector layer 42. The dielectric reflector layer 40 is arranged between the metal reflector layer 42 and the second semiconductor layer 22. In certain implementations, the dielectric reflector layer 40 comprises silicon dioxide, and the metal reflector layer 42 comprises silver. Numerous conductive vias 41-1, 41-2 are defined in the dielectric reflector layer 40 and are preferably arranged in contact between the second semiconductor layer 22 and the metal reflector layer 42. In certain implementations, the conductive vias 41-1, 41-2 comprise substantially the same material(s) as the metal reflector layer 42. In certain implementations, at least one (preferably both) of the dielectric reflector layer 40 and the metal reflector layer 42 is arranged over substantially the entirety of a major surface of the mesa 29 terminated by the second semiconductor layer 22 (e.g., at least about 90%, at least about 92%, or at least about 95% of the major (e.g., lower) surface of the mesa portion of the second semiconductor layer 22).

A barrier layer 48 (including portions 48-1 and 48-2) is preferably provided between the metal reflector layer 42 and the passivation layer 50. In certain implementations, the barrier layer 48 comprises sputtered Ti/Pt followed by evaporated Au, or comprises sputtered Ti/Ni followed by evaporated Ti/Au. In certain implementations, the barrier layer 48 may function to prevent migration of metal from the metal reflector layer 42. The passivation layer 50 is arranged between the barrier layer 48 and (i) a first externally accessible electrical contact (or electrode) 61 and (ii) a second externally accessible electrical contact (or electrode) 62, which are both arranged along a lower surface 54 of the flip chip LED 10 separated by a gap 59. In certain implementations, the passivation layer 50 comprises silicon nitride. The passivation layer 50 includes a metal-containing interlayer 55 arranged therein, wherein the interlayer 55 may include (or consist essentially of) Al or another suitable metal.

The LED 10 includes first and second arrays of microcontacts 63, 64 extending through the passivation layer 50, with the first array of microcontacts 63 providing conductive electrical communication between the first electrical contact 61 and the first doped (e.g., n-doped) semiconductor layer 21, and with the second array of microcontacts 64 providing conductive electrical communication between the second electrical contact 62 and the second (e.g., p-doped) semiconductor layer 22. The first array of microcontacts 63 extends from the first electrical contact 61 (e.g., n-contact) through the passivation layer 50, through openings defined in the interlayer 55, through openings 52 defined in a first portion 48-1 of the barrier layer 48, through openings defined in a first portion 42-1 of the metal reflector layer 42, through openings defined in a first portion 40-1 of the dielectric reflector layer 40, through the second semiconductor layer 22, and through the active region 25 to terminate in the first semiconductor layer 21. Within openings defined in the interlayer 55, the first portion 48-1 of the barrier layer 48, the first portion 42-1 of the metal reflector layer 42, and the first portion 40-1 of the dielectric reflector layer 40, dielectric material of the dielectric reflector layer 40 laterally encapsulates the microcontacts 63 to prevent electrical contact between the microcontacts 63 and the respective layers 55, 48, 42, 40. A set of vias 41-1 defined in the first portion 40-1 of the dielectric reflector layer 40 contacts the first portion 40-1 of the dielectric reflector layer 40 and the second semiconductor layer 22, which may be beneficial to promote current spreading in the active region 25. A second array of microcontacts 64 extends from the second electrical contact 62 through the passivation layer 50 and through openings defined in the interlayer 55 to at least one of (i) a second portion 48-2 of the barrier layer 48, and (ii) a second portion 42-2 of the metal reflector layer 42, wherein electrical communication is established between the metal reflector layer 42 and the second semiconductor layer 22 through a set of vias 41-2 defined in a second portion 40-2 of the dielectric reflector layer 40. Although the second array of microcontacts 64 is preferred in certain implementations, in other implementations, a single second microcontact may be substituted for the second array of microcontacts 64. Similarly, although it is preferred in certain implementations to define multiple vias 41-2 in a second portion 40-2 of the dielectric reflector layer 40, in other implementations, a single via or other single conductive path may be substituted for the multiple vias 41-2.

Following formation of the passivation layer 50, one or more side portions 16 extending between the outer major surface 11 of the substrate 15 and surface extensions 21A of the first semiconductor layer 21 are not covered with passivation material. Such side portions 16 embody a non-passivated side surface.

In operation of the flip chip LED 10, current may flow from the first electrical contact (e.g., n-contact or cathode) 61, the first array of microcontacts 63, and the first (n-doped) semiconductor layer 21 into the active region 25 to generate light emissions. From the active region 25, current flows through the second (p-doped) semiconductor layer 22, vias 41-2, metal reflector layer portions 42-2, barrier layer portion 48-2, and the second array of microcontacts 64 to reach the second electrical contact (e.g., p-contact or anode) 62. Emissions generated by the active region 25 are initially propagated in all directions, with the reflector layers 40, 42 serving to reflect emissions in a direction generally toward the substrate 15. As emissions reach the patterned surface 14 arranged between the substrate 15 and the first semiconductor layer 21, recessed/raised features 17 arranged in or on the patterned surface 14 promote refraction rather than reflection at the patterned surface 14, thereby increasing the opportunity for photons to pass from the first semiconductor layer 21 into the substrate 15 and thereafter exit the LED 10 through the outer major surface 11 and non-passivated side portions 16. In certain implementations, one or more surfaces of the LED 10 may be covered with one or more lumiphoric materials (not shown), to cause at least a portion of emissions emanating from the LED 10 to be up-converted or down-converted in wavelength.

FIGS. 2A and 2B are plan view photographs of a single flip chip LED 10 similar in structure and operation to the flip chip LED 10 of FIG. 1. Referring to FIG. 2A, the flip chip LED 10 includes an outer major surface 11 arranged for extraction of LED emissions, and includes an active region having a length L and a width W. In certain embodiments, the active region includes a length L of about 280 microns, and a width W of about 220 microns, and a substrate 15 extends beyond the active region. Referring to FIG. 2B, the flip chip LED 10 includes a cathode 61 and an anode 62 arranged along a lower surface 54. In certain embodiments, the cathode 61 includes length and width dimensions of about 95 microns by 140 microns, and the anode 62 includes length and width dimensions of about 70 microns by 170 microns.

FIGS. 3A and 3B are plan view photographs of a multi-LED chip including an array of four flip chip LEDs 10 on a single transparent substrate 15, with each flip chip LED 10 being substantially similar in structure and operation to the flip chip LED 10 of FIG. 1. The active area of each flip chip LED 10 is spaced apart from the active area of each of other adjacent flip chip LED 10 by a gap (e.g., 40 microns in a length direction and 30 microns in a width direction). A central portion of each gap embodies a street 70 (e.g., having a width of about 10 microns) consisting solely of the substrate 15, whereas peripheral portions of each gap (between each street 70 and active areas of LEDs 10) includes the substrate 15 as well as passivation material (e.g., passivation layer 50 shown in FIG. 1). Each street 70 thus represents a boundary between adjacent flip chip LEDs 10. Each flip chip LED 10 includes a cathode 61 and an anode 62 arranged along a lower surface 54, and each flip chip LED 10 is arranged to emit light through an outer major surface 11 of the substrate 15. The exposed cathodes 61 and anodes 62 permit separate electrical connections to be made to each flip chip LED 10, such that each flip chip LED 10 may be individually addressable and independently controlled. If it were desired to separate the flip chip LEDs 10 from one another, then a conventional method to do so would be to utilize a mechanical saw to cut through the streets 70 to yield individual flip chip LEDs 10.

FIGS. 4A and 4B are plan view photographs of a multi-LED chip including an array of one hundred flip chip LEDs 10 on a single transparent substrate 15, with each flip chip LED 10 being substantially similar in structure and operation to the flip chip LED 10 illustrated in FIG. 1. The flip chip LEDs 10 are separated from one another by gaps including streets 70. Each flip chip LED 10 includes an outer major surface 11 arranged for extraction of LED emissions, and includes a cathode 61 and an anode 62 arranged along a lower surface 54. The exposed cathodes 61 and anodes 62 permit separate electrical connections to be made to each flip chip LED 10, such that each flip chip LED 10 may be individually addressable and independently controlled.

As noted previously, the omnidirectional character of LED and phosphor emissions may render it difficult to prevent emissions of one LED (e.g., a first pixel) from significantly overlapping emissions of another LED (e.g., a second pixel) of an array of flip chip LEDs arranged on a single light-transmissive substrate. A single transparent substrate supporting multiple flip chip LEDs would permit light beams to travel in numerous directions, leading to light scattering and loss of pixel-like resolution of emissions transmitted through the substrate. Problems of light scattering and loss of pixel-like resolution would be further exacerbated by presence of one or more lumiphoric materials overlying the light extraction surface of a substrate, owing to the omnidirectional character of lumiphor emissions. Various embodiments disclosed herein address this issue by providing light segregation elements configured to reduce interaction between emissions of different LEDs and/or lumiphoric material regions, thereby reducing scattering and/or optical crosstalk and preserving pixel-like resolution of the resulting emissions. In certain embodiments, light segregation elements may extend from a light injection surface into a substrate, may extend from a light extraction surface into a substrate, may extend outward from a light extraction surface, or any combination of the foregoing. In certain embodiments, multiple light segregation elements may be defined by different methods in the same substrate and/or light emitting device. In certain embodiments, light segregation elements of different sizes and/or shapes may be provided in the same substrate and/or light emitting device. For example, in certain embodiments, a first group of light segregation elements having a first size, shape, and/or fabrication technique may extend from a light injection surface into an interior of a substrate, and a second group of light segregation elements having a second size, shape, and/or fabrication technique may extend from a light injection surface into an interior of a substrate, wherein the second size, shape, and/or fabrication technique differs from the first size, shape, and/or fabrication technique. In certain embodiments, light segregation elements may include walls that are substantially perpendicular to a primary light emitting surface of a LED array, or walls that are angled in a non-perpendicular fashion relative to a primary light emitting surface of a LED array to reflect light in a desired manner (such as to collimate the emissions of each pixel of an array). In certain embodiments, different forms of light segregation, light redirection, and/or light collimation elements may be located on or integral with different layers of a light emitting device including a LED array.

In certain embodiments, each flip chip LED of an array of LEDs supported by a single substrate (e.g., a multi-LED chip) includes a greatest lateral dimension of no greater than about 400 microns, about 300 microns, or about 200 microns. In certain embodiments, each flip chip LED of an array of LEDs supported by a single substrate includes inter-chip spacing of no greater than about 60 microns, or about 50 microns, or about 40 microns, or about 30 microns, or about 20 microns, or about 10 microns. Such dimensional ranges provide a desirably small pixel pitch.

In certain embodiments, a multi-LED chip includes LEDs serving as pixels each having a substantially square shape. In certain embodiments, a multi-LED chip includes LEDs serving as pixels each having a rectangular (but non-square) shape. In other embodiments, LEDs may be provided as pixels having hexagonal shapes, round shapes, or other shapes.

In certain embodiments, a multi-LED chip may include LEDs provided in a two-dimensional array as pixels of about 70 µm long×70 µm wide, each including an active region of about 50 µm long×50 µm wide, thereby providing a ratio of emitting area to total area of 0.0025 mm$^2$/0.0049 mm$^2$=0.51 (or 51%). In certain embodiments, an array of at least 100 LEDs (as shown in FIG. 4B) may be provided in an area of no greater than 32 mm long×24 mm wide, with spacing between LEDs (pixel pitch) of no greater than 40 µm in the length direction and no greater than 30 µm in the width direction. In certain embodiments, each LED may include an emissive area of 280 µm long×210 µm wide (totaling an area of 0.0588 mm$^2$). Considering a total top area of 320 µm long×240 µm wide (totaling an area of 0.0768 mm$^2$) for each LED, a ratio of emissive area to total area (i.e., including emissive area in combination with non-emissive area) along a major (e.g., top) surface is 76.6%. In certain embodiments, a light emitting device as disclosed herein includes a ratio of emissive area to non-emissive (or dark) area along a major (e.g., top) surface of at least about 30%, at least about 40%, at least about 50% (i.e., about 1:1 ratio of emitting area to non-emitting (dark) area), at least about 55%, at least about 60%, at least about 65%, at least about 70%, at least about 75%, or at least about 80%. In certain embodiments, one or more of the foregoing values may optionally constitute a range bounded by an upper value of no greater than 70%, 75%, 80%, 85%, or 90%. In certain embodiments, an array of at least 1000 LEDs may be provided.

Although FIGS. 2A, 2B, 3A, 3B, 4A, and 4B show each LED as including two n-contact vias (embodying vertically offset circles registered with the n-contact or cathode 61), in certain embodiments, n-contacts and any associated n-contact vias may be shifted laterally and provided in a dark area outside the emitting area of each LED.

In certain embodiments, one or more light segregation elements are arranged at least partially within a substrate supporting an array of flip chip LEDs (e.g., embodied in a multi-LED chip). In certain embodiments, a substrate supporting an array of flip chip LEDs (e.g., a multi-LED chip) includes a light injection surface receiving emissions from the flip chip LEDs, and includes a light extraction surface (generally opposing the light injection surface) through which LED emissions are intended to exit the substrate (e.g., to impinge on one or more lumiphoric materials and/or exit the lighting device). In certain embodiments, one or more light segregation elements may extend from a light extraction surface of a substrate into an interior of the substrate, and/or one or more light segregation elements may extend from a light injection surface of the substrate into an interior of the substrate. In preferred embodiments, light segregation elements do not extend through an entire thickness of an interior portion of a substrate, so that weakening or fracture of the substrate may be avoided. In certain embodiments, a first group of light segregation elements extends from a light injection surface into an interior of the substrate, and a second group of light segregation elements extends from a light extraction surface into the interior of the substrate. To avoid loss of light through lateral edges of a substrate, such edges may be additionally coated or overlaid with a light affecting material, such as a light-reflective or light-absorptive material. One example of a light-reflective material that may be used is titanium dioxide [TiO$_2$], optionally provided in a powdered form and contained in a binder such as silicone. One example of a light-absorptive material that may be used is carbon black, optionally provided in a powdered form and contained in a binder such as silicone. Other light-reflective materials, light-absorptive materials, and/or binders may be used.

Preferably, light segregation elements arranged within a substrate at least partially bound different light-transmissive regions of the substrate, and are configured to reduce passage of LED emissions generated by different flip chip LEDs between different light-transmissive regions. When a light extraction surface of a substrate is overlaid with at least one lumiphoric material, such material may include multiple light output areas substantially registered with the multiple light-transmissive regions of the substrate. In preferred embodiments, light segregation elements are substantially registered with boundaries (e.g., streets) between at least some flip chip LEDs of an array of flip chip LEDs supported by the substrate (e.g., embodied in a multi-LED chip).

Various methods may be used for forming light segregation elements at least partially within a substrate. In certain embodiments, recesses or grooves may be formed in one or more major surfaces (faces) of a substrate by mechanical techniques such as mechanical sawing (e.g., using a diamond saw blade), by chemical techniques such as etching (optionally preceded by photolithographic patterning), or thermal techniques such as laser ablation. After such recesses or grooves are formed, one or more light-affecting (e.g., light-reflective or light-absorbing) materials may be deposited therein by any suitable technique. In certain embodiments, recesses or grooves may have a substantially uniform width. In other embodiments, recesses or grooves may have a width that varies with depth (e.g., such as may be formed by sawing or etching); in such a case, recesses or grooves may have sloping sidewalls (i.e., sidewalls that are non-perpendicular to a primary light emitting surface of one or more LEDs). In certain embodiments, recesses, grooves, or other features may be defined by etching or sawing, followed by deposition of one or more light reflective, light absorptive, or other material into the recesses, grooves or features. Such features may form a grid to extend between different LEDs or pixels of a light emitting device, such as a multi-LED chip. In certain embodiments, desired features may be formed in a first layer, and a corresponding structure or different features may be defined in a second layer that is bonded with the first layer to define pixels (or pixel-defining structures) having desired characteristics. In certain embodiments, multiple light segregation elements may be formed by different fabrication techniques in the same substrate and/or light emitting device. In certain embodiments, light segregation elements of different sizes and/or shapes may be provided in the same substrate and/or light emitting device.

As an addition or an alternative to the presence of light segregation elements arranged at least partially within a substrate, in certain embodiments, one or more light segregation elements may be arranged on or over a light extraction surface of a substrate. Such light segregation elements may define at least partial lateral boundaries for one or more lumiphoric material regions and/or for one or more microlenses. In such a case, light segregation elements are preferably formed prior to addition of one or more lumiphoric material regions and/or microlenses to a lighting device, such as a multi-LED chip. In certain embodiments, light segregation elements may be deposited on surfaces of a substrate by techniques such as three dimensional printing, by addition of one or more layers followed by selective removal of the added one or more layers (e.g., by photolithographic etching), or by adhesion or other bonding of prefabricated elements. Preferably, such light segregation elements are substantially registered with boundaries between at least some flip chip LEDs of an array of flip chip LEDs supported by the substrate (e.g., of a multi-LED chip). In certain embodiments, light segregation elements may be arranged partially within a substrate, and partially outside of a substrate. In certain embodiments, light segregation elements arranged within a substrate may be discontinuous with light segregation elements arranged outside a substrate.

As an addition or an alternative to the presence of light segregation elements arranged at least partially within a substrate or arranged on a substrate, in certain embodiments, one or more light segregation elements may be arranged on or over one or more lumiphoric materials supported by substrate. In certain embodiments, light segregation elements may be deposited on surfaces of one or more lumiphoric materials by techniques such as three dimensional printing, or by adhesion or other bonding of prefabricated elements.

In certain embodiments, optical structures or features may be used to enhance contrast and light segregation between pixels (thereby improve pixellation) and/or enhance homogeneity of aggregate emission of a light emitting surface including multiple pixels, may include one or more of the following: light extraction structures, light segregation elements, lenses, collimation structures (e.g., including lenses and/or reflective sidewalls), light containment structures or partitions, and combinations of higher and lower refractive index materials (optionally provided in adjacent layers). Depending on the embodiment, these optical structures or features can be formed in, formed on, or manufactured in or on one or more of: a growth substrate, epitaxial layers, a carrier substrate (e.g., opposite the growth substrate or on a same side of a LED array as growth substrate), or a lumiphoric material (e.g., a lumiphoric layer).

FIGS. 5A-5C illustrate a multi-LED chip including an array of sixteen flip chip LEDs 10 on a single transparent substrate 15 facing upward in various states of fabrication. Cathodes 61 and anodes 62 are facing downward. As shown in FIG. 5A, the substrate 15 is continuous in character without any surface features along an outer major (light extraction) surface 11. FIG. 5B shows the substrate 15 following formation of three lengthwise grooves or recesses 72 extending from the light extraction surface 11 into an interior of the substrate 15. Such grooves or recesses may be formed by any suitable techniques described herein, including mechanical sawing. FIG. 5C shows the substrate 15 following formation of three width-wise grooves or recesses 72 extending from the light extraction surface 11 into an interior of the substrate 15.

In certain embodiments, light segregation elements may be defined in a substrate prior to the growth of an array of LEDs. In other embodiments, light segregation elements may be defined in a substrate substantially simultaneously with formation of streets between LEDs. Preferably, individual LEDs of the array of LEDs are grown between different light segregation elements of a plurality of light segregation elements.

Figure 5D:
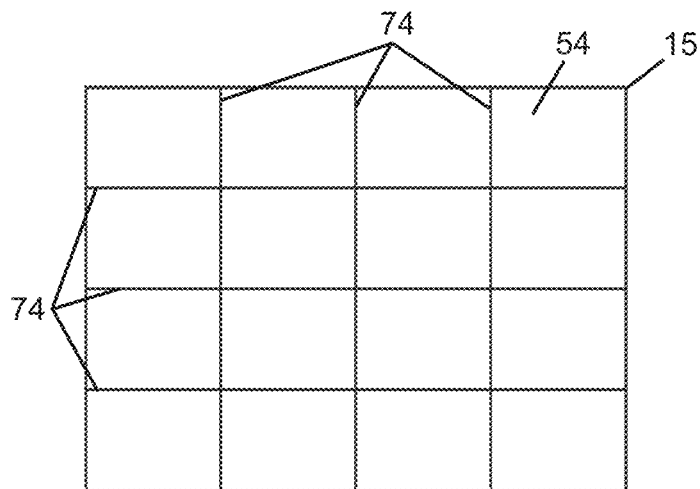
FIG. 5D is a plan view illustration of a transparent substrate facing downward following formation of light segregation elements therein.
Figure 5E:
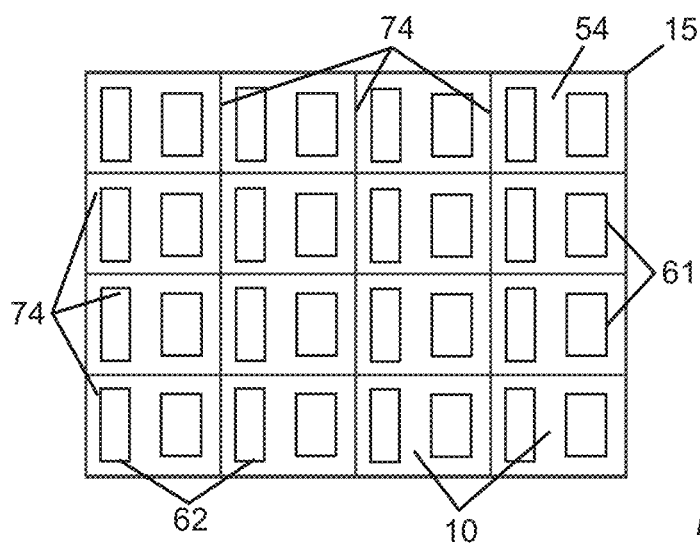
FIG. 5E is a plan view illustration of a multi-LED chip including an array of sixteen flip chip LEDs formed on the substrate of FIG. 5D between the light segregation elements, according to certain embodiments of the present disclosure.

FIG. 5D is a plan view illustration of a transparent substrate 15 facing downward following formation of light segregation elements 74 in the substrate 15, with each light segregation element 74 extending from a light injection (lower) surface 54 of the substrate 15 into an interior of the substrate 15. FIG. 5E is a plan view illustration of a multi-LED chip including an array of sixteen flip chip LEDs 10 formed on the substrate 15 of FIG. 5D between the light segregation elements 74. Each flip chip LED 10 includes an outer major surface (not shown) arranged to emit light into the light injection surface 54 of the substrate 15, and includes a cathode 61 and an anode 62 arranged along the light injection surface 54. Although FIG. 5D shows the light segregation elements 74 as being defined in the substrate 15 prior to growth of the LEDs 10, in certain embodiments the light segregation elements 74 may be grown substantially simultaneously with formation of streets (not shown but registered with the light segregation elements 74) between the LEDs 10.

FIGS. 6A-6C are side cross-sectional view illustrations of the multi-LED chip of FIGS. 5A-5C on a single transparent substrate 15 facing downward in various states of fabrication. Each flip chip LED 10 includes a cathode 61 and an anode 62 arranged over a functional stack 60 (including semiconductor layers and an active region) supported by the substrate 15. Flip chip LEDs 10 are separated by lateral gaps including streets 70. The substrate 15 includes a lower (light injection) surface 54 proximate to the flip chip LEDs 10 and opposing the light extraction surface 11. The substrate 15 also includes side edges 12. As shown in FIG. 6A, grooves or recesses 72 extend from the light extraction surface 11 into an interior of the substrate 15, and may be formed by any suitable technique (e.g., mechanical sawing). Following formation of the grooves or recesses 72, such features are filled with a suitable light-affecting (e.g., light-reflective or light-absorptive) material to yield light segregation elements 74 at least partially embedded within the substrate 15, as shown in FIG. 6B. Optionally, planarization and/or cleaning steps may be performed on the light extraction surface 11 before and/or after formation of the light segregation elements 74. Additionally, side edges 12 of the substrate 15 may be coated or overlaid with a light-reflective or light-absorptive material 75 to prevent lateral escape of LED emissions generated by the flip chip LEDs 10. As shown in FIG. 6C, after formation of the light segregation elements 74, at least one lumiphoric material 85 (including an outer surface defining multiple light output areas 86) may be deposited or otherwise provided over the light extraction surface 11. Areas between the light segregation elements 74 (or between the light segregation elements and the side edges 12) define light-transmissive regions 80 of the substrate 15 that are suitable for transmitting LED emissions. In certain embodiments, the light output areas 86 of the at least one lumiphoric material 85 are substantially registered with the light-transmissive regions 80 of the substrate 15. In operation, the at least one lumiphoric material 85 receives LED emissions transmitted through the substrate 15 between the light segregation elements 74, converts a portion of the received LED emissions to a different wavelength, and transmits a combination of LED emissions and lumiphor emissions through the light output areas 86.

In certain embodiments, light segregation elements may extend from a light injection surface into an interior of the substrate. Additionally, in certain embodiments, a light extraction surface of a substrate may be patterned or textured to enhance light extraction.

FIG. 7A is a side cross-sectional view illustration of a light emitting device (e.g., a multi-LED chip) including an array of flip chip LEDs 10 on a single transparent substrate 15. Each flip chip LED 10 includes a cathode 61 and an anode 62 arranged over a functional stack 60 supported by the substrate 15, with adjacent flip chip LEDs 10 being separated by lateral gaps including streets 70. The substrate 15 includes side edges 12 coated with a light-reflective or light-absorptive material 75, and a light injection surface 54 that is proximate to the flip chip LEDs 10 and that opposes a light extraction surface 11. Following formation of grooves or recesses in the substrate 15 extending from the light injection surface 54 into the substrate interior, such grooves or recesses may be filled with a suitable light-affecting (e.g., light-reflective or light-absorptive) material to yield light segregation elements 76 at least partially embedded within the substrate 15. Areas between the light segregation elements 76 define light-transmissive regions 80 of the substrate 15 that are suitable for transmitting LED emissions. At least one lumiphoric material 85 having an outer surface defining multiple light output areas 86 is arranged over the light extraction surface 11, with the light output areas 86 being substantially registered with the light-transmissive regions 80.

In certain embodiments, light segregation elements may extend from a light extraction surface into an interior of the substrate. Additionally, in certain embodiments, a light extraction surface of a substrate may be patterned or textured to enhance light extraction.

FIG. 7B is a side cross-sectional view illustration of a light emitting device (e.g., a multi-LED chip) including an array of flip chip LEDs 10 on a single transparent substrate 15. Each flip chip LED 10 includes a cathode 61 and an anode 62 arranged over a functional stack 60 supported by the substrate 15, with adjacent flip chip LEDs 10 being separated by lateral gaps including streets 70. The substrate 15 includes side edges 12 coated with a light-reflective or light-absorptive light-affecting material 75, and a light injection surface 54 that is proximate to the flip chip LEDs 10 and that opposes a patterned or textured light extraction surface 11A. Following formation of grooves or recesses in the substrate 15 extending from the patterned or texture light extraction surface 11A into the interior of the substrate 15, such grooves or recesses may be filled with a suitable light-affecting (e.g., light-reflective or light-absorptive) material to yield light segregation elements 74 at least partially embedded within the substrate 15. Areas between the light segregation elements 74 define light-transmissive regions 80 of the substrate 15 that are suitable for transmitting LED emissions. At least one lumiphoric material 85 having an outer surface defining multiple light output areas 86 is arranged over the light extraction surface 11A, with the light output areas 86 being substantially registered with the light-transmissive regions 80.

In certain embodiments, a first group of light segregation elements may extend from a light injection surface of a substrate into an interior of the substrate, and a second group of light segregation elements may extend from a light extraction surface of the substrate into an interior of the substrate.

FIG. 7C is a side cross-sectional view illustration of a light emitting device (e.g., a multi-LED chip) including an array of flip chip LEDs 10 on a single transparent substrate 15. Each flip chip LED 10 includes a cathode 61 and an anode 62 arranged over a functional stack 60 supported by the substrate 15, with adjacent flip chip LEDs 10 being separated by lateral gaps including streets 70. The substrate 15 includes side edges 12 coated with a light-reflective or light-absorptive material 75, and a light injection surface 54 that is proximate to the flip chip LEDs 10 and that opposes a patterned or textured light extraction surface 11A. A first group of light segregation elements 76 extends from the light injection surface 54 into an interior of the substrate 15, and a second group of light segregation elements 74 extends from the light extraction surface 11A into an interior of the substrate 15. Areas between the light segregation elements 74, 76 define light-transmissive regions 80 of the substrate 15 that are suitable for transmitting LED emissions. At least one lumiphoric material 85 having an outer surface defining multiple light output areas 86 is arranged over the light extraction surface 11A, with the light output areas 86 being substantially registered with the light-transmissive regions 80.

In certain embodiments, microlenses may be arranged over different light output areas of at least one lumiphoric material. Additionally, in certain embodiments, light extraction recesses may be defined in a light extraction surface of a substrate. In certain embodiments, one lens may be provided per pixel. In certain embodiments, lenses can be formed for each the pixels through molding, or through dispensing of lumiphoric or other material into containment structures. Viscosity of one or more materials used to produce lenses may be adjusted, depending on a desired lens profile (e.g., concave, convex or undulating meniscus) to achieve the desired homogeneity and contrast properties of a LED array. If molding is used, light extraction features, light redirection features, or any desired light shaping profile can be provided. Certain embodiments provided concave lenses overlying individual pixels, where each lens flattens toward the edge of a pixel.

In certain embodiments, containment and/or reflective structures form angled sidewalls that get thinner towards the top of the cross-section of the pixel, thereby collimating the light of each pixel to reduce cross-talk while improving homogeneity between pixels. These structures may be provided in single substrates or layers, or formed in multiple substrates and/or layers to include an overall cross-section as described herein.

Any light segregation elements, sidewalls, containment features, and the like disclosed herein, can be specularly and/or diffusively reflective, and may embody shapes such as linear, piecewise linear, curved, parabolic, tapered (e.g., thinner toward an external surface), or other desired shapes. Various light affecting, light processing, light segregation, and/or light steering structures can be micromachined, etched, formed into, or deposited onto one or more layers of a light emitting device disclosed herein.

FIGS. 8A-8D are side cross-sectional view illustrations of a light emitting device (e.g., a multi-LED chip) including an array of flip chip LEDs 10 on a single transparent substrate 15 in various states of fabrication. Light segregation elements 76 extend from a light injection surface 54 into an interior of the substrate 15. Each flip chip LED 10 includes a cathode 61 and an anode 62 arranged over a functional stack 60 supported by the substrate 15, with adjacent flip chip LEDs 10 being separated by lateral gaps including streets 70. The substrate 15 includes side edges 12 coated with a light-reflective or light-absorptive material 75. As shown in FIG. 8A, photoresist 81 may be patterned over portions of an outer surface 11' of the substrate 15. As shown in FIG. 8A, regions containing the photoresist 81 are generally registered with the light segregation elements 76 as well as with boundaries between flip chip LEDs 10. After photoresist patterning is complete, a suitable chemical etchant may be supplied to the substrate 15 to define light extraction recesses 82 between the regions of photoresist 81, as shown in FIG. 8B. Thereafter, at least one lumiphoric material 85 may be provided at least partially within the light extraction recesses 82, as shown in FIG. 8C. The at least one lumiphoric material 85 includes an outer surface defining multiple light output areas 86 substantially registered with light-transmissive regions 80 of the substrate 15 arranged between the light segregation elements 76. Optionally, microlenses 90 may be formed over the light output areas 86 defined by the at least one lumiphoric material 85 and registered with light-transmissive regions 80, as shown in FIG. 8D. In certain embodiments, the microlenses may be formed by three-dimensional printing or by bonding of prefabricated elements. In certain embodiments, microlenses of different shapes and/or configurations may be provided over different light output areas to output light beams with one or more different properties. In certain embodiments, microlenses of different shapes and/or configurations may be arranged to output light beams centered in different directions. Further details regarding three-dimensional printing of light-affecting elements including lenses are disclosed in U.S. Pat. No. 9,099,575, which is hereby incorporated by reference as if fully set forth herein.

In certain embodiments, one or more light segregation elements may be arranged on or over a light extraction surface of a substrate (e.g., as raised features), in addition to the presence of light segregation elements arranged at least partially within a substrate.

FIGS. 9A-9C are side cross-sectional view illustrations of a light emitting device (e.g., a multi-LED chip) including an array of flip chip LEDs 10 on a single transparent substrate 15 in various states of fabrication to include light segregation elements 84 incorporating raised features arranged on or above the light extraction surface 11 of the substrate 15. Each flip chip LED 10 includes a cathode 61 and an anode 62 arranged over a functional stack 60 supported by the substrate 15, with adjacent flip chip LEDs 10 being separated by lateral gaps including streets 70. The substrate 15 includes side edges 12 subject to being coated with a light-reflective or light-absorptive material 75. A first group of light segregation elements 76 extends from the light injection surface 54 into an interior of the substrate 15, and a second group of light segregation elements 74 extends from the light extraction surface 11 into an interior of the substrate 15. Yet another group of light segregation elements 84, which incorporates raised features extending beyond the light extraction surface 11, may be provided as extensions of the second group of light segregation elements 74. As shown in FIG. 9B, at least one lumiphoric material 85 may be provided in recesses bounded in part by the light segregation elements 84 incorporating raised features and bounded in part by the light extraction surface 11. An outer surface of the at least one lumiphoric material 85 defines multiple light output areas 86. Areas between light segregation elements 74, 76 within the substrate 15 define light-transmissive regions 80 of the substrate 15 that are suitable for transmitting LED emissions. Similarly, areas between light segregation elements 84 extending beyond the substrate 15 (and optionally also extending beyond the at least one lumiphoric material 85) may be arranged to laterally surround the multiple light output areas 86. The multiple light output areas 86 are substantially registered with light-transmissive regions 80 of the substrate 15 arranged between the internal light segregation elements 74, 76. Optionally, microlenses 90 may be formed over the light output areas 86 defined by the at least one lumiphoric material 85 and registered with light-transmissive regions 80, as shown in FIG. 9C.

In certain embodiments, one or more light segregation elements may be arranged on or over one or more lumiphoric materials supported by substrate, optionally in conjunction with one or more light segregation elements arranged at least partially within a substrate.

FIGS. 10A-10C are side cross-sectional view illustrations of a light emitting device (e.g., a multi-LED chip) including an array of flip chip LEDs 10 on a single transparent substrate 15 in various states of fabrication to include light segregation elements 87 arranged on or over at least one lumiphoric material 85. Each flip chip LED 10 includes a cathode 61 and an anode 62 arranged over a functional stack 60 supported by the substrate 15, with adjacent flip chip LEDs 10 being separated by lateral gaps including streets 70. The substrate 15 includes side edges 12 covered with a light-reflective or light-absorptive material 75. A first group of light segregation elements 76 extends from the light injection surface 54 into an interior of the substrate 15, and a second group of light segregation elements 74 extends from the light extraction surface 11 into an interior of the substrate 15. As shown in FIG. 10A, at least one lumiphoric material 85 may be provided over the light extraction surface 11 following formation of the light segregation elements 74, 76 in the substrate 15, with an outer surface of the at least one lumiphoric material 85 defining multiple light output areas 86 that are substantially registered with light-transmissive regions 80 of the substrate 15 arranged between the internal light segregation elements 74, 76. Thereafter, as shown in FIG. 10B, yet another group of light segregation elements 87, which incorporate raised features extending beyond the light extraction surface 11, may be formed on or over the at least one lumiphoric material 85 and are preferably registered with the other light segregation elements 74, 76. These light segregation elements 87 may be formed by various techniques such as three-dimensional printing or by bonding of prefabricated elements. Optionally, microlenses 90 may be formed over the light output areas 86 defined by the at least one lumiphoric material 85, between the light segregation elements 87, and registered with the light-transmissive regions 80, as shown in FIG. 10C.

In certain embodiments, a light emitting device (e.g., a multi-LED chip) including an array of flip chip LEDs may be arranged for direct coupling to an active interface element such as an application specific integrated circuit (ASIC) chip having electrode bond pads generally corresponding to electrodes (cathodes and anodes) of the array of flip chip LEDs. In such an arrangement, the ASIC preferably includes integrated transistors configured to accommodate switching of current supplied to individual chips of the array of flip chip LEDs.

In certain embodiments, a light emitting device (e.g., a multi-LED chip) including an array of flip chip LEDs may be arranged for coupling with an alternative (e.g., passive) interface element such as a carrier or submount, with electrical connections between the light emitting device and the interface element. In certain embodiments, an interface element may include a first array of bond pads or electrical contacts positioned on a first surface and arranged to make contact with electrodes of an array of flip chip LEDs (e.g., embodied in one or more multi-LED chips), and a second array of bond pads or electrical contacts positioned on a second surface and arranged to make contact with electrodes of one or more ASICs or other switching apparatuses configured to accommodate switching of current supplied to individual chips of the array of flip chip LEDs. Optionally, conductive vias may be defined through the interface element to provide conductive paths between the first array of bond pads or electrical contacts and the second array of bond pads or electrical contacts.

FIG. 11A is a side cross-sectional exploded view illustration of the multi-LED chip of FIG. 6C arranged proximate to an interface element 94 (e.g., optionally embodied in an application specific integrated circuit (ASIC) or a carrier or submount) and intermediately arranged solder bumps 93. The light emitting device includes multiple flip chip LEDs 10 on a single transparent substrate 15. Each flip chip LED 10 includes a cathode 61 and an anode 62 arranged over a functional stack 60 supported by the substrate 15. Other features of the lighting device are described herein in connection with FIG. 6C. The interface element 94 includes multiple electrode pairs 91, 92 registered with the cathode 61 and anode 62 pairs of the flip chip LEDs 10. FIG. 11B is a side cross-sectional view of the multi-LED chip and interface element 94 of FIG. 11A following completion of a solder bump bonding process and addition of an underfill material 99 between the multi-LED chip and the interface element 94. The solder bump bonding process may include heating and compression of the solder bumps 93 to create conductive electrical connections between the respective electrode pairs 91, 92 of the interface element 94 and the paired cathodes 61 and anodes 62 of the light emitting device. An exemplary underfill material may include epoxy filled with spherical silicon dioxide [$SiO_2$] to enable the coefficient of thermal expansion (CTE) to be adjusted. Other underfill materials may be used, and preferably comprise dielectric materials to prevent shorting of electrically conductive connections between an interface element and a multi-LED chip.

In certain embodiments, a light emitting device (e.g., a multi-LED chip) including an array of flip chip LEDs may be arranged for coupling to a passive interface element that provides electrical connections to an off-board controller. In certain embodiments, orthogonally arranged (e.g., vertical and horizontal) conductors form rows and columns in a grid pattern, whereby individual flip chip LEDs (or pixels) are defined by each intersection of a row and column. Multiplex sequencing may be used to permit individual control of each LED of the array while employing a smaller number of conductors than the number of LEDs in the array, either by utilizing a common-row anode or common-row cathode matrix arrangement, and brightness control may be provided by pulse width modulation.

FIGS. 12A-12E illustrate a first scheme for passively interfacing with an array of flip chip LEDs. FIG. 12A is a plan view illustration of a light emitting device (e.g., a multi-LED chip) including an array of sixteen flip chip LEDs 10 on a single transparent substrate 15 with a lower surface 54 of the substrate 15 as well as cathodes 61 and anodes 62 facing upward. FIG. 12B is a plan view illustration of a lower layer of an electrical interface for the light emitting device of FIG. 12A. A first interface carrier 101 includes multiple horizontal string series connections 103 each including multiple electrically conductive vias 102 for coupling with anodes 62 of the light emitting device of FIG. 12A, and further including openings 104 permitting passage of conductive vias 106 defined in a second interface carrier 105 (shown in FIG. 12C) forming an upper layer of the electrical interface. As shown in FIG. 12C, multiple vertical string series connections 107 each include multiple electrically conductive vias 106 arranged for coupling with cathodes 61 of the light emitting device of FIG. 12A. FIG. 12D is a plan view illustration of the upper layer of FIG. 12C superimposed over the lower layer of FIG. 12B to form an electrical interface for the light emitting device of FIG. 12A. FIG. 12E is a plan view illustration of the electrical interface of FIG. 12D coupled with the light emitting device of FIG. 12A, whereby the horizontal string series connections 103 and the vertical string series connections 107 permit each flip chip LED 10 of the array to be individually controlled (e.g., utilizing multiplex sequencing).

FIGS. 13A-13E illustrate a second scheme for passively interfacing with an array of flip chip LEDs, including individual control of signals supplied to cathodes of the array. FIG. 13A is a plan view illustration of a light emitting device (e.g., a multi-LED chip) including an array of sixteen flip chip LEDs 10 on a single transparent substrate 15 with a lower surface 54 of the substrate 15 as well as cathodes 61 and anodes 62 facing upward. FIG. 13B is a plan view illustration of a lower layer of an electrical interface for the light emitting device of FIG. 13A. A first interface carrier 101 includes multiple horizontal string series connections 103 each including multiple electrically conductive vias 102 for coupling with anodes 62 of the light emitting device of FIG. 13A, and further including openings 104 permitting passage of conductive vias 106 defined in a second interface carrier 105A (shown in FIG. 13C) forming an upper layer of the electrical interface. FIG. 13C is a plan view illustration of the upper layer of an electrical interface for the light emitting device of FIG. 13A, with multiple vertically arranged parallel connections 107A each including multiple electrically conductive vias 106 for coupling with cathodes 61 of the array. FIG. 13D is a plan view illustration of the upper layer of FIG. 13C superimposed over the lower layer of FIG. 13B to form an electrical interface for the light emitting device of FIG. 13A. FIG. 13E is a plan view illustration of the electrical interface of FIG. 13D coupled with the light emitting device of FIG. 13A, whereby the horizontal string series connections 103 and the vertically arranged parallel connections 107A permit each flip chip LED 10 of the array to be individually controlled.

As noted previously, solid state emitter arrays disclosed herein may include various combinations of solid state light emitters (e.g., LEDs) and/or lumiphors configured to emit light of different wavelengths, such that an emitter array may be arranged to emit light of multiple dominant wavelengths. Various color combinations are contemplated for use in different applications.

FIGS. 14A-14D are plan view diagrams of addressable light emitting devices (e.g., multi-LED chips) each including multiple light emitters 110 (each including at least one solid state light emitter, optionally in combination with at least one lumiphoric material) supported by a single substrate 15 and configured to produce a different combination of colors. Such devices may each include an array of flip chip LEDs on a single transparent substrate according to various embodiments disclosed herein. It is to be appreciated that particular color combinations and the number of light emitters disclosed herein are provided by way of example only, and are not intended to limit the scope of the invention, since any suitable combination of colors and number of light emitters are contemplated.

FIG. 14A illustrates a light emitting device (e.g., a multi-LED chip) including four groups of four red (R), green (G), blue (B), and white (W) light emitters, with each light emitter arranged in a different row among rows 1 to 4 and a different column among columns A to D. A single repeat unit 112 including R-G-B-W light emitters is shown at upper left. In certain embodiments, the blue (B) emitters include LEDs lacking any lumiphoric material; the white (W) emitters include blue LEDs arranged to stimulate emissions of a yellow and red lumiphor combination; the green (G) emitters include either green LEDs or blue LEDs arranged to stimulate green lumiphors; and the red (R) emitters include red LEDs or blue LEDs arranged to stimulate red lumiphors. In certain embodiments, the light emitting device of FIG. 14A may be useable as a sequentially illuminated LED display for producing color images or text and the like.

FIG. 14B illustrates a light emitting device (e.g., a multi-LED chip) including four groups of four short wavelength red ($R_1$), green (G), blue (B), and long wavelength red ($R_2$) light emitters, with each light emitter arranged in a different row among rows 1 to 4 and a different column among columns A to D. A single repeat unit 112 including $R_1$-G-B-$R_2$ light emitters is shown at upper left. In certain embodiments, the blue (B) emitters include LEDs lacking any lumiphoric material; the short wavelength red ($R_1$) and long wavelength red ($R_2$) emitters each include a red LED or a blue LED arranged to stimulate emissions of red lumiphors; and the green (G) emitters include either green LEDs or blue LEDs arranged to stimulate green lumiphors. Generally, solid-state light sources (e.g., LEDs) having different dominant wavelengths in the red range decline in luminous efficacy with increasing dominant wavelength, such that significantly more current may be required to generate the same number of red lumens from a red LED having a long dominant wavelength in the red range than from a red LED having a shorter dominant wavelength; however, long dominant wavelength red emitters are well-suited for producing high vividness illumination. In certain embodiments, the light emitting device of FIG. 14A may be useable as a sequentially illuminated LED display or advertising billboard suitable for producing very high vividness images, owing to the presence of long wavelength red emitters.

FIG. 14C illustrates a light emitting device (e.g., a multi-LED chip) including four groups of four blue shifted yellow (BSY), white (W), white (W), and amber (A) light emitters, with each light emitter arranged in a different row among rows 1 to 4 and a different column among columns A to D. A single repeat unit 112 including BSY-W-W-A light emitters is shown at upper left. In certain embodiments, the blue shifted yellow (BSY) emitters include blue LEDs arranged to stimulate emissions of yellow phosphors providing better efficiency but poorer color rendering than white LEDs; the white (W) emitters include blue LEDs arranged to stimulate emissions of a yellow and red lumiphor combination; and the amber (A) emitters include either amber LEDs or blue LEDs arranged to stimulate amber lumiphors. In certain embodiments, the light emitting device of FIG. 14C may be useable in a vehicular headlamp assembly, wherein the blue shifted yellow (BSY) emitters may provide high luminous efficacy with low to moderate color rendering when desirable, the white (W) emitters may provide moderate luminous efficacy with high color rendering when desirable, and the amber (A) emitters may provide integrated turn signal utility.

FIG. 14D illustrates a light emitting device (e.g., a multi-LED chip) including four groups of four blue shifted yellow (BSY), amber (A), red (R), and blue shifted yellow (BSY) light emitters, with each light emitter arranged in a different row among rows 1 to 4 and a different column among columns A to D. A single repeat unit 112 including BSY-A-R-BSY light emitters is shown at upper left. In certain embodiments, blue shifted yellow (BSY) emitters include blue LEDs arranged to stimulate emissions of yellow phosphors providing better efficiency but poorer color rendering than white LEDs; the amber (A) emitters include either amber LEDs or blue LEDs arranged to stimulate amber lumiphors; and the red (R) emitters include red LEDs or blue LEDs arranged to stimulate red lumiphors. In certain embodiments, the light emitting device of FIG. 14D may be useable in a vehicular headlamp assembly, wherein the blue shifted yellow (BSY) emitters may provide high luminous efficacy with low to moderate color rendering, supplementation of BSY emissions with red (R) emissions may provide enhanced color rendering when desirable, and the amber (A) emitters may provide integrated turn signal utility.

In certain embodiments, a light emitting device may include or be associated with driver circuitry and/or one or more sensors.

FIG. 15 is a simplified schematic diagram showing interconnections between components of a light emitting device including two emitter arrays (e.g., optionally embodied in two multi-LED chips) each including individually addressable flip chip LEDs, together with driver circuitry and one or more sensors. Although single lines are shown as coupling various components for simplicity, it is to be appreciated that each line with a slash represents multiple conductors. The lighting device includes first and second emitter arrays 120A, 120B and driver circuitry 126 coupled to the emitter arrays 120A, 120B. Each emitter array 120A, 120B includes multiple solid state light emitters (e.g., flip chip LEDs supported by a single substrate) that are separately coupled between the driver circuitry 126 and ground, thereby permitting each constituent solid state light emitter of each emitter array 120A, 120B to be individually addressable and separately controlled. Each solid state light emitter is configured to generate emissions (e.g., blue light, green light, UV emissions, or any other suitable wavelength range) in response to application of electric current, which is provided by the driver circuitry 126. Emissions of each solid state light emitter may be proportional to the current provided thereto by the driver circuitry 126. In each emitter array 120A, 120B, at least some solid state emitters (or all solid state emitters) are overlaid with at least one lumiphoric material arranged to output any suitable wavelengths in the visible range, such that aggregate emissions of each emitter array 120A, 120B may include at least a portion of solid state emitter emissions in combination with lumiphor emissions. The resulting aggregate light output from each emitter array 120A, 120B may include any desired color or combination of colors.

In certain embodiments, each emitter array 120A, 120B includes different individual emitters that are configured to emit light of different wavelengths, such that each emitter array 120A, 120B may be arranged to emit light of multiple dominant wavelengths. For example, in certain embodiments each emitter array 120A, 120B may be arranged to emit any two or more of short wavelength blue light, long wavelength blue light, cyan light, green light, yellow light, amber light, orange light, red light, white light, blue shifted yellow light, and blue shifted green light. Solid state emitters of different dominant wavelengths and/or lumiphoric materials of different dominant wavelengths may be provided within one or more emitter arrays 120A, 120B to enable production of light of different wavelengths. In certain embodiments, multiple lumiphor portions may be spatially separated from one another and arranged to receive emissions from respective solid state light sources.

The driver circuitry 126 includes power converter circuitry 124 and control circuitry 122. The power converter circuitry 124 may be configured to receive power from a power source 132, which may be a direct current (DC) or alternating current (AC) power source, and provides a desired current to each one of the solid state emitters in the emitter arrays 120A, 120B. The control circuitry 122 may provide one or more control signals to the power converter circuitry 124 in order to control the amount of current provided to each one of the emitters in the emitter arrays 120A, 120B such that individual emitters (e.g., forming pixels) of each emitter array 120A, 120B are independently operated. Each emitter array 120A, 120B has associated therewith a switching circuitry group 128A, 128B including switching circuitry coupled between each individual solid state emitter and ground. In certain embodiments, the switching circuitry groups 128A, 128B may include multiple metal-oxide-semiconductor field-effect transistors (MOSFETs) each including a drain contact coupled to the respective emitter, a source contact coupled to ground, and a gate contact coupled to the control circuitry 122. In such an instance, the control circuitry 122 may be configured to vary a voltage provided to the gate contact of each transistor such that a current through each one of the solid state emitters of the emitter arrays 120A, 120B is independently controllable.

In certain embodiments, the control circuitry 122 provides control signals based on input from at least one sensor 130. The at least one sensor 130 may embody any suitable sensor type, such as a photosensor, a radar sensor, an image sensor, a temperature sensor, a motion sensor, or the like. In another embodiment, the control circuitry 122 may provide control signals based on a user input provided to the control circuitry 122.

In certain embodiments, each emitter array 120A, 120B includes multiple solid state emitters arranged to output light beams centered in different directions. Such functionality may be provided, for example, with microlenses of different shapes and/or configurations. In certain embodiments, different microlenses may be arranged over different light output areas of at least one lumiphoric material arranged over a substrate supporting multiple flip chip LEDs. The ability to output light beams centered in different directions may be beneficial in the context of vehicular (e.g., automotive) headlamps, in which it may be desirable to selectively illuminate and darken different zones forward of a moving vehicle to provide maximum illumination without dazzling or impairing the vision of drivers of oncoming or adjacent vehicles. For example, multiple sensors 130 of any suitable types (e.g., radar sensors, photosensors, image sensors, thermal sensors, or the like) may be used to discriminate between different illumination targets such as other vehicles, pedestrians, animals, and other objects, and to selectively illuminate or avoid illumination of selected illumination targets depending on the character of the illumination target, environmental conditions, road conditions, or the like.

In certain embodiments, at least one array of LEDs supported by a light transmissive or transparent substrate (optionally embodying a substrate on which the LEDs were grown) arranged to transmit emissions of the at least one array may be further supported by a light transmissive or transparent carrier that is further arranged to transmit emissions generated by the array. In certain embodiments, multiple arrays of LEDs (e.g., multiple multi-LED chips each including a substrate) are mounted to a single carrier, in order to form a modular multi-array light emitting device. In certain embodiments, the carrier may include internal and/or external light segregation elements, preferably registered with light segregation elements of the substrate, such that light extraction or light output areas of the carrier are registered with light-transmissive regions of the one or more substrates supported by the carrier. In certain embodiments, a light extraction surface of a carrier may include one or more textured or patterned regions corresponding to light output areas. In certain embodiments, a light extraction surface of a carrier may be overlaid with at least one lumiphoric material (e.g., such as one or more lumiphoric materials arranged in a uniform manner over the entire light extraction surface, or different lumiphoric materials arranged over different regions of the light extraction surface). In certain embodiments, at least one lumiphoric material may be arranged between at least one substrate and the carrier.

FIG. 16 is a side cross-sectional view illustration of a light emitting device including an array of flip chip LEDs 10 on a transparent substrate 15 that is further supported by a light-transmissive (or transparent) carrier 135. Each flip chip LED 10 includes a cathode 61 and an anode 62 arranged over a functional stack 60 supported by the substrate 15, with adjacent flip chip LEDs 10 being separated by lateral gaps including streets 70. The substrate 15 includes side edges 12 coated with a light-reflective or light-absorptive material 75, and a light injection surface 54 that is proximate to the flip chip LEDs 10 and that opposes a light extraction surface 11. A first group of light segregation elements 76 extends from the light injection surface 54 into an interior of the substrate 15. Notably, the light segregation elements 76 include a non-uniform width (such as may be formed by sawing or etching), wherein the width narrows with depth of extension into the interior of the substrate 15. The carrier 135 is bonded (e.g., via direct bonding) or otherwise affixed to the substrate 15, wherein a light injection surface 134 of the carrier 135 is adjacent to the light extraction surface 11 of the substrate 15. The carrier 135 includes internal light segregation elements 136 extending from a patterned or textured light extraction surface 138 into an interior of the carrier 135, wherein the light segregation elements 136 include a width that narrows with depth of extension into the interior of the carrier 135. At least one lumiphoric material 85 is arranged on or over the light extraction surface 138 of the carrier 135, with the at least one lumiphoric material 85 including an outer surface defining multiple light output areas 86. Additional light segregation elements 139 are optionally arranged over an outer surface of the least one lumiphoric material 85, with each additional light segregation element 139 optionally including a width that tapers with distance away from the at least one lumiphoric material 85. Areas between the light segregation elements 76 (or between the light segregation elements 76 and the side edges 12) of the substrate 15, and between the light segregation elements 136 of the carrier 135, define light-transmissive regions 80 of the substrate 15 and the carrier 135 that are suitable for transmitting LED emissions. Preferably, the light output areas 86 of the at least one lumiphoric material 85 are substantially registered with the light-transmissive regions 80 of the substrate 15 and the carrier 135. In operation, the at least one lumiphoric material 85 receives LED emissions transmitted through the substrate 15 between the light segregation elements 76 and transmitted through the carrier 135 between the light segregation elements 136, converts a portion of the received LED emissions to a different wavelength, and transmits a combination of LED emissions and lumiphor emissions through the light output areas 86. Although only a single substrate 15 supporting a single array of LEDs 10 is shown in FIG. 16, it is to be appreciated that in certain embodiments, a multiplicity of substrates, each including an array of LEDs, may be supported by a single carrier and thereby form a large array including multiple sub-arrays.

FIG. 17 is a side cross-sectional view illustration of a light emitting device including a first array of flip chip LEDs 10A on a first transparent substrate 15A (e.g., embodied in a first multi-LED chip) and a second array of flip chip LEDs 10B on a second transparent substrate 15B (e.g., embodied in a second multi-LED chip), wherein both substrates 15A, 15B are joined (e.g., bonded) to a carrier 135. As illustrated in FIG. 17, each array of flip chip LEDs 10A, 10B is substantially identical. Within each array, each flip chip LED 10A, 10B includes a cathode 61A, 61B and an anode 62A, 62B arranged over a functional stack 60A, 60B supported by the respective substrate 15A, 15B, with adjacent flip chip LEDs 10A, 10B being separated by lateral gaps including streets 70A, 70B. Each substrate 15A, 15B includes side edges 12A, 12B coated with a light-reflective or light-absorptive material 75A, 75B, and a light injection surface 54A, 54B that is proximate to the flip chip LEDs 10A, 10B and that opposes a light extraction surface 11A, 11B. Each substrate 15A, 15B includes a first group of light segregation elements 76A, 76B extending from the light injection surface 54A, 54B into an interior of the substrate 15A, 15B, and includes a second group of light segregation elements 74A, 74B extending from the light extraction surface 11A, 11B into the interior of the substrate 15A, 15B. The carrier 135 is bonded (e.g., via direct bonding) or otherwise affixed to the substrates 15A, 15B, wherein a light injection surface 134 of the carrier 135 is adjacent to the light extraction surfaces 11A, 11B of the substrates 15A, 15B. The carrier 135 includes internal light segregation elements 136 extending from a patterned or textured light extraction surface into an interior of the carrier 135. The light extraction surface of the carrier 135 includes textured or patterned light extraction regions 138 segregated by untextured (e.g., flat) regions 137. At least one lumiphoric material 85 is arranged on or over the light extraction surface of the carrier 135, with the at least one lumiphoric material 85 including an outer surface defining multiple light output areas 86.

Continuing to refer to FIG. 17, areas between the light segregation elements 76A, 76B, 74A, 74B (or between the light segregation elements 76A, 76B, 74A, 74B and the side edges 12A, 12B) of the substrates 15A, 15B, and between the light segregation elements 136 of the carrier 135, define light-transmissive regions 80A, 80B of the substrates 15A, 15B and the carrier 135 that are suitable for transmitting LED emissions. Preferably, the textured or patterned light extraction regions 138 of the carrier 135 and the light output areas 86 of the at least one lumiphoric material 85 are substantially registered with the light-transmissive regions 80A, 80B of the substrates 15A, 15B and the carrier 135.

In operation of the device of FIG. 17, the at least one lumiphoric material 85 receives LED emissions transmitted through the substrates 15A, 15B between the light segregation elements 76A, 76B, 74A, 74B and transmitted through the carrier 135 between the light segregation elements 136, converts a portion of the received LED emissions to a different wavelength, and transmits a combination of LED emissions and lumiphor emissions through the light output areas 86. Preferably, each LED 10A, 10B is independently controlled, and pixel-like resolution of images produced by arrays of the device is preserved in the resulting emissions.

FIG. 18 is a side cross-sectional view illustration of a light emitting device similar to the device of FIG. 17, but wherein at least one lumiphoric material is arranged in at least one layer between substrates 15A, 15B and a carrier 135. Referring to FIG. 18, the light emitting device includes a first array of flip chip LEDs 10A on a first transparent substrate 15A (e.g., embodied in a first multi-LED chip) and a second array of flip chip LEDs 10B on a second transparent substrate 15B (e.g., embodied in a second multi-LED chip), wherein both substrates 15A, 15B are joined (e.g., bonded) to a carrier 135. Each array may be substantially identical in character. Within each array, each flip chip LED 10A, 10B includes a cathode 61A, 61B and an anode 62A, 62B arranged over a functional stack 60A, 60B supported by the respective substrate 15A, 15B, with adjacent flip chip LEDs 10A, 10B being separated by lateral gaps including streets 70A, 70B. Each substrate 15A, 15B includes side edges 12A, 12B coated with a light-reflective or light-absorptive material 75A, 75B, and a light injection surface 54A, 54B that is proximate to the flip chip LEDs 10A, 10B and that opposes a light extraction surface 11A, 11B. Each substrate 15A, 15B includes a first group of light segregation elements 76A, 76B extending from the light injection surface 54A, 54B into an interior of the substrate 15A, 15B, and includes a second group of light segregation elements 74A, 74B extending from the light extraction surface 11A, 11B into the interior of the substrate 15A, 15B. At least one lumiphoric material 85 including a light extraction surface 86' is arranged in at least one region or layer between the substrates 15A, 15B and the carrier 135. In certain embodiments, the at least one lumiphoric material 85 may be arranged in a light-transmissive adhesive material, such as epoxy or silicone, that provides a bond between the substrates 15A, 15B and the carrier 135, with a light injection surface 134 of the carrier 135 being adjacent to the at least one lumiphoric material 85.

Continuing to refer to FIG. 18, areas between the light segregation elements 76A, 76B, 74A, 74B (or between the light segregation elements 76A, 76B, 74A, 74B and the side edges 12A, 12B) of the substrates 15A, 15B define light-transmissive regions 80A, 80B that are suitable for transmitting LED emissions to impinge on the at least one lumiphoric material 85 having light output areas 86'. Additionally, areas between the light segregation elements 136 of the carrier 135 define additional light-transmissive regions 80A', 80B' that are suitable for transmitting a combination of lumiphor material emissions and unconverted LED emissions, wherein the combined emissions exit the device through the textured or patterned light extraction regions 138 of the light extraction surface of the carrier 135. Preferably, the textured or patterned light extraction regions 138 of the carrier 135 and the light output areas 86' of the at least one lumiphoric material 85 are substantially registered with the light-transmissive regions 80A, 80B of the substrates 15A, 15B and the additional light-transmissive regions 80A', 80B' of the carrier 135. Additionally, in preferred embodiments, each LED 10A, 10B is independently controlled, and pixel-like resolution of images produced by arrays of the device is preserved in the resulting emissions.

FIG. 19 is a top plan view of a light emitting device including four individually addressable arrays (or subarrays) of LEDs 10A-10D supported by light-transmissive substrates 15A-15D arranged in close proximity to one another and further supported by a light-transmissive carrier 135. Each array (or subarray) may be monolithic in character, each including multiple LEDs 10A-10D grown on a single substrate 15A-15D to yield a multi-LED chip. As illustrated in FIG. 19, cathodes 61A-61D and anodes 62A-62D of the LEDs 10A-10D are facing downward, and a light extraction surface 138 of the carrier 135 is facing upward. Each substrate 15A-15D may abut another substrate 15A-15D or may be separated by a small gap 150, preferably in such a manner as to maintain a constant pixel pitch (i.e., spacing between individual LEDs 10A-10D) that is substantially identical between the arrays 10A-10D supported by the different substrates 15A-15D. Restated, the spacing between subarrays (each including a substrate 15A-15D supporting LEDs 10A-10D) may be closely matched to the spacing between pixels within each subarray. Each substrate 15A-15D (and optionally also the carrier 135) includes light segregation elements 74A-74D between individual LEDs 10A-10D. Preferably, at least one lumiphoric material (not shown) is arranged on or along the light extraction surface 138 of the carrier 135, or between the carrier 135 and the substrates 15A-15D. Although only four subarrays of LEDs 10A-10D (each supported by a substrate 15A-15D) are shown in FIG. 19, it is to be appreciated that any suitable number of subarrays and substrates may be supported by a single carrier 135 to form a large composite array with any desired number of pixels (i.e., LEDs 10A-10D). Preferably, each LED 10A-10D is independently controlled, and pixel-like resolution of images produced by the entire composite array of LEDs 10A-10D is preserved in the resulting light emissions.

In certain embodiments, each subarray of LEDs is monolithic and/or identical in character. The use of a carrier supporting multiple LED subarrays may avoid practical difficulties (e.g., from a yield and cost perspective) in forming a single, large array of junctions on a single large growth substrate.

In certain applications, an entire composite array and/or one or more subarrays may have a tolerance of one, two, or another number of inactive pixels for certain applications (e.g., automotive headlamps) in which resolution may be less critical than in sequentially illuminated LED displays. In certain embodiments, different pixels may be arranged to output light of different dominant wavelengths.

Various embodiments disclosed herein are directed to providing strong contrast and/or sharpness between lit and unlit regions of LED arrays while seeking to reduce or eliminate crosstalk or light spill between such regions. However, when adjacent LEDs are lit, the presence of light segregation elements between such LEDs (which are intended to reduce or eliminate crosstalk) may lead to non-illuminated or "dark" zones between the LEDs, thereby degrading homogeneity of the composite emissions. Various embodiments described hereinafter are intended to provide strong contrast and/or sharpness between lit and unlit regions of a LED array, while enhancing homogeneity of composite emissions when adjacent LEDs of the array are lit. For example, in certain embodiments, an array of LEDs (optionally embodied in a multi-LED chip) defines multiple pixels, and multiple inter-pixel light spreading regions are configured to transmit light through border portions of the pixels to enhance inter-pixel illumination at light-emitting surface portions that are registered with or proximate to a plurality of light segregation elements. In certain embodiments, multiple light redirecting regions are arranged at least partially within a light-transmissive secondary substrate overlying a lumiphoric material that is arranged over a substrate that includes the plurality of light segregation elements, with the light redirecting regions being configured to enhance illumination of light emitting surface portions of the solid state light emitting device that are overlying and registered with the plurality of light segregation elements. The foregoing items (e.g., inter-pixel light spreading regions and/or light redirecting regions) are preferably configured to reduce appearance of non-illuminated or "dark" regions (corresponding to light segregation elements) between the LEDs when they are illuminated. In certain embodiments, light segregation elements may have a width in a range of about 10 μm to 30 μm, or in a range of about 15 μm to about 25 μm.

Homogeneity and crosstalk issues associated with multi-LED arrays may be better understood with reference to FIGS. 20A-20C. FIG. 20A is a top plan view digital photograph of a light emitting device (e.g., a multi-LED chip) including an array 152 of sixteen LEDs (e.g., forming sixteen pixels) with light segregation elements 156 arranged between individual LEDs (e.g., LED 155A1-155A4) forming a dark grid, and with each LED shown in a non-illuminated state. The LEDs are arranged in four columns (e.g., including columns 154A, 154B). The light segregation elements 156 are visible as a dark grid that separates lighter colored (e.g., gray) squares embodying light emitting surface portions or pixels of the LED array 152. FIG. 20B is a top plan view digital photograph of the LED array 152 of the light emitting device of FIG. 20A with current supplied to the rightmost column 154A of four LEDs 155A1-155A4, which are illuminated. As shown, the adjacent column 154B of LEDs (the second column from the right) is partially illuminated due to spillover of light from the rightmost column 154A of LEDs, and non-illuminated (or "dark") zones corresponding to light segregation elements 156 are visible between adjacent illuminated LEDs. FIG. 20C is a color inverted version of the digital photograph of FIG. 20B. To promote enhanced contrast and/or sharpness between lit and unlit regions, it would be desirable to eliminate or at least reduce crosstalk or light spillover between the rightmost column 154A of LEDs 155A1-155A4 and the adjacent column 154B of LEDs. To promote homogeneity of composite emissions of the LED array 152, it would be desirable to eliminate or at least reduce the appearance of the dark grid corresponding to light segregation elements 156 between individual LEDs (e.g., pixels), including but not limited to LEDs 155A1-155A4.

Figure 21B:
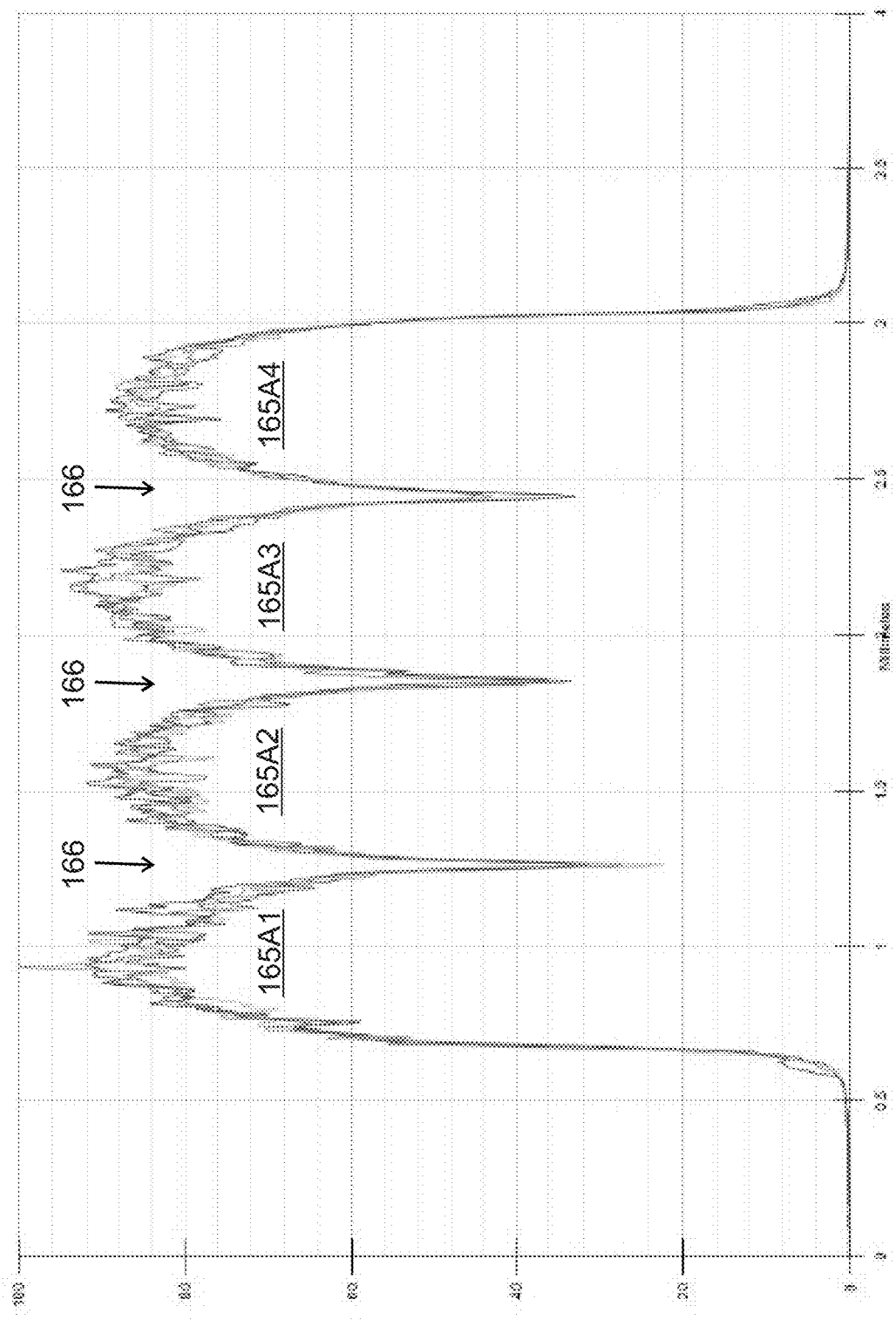
FIG. 21B includes four overlaid plots of relative light intensity (percent) versus position (millimeters) for the leftmost column of four illuminated LEDs of FIG. 21A.

FIG. 21A is a top view intensity mapped image of an eight-pixel portion of a light emitting device (e.g., a multi-LED chip) including an array 162 of multiple LEDs forming pixels, showing a leftmost column 164A of four LEDs 165A1-165A4 being illuminated. As shown, an adjacent column 164B of four LEDs is partially illuminated due to spillover of light from the leftmost column 164A of LEDs, and non-illuminated or "dark" zones are visible between adjacent illuminated LEDs corresponding to light segregation elements 166 provided between the LEDs (e.g., LEDs 165A1-165A4). Vertical lines 167 spanning over each LED 165A1-165A4 of the leftmost column 164A of LEDs are shown. FIG. 21B includes four overlaid plots of relative light intensity (percent) versus position (millimeters) for the leftmost column of four illuminated LEDs of FIG. 21A, with each plot corresponding to one of the four vertical lines 167 extending through the leftmost column 164A of LEDs 165A1-165A4 in FIG. 21A. As shown in FIG. 21B, relative light intensity drops precipitously (e.g., including reductions of about 70%) at locations between LEDs 165A1-165A4 corresponding to the presence of light segregation elements 166. As noted previously, to promote homogeneity of composite emissions of the LED array, it would be desirable to eliminate or at least reduce the appearance of the dark grid corresponding to light segregation elements 166 between individual LEDs (e.g., pixels).

In certain embodiments, a solid state light emitting device may include an array of LEDs arranged to transmit LED emissions through multiple light-transmissive portions of at least one substrate, multiple light segregation elements arranged at least partially within the at least one substrate, and multiple inter-pixel light spreading regions configured to transmit light through border portions of pixels defined by the light-transmissive portions of the at least one substrate to enhance inter-pixel illumination at light-emitting surface portions that are registered with or proximate to the light segregation elements. In certain embodiments, the at least one substrate consists of a single substrate supporting the array of LEDs (e.g., such as by growth of multiple LEDs on or over the substrate). In such an instance, adjacent LEDs may be separated by recesses or grooves formed in the substrate, and light segregation elements (optionally in combination with at least one light-transmissive material) may be provided at least partially within the recesses or grooves. In other embodiments, each LED includes a corresponding substrate portion, such that the at least one substrate embodies the multiple substrate portions, optionally mounted on a single submount or other mounting surface, wherein light segregation elements (optionally in combination with at least one light-transmissive material) may be provided between and/or along lateral surfaces of adjacent LEDs.

Certain embodiments of the present disclosure are directed to light emitting devices including multiple light segregation elements arranged entirely within at least one substrate (e.g., within recesses or grooves defined in the at least one substrate between adjacent LEDs) of a solid state light emitting device (e.g., a multi-LED chip), and multiple inter-pixel light spreading regions including at least one light-transmissive material arranged at least partially within the at least one substrate and over the light segregation elements. In certain embodiments, multiple recesses or grooves may be defined in at least one substrate, at least one material (e.g., preferably silver or white light-reflective material, or less preferably a light absorptive material such as carbon black) may be deposited in the recesses or grooves to form light segregation elements, and the at least one light-transmissive material may be deposited over the light segregation elements to form inter-pixel light spreading regions configured to transmit light through border portions of pixels defined by light-transmissive portions of the at least one substrate. Thereafter, at least one lumiphoric material may be deposited or otherwise provided over the at least one substrate as well as over the at least one light-transmissive material forming the inter-pixel light spreading regions. In certain embodiments, the recesses or grooves alone (i.e., without addition of light reflective or light absorptive material) may be used to provide light segregation utility.

FIGS. 22A-22C illustrate a portion of a solid state light emitting device 168 (e.g., a multi-LED chip) including features as described above following performance of sequential fabrication steps. FIG. 22A is a side cross-sectional schematic view of the portion of solid state light emitting device 168 during fabrication, including two LEDs 10A, 10B following formation of a recess or groove 179 in at least a portion of a substrate (including substrate portions 173A, 173B). Each LED 10A, 10B includes an anode-cathode pair 171A-172A, 171B-172B proximate to a functional stack 170A, 170B that is arranged to emit light into the substrate portions 173A, 173B. In this regard, each LED 10A, 10B may embody a flip chip LED. In certain embodiments, the functional stacks 170A, 170B and/or substrate portions 173A, 173B of different LEDs 10A, 10B may be integrally formed and/or connected via at least one interconnect 170'; alternatively, each LED 10A, 10B may be physically and/or electrically disconnected relative to one another. Each substrate portion 173A, 173B includes lateral surfaces 174A, 174B (including lateral surfaces bounding the recess or groove 179) and includes a primary light-emitting surface portion 175A, 175B.

FIG. 22B illustrates the portion of the solid state lighting emitting device 168 of FIG. 22A following sequential addition of a first material (e.g., a light reflective material) serving as a light segregation element 176 and addition of a second material (e.g., a light-transmissive material, optionally including a light scattering material such as fused silica, fumed silica, or the like) serving as a light spreading and/or light redirecting element 177 in the recess or groove 179 (shown in FIG. 22A) to form a filled recess 178. FIG. 22C illustrates the portion of the solid state light emitting device 168 of FIG. 22B following application of a lumiphoric material 180 over the primary light-emitting surface portions 175A, 175B of the substrate portions 173A, 173B and the filled recess 178. In certain embodiments, the lumiphoric material 180 includes phosphor particles dispersed in an appropriate carrier (e.g., silicone or epoxy) that may be cured to adhere the lumiphoric material 180 to the substrate portions 173A, 173B.

In operation of the solid state light emitting device 168, current is supplied to the LEDs 10A, 10B via the anode-cathode pairs 171A-172A, 171B-172B, and LED emissions are generated in the functional stacks 170A, 170B. Such LED emissions are propagated through the substrate portions 173A, 173B, with a majority impinging on the layer of lumiphoric material 180 above the primary light-emitting surface portions 175A, 175B. Shallow angle LED emissions are blocked from transmission between substrate portions 173A, 173B by the light segregation element 176; however, a fraction of moderate angle emissions may transit through the light spreading and/or light redirecting element 177 to impinge on a portion of the lumiphoric material 180 registered with the filled recess 178 (which is registered with the light segregation element 176). In this manner, a region forward of the light segregation element 176 is illuminated, appearance of a non-illuminated or dark zone between the substrate portions 173A, 173B is reduced, and homogeneity of light emissions of the light emitting device is enhanced.

FIGS. 23A and 23B illustrate a portion of a solid state light emitting device 182 (e.g., a multi-LED chip) similar to the solid state light emitting device 168 of FIG. 22C, but with addition of an elevated light-transmissive material region 184 registered with the light segregation element 176. In certain embodiments, the elevated light-transmissive material region 184 includes a bead of material such as silicone, optionally including one or more diffuser materials or other materials. As shown in FIG. 23A, the light emitting device 182 includes two LEDs 10A, 10B separated by a recess or groove (i.e., a gap) filled with sequentially arranged materials forming a light segregation element 176 and a light spreading and/or light redirecting element 177. The elevated light-transmissive material region 184 embodies an upward extension of the light spreading and/or light redirecting element 177 and includes a width 185 that permits the elevated light-transmissive material region 184 to overlap border portions of substrate portions 173A, 173B, to further enhance illumination of the portion of the layer of lumiphoric material 180 that overlies the light segregation element 176. Each LED 10A, 10B includes an anode-cathode pair 171A-172A, 171B-172B proximate to a functional stack 170A, 170B that is arranged to emit light into a substrate portion 173A, 173B. In certain embodiments, the functional stacks 170A, 170B and/or substrate portion 173A, 173B of different LEDs 10A, 10B may be integrally formed and/or connected via at least one interconnect 170'; alternatively, each LED 10A, 10B may be physically and/or electrically disconnected relative to one another. Each substrate portion 173A, 173B includes lateral surfaces 174A, 174B (including lateral surfaces bounding the recess or groove) and includes a primary light-emitting surface portion 175A, 175B. A layer of lumiphoric material 180 is provided over the substrate portions 173A, 173B as well as the elevated light-transmissive material region 184, with the lumiphoric material 180 including a transition 181 from a constant height to an increased height to accommodate the elevated height of the elevated light-transmissive material region 184. FIG. 23B is a top plan view of at least a portion of the solid state light emitting device portion of FIG. 23A including four LEDs, with dashed lines depicting the elevated light-transmissive material region. Operation of the solid state light emitting device 182 is substantially similar to operation of the solid state light emitting device 168 of FIG. 22C. In alternative embodiments, the elevated light-transmissive material region 184 may be arranged above the layer of lumiphoric material 180.

In certain embodiments, a substrate portion of a solid state light emitting device (e.g., a LED chip) supporting multiple LEDs may be provided with excess thickness to avoid bowing or warping, and the substrate portion may be thinned or removed (e.g., by chemical mechanical planarization, mechanical polishing, chemical etching, and/or another suitable polishing technique) after it is mounted to a carrier substrate or submount. For example, a substrate portion may initially have a thickness in a range of 300 μm to 500 μm, but after mounting and polishing, the substrate portion may have a final thickness in a range of about 50 μm to 100 μm. A preferred carrier substrate or submount for such an application includes a semiconductor (e.g., silicon) wafer with electrically conductive traces (e.g., arranged in, on, or over dielectric layers overlying the substrate to facilitate formation of complex, non-intersecting trace patterns), whereby the semiconductor wafer may provide significantly enhanced flatness relative to conventional circuit board materials (e.g., resin, FR4, or the like). Preferably, a carrier substrate or submount includes multiple electrode pairs, and the mounting establishes electrically conductive paths (e.g., using solder paste, solder bumps, or the like) between the anode-cathode pairs of LEDs and electrode pairs of the carrier substrate or submount. Mounting a substrate portion having excess thickness and supporting multiple LEDs over a semiconductor material-based carrier substrate or submount promotes enhanced flatness of mating surfaces to enable formation of reliable electrical connection. After mounting is complete, the substrate portion(s) may be thinned to enhance light extraction. In this context, the submount is used to support the LED chip to permit processing of the LED chip (e.g., with possible processing steps including, but not limited to, thinning or removal of the growth substrate), such that the submount acts as a carrier substrate.

FIGS. 24A and 24B illustrate a portion of a solid state light emitting device (e.g., a multi-LED chip) 186 in different states of fabrication, with the respective figures showing substrate portions with excess thickness (in FIG. 24A) and after mounting, substrate thinning, and lumiphoric material deposition (in FIG. 24B). As shown in FIG. 24A, the solid state light emitting device 186 includes two LEDs 10A, 10B separated by a gap (e.g., recess or groove) filled with sequentially arranged materials forming a light segregation element 176 and a light spreading and/or light redirecting element 177. Each LED 10A, 10B includes an anode-cathode pair 171A-172A, 171B-172B proximate to a functional stack 170A, 170B that is arranged to emit light into a substrate portion 173A, 173B that includes lateral surfaces 174A, 174B (i.e., including lateral surfaces bounding the filled gap). In certain embodiments, the functional stacks 170A, 170B and/or substrate portions 173A, 173B of different LEDs 10A, 10B may be integrally formed and/or connected via at least one interconnect 170'; alternatively, each LED 10A, 10B may be physically and/or electrically disconnected relative to one another. With continued reference to FIG. 24A, the anode-cathode pairs 171A-172A, 171B-172B are arranged over, but not in contact with, electrode pairs 91, 92 and corresponding solder bumps 93 arranged over an interface element (e.g., carrier substrate or submount) 94, which preferably includes a semiconductor wafer.

FIG. 24B shows the portion of the solid state light emitting device 186 of FIG. 24A after performance of additional fabrication steps including: mounting the substrate portions 173A, 173B over the interface element 94 (e.g., including making electrical connections between the anode-cathode pairs 171A-172A, 171B-172B and the electrode pairs 91, 92), thinning the substrate portions 173A, 173B (and simultaneously thinning the material forming the light spreading and/or light redirecting element 177), and forming a layer of lumiphoric material 180 over primary light-emitting surface portions 175A, 175B of the (thinned) substrate portions 173A, 173B and over the light spreading and/or light redirecting element 177. In certain embodiments, a lumiphoric material layer includes a carrier (e.g., silicone) with suspended lumiphoric material (e.g., phosphor particles), and upon curing may have a thickness of roughly 30 μm to 45 μm. Operation of the solid state light emitting device 186 of FIG. 24B is substantially similar to operation of the device 168 of FIG. 22C.

In certain embodiments, unfilled grooves or recesses defined in a substrate may serve as light segregation elements to reduce crosstalk between different LEDs of a LED array. In particular, grooves or recesses may be defined in a substrate using techniques disclosed herein (e.g., via chemical means such as etching, or mechanical means such as wire sawing). Lateral walls or boundaries of such grooves or recesses may transmit or reflect light depending on the angle of incidence of incoming light, such that low angle light may be reflected and high angle light may be transmitted. However, providing a lumiphoric material over groove- or recess-defining portions of a substrate supporting a LED array may result in inadvertent deposition of material into the grooves or recesses, thereby interfering with light segregation utility. Techniques to overcome this issue are addressed in FIGS. 25A-25D and FIGS. 26A and 26B.

FIGS. 25A-25D illustrate a solid state light emitting device 188 (e.g., a multi-LED chip) in different states of fabrication, in which a removable material is provided in a recess or groove defined in a substrate during fabrication and subsequently removed to yield an unfilled recess or groove between substrate portions. A removable material may be removed by at least one of chemical, mechanical, or thermal means. As one non-limiting example, a removable material may be water-soluble (e.g., HogoMax material available from Disco Corporation, Tokyo, Japan), and may be removed by exposure to water optionally aided by sonication, whereby the removable material may be removed from exposed edges of a substrate via grooves or recesses extending to the exposed edges.

As shown in FIG. 25A, the solid state light emitting device 188 (e.g., a multi-LED chip) includes two LEDs 10A, 10B separated by a recess or groove that is filled with a removable material 189. Substrate portions 173A, 173B are provided with excess thickness to prevent warping or bowing, and thereby enhance the likelihood of successful electrical connection of each LED in an array to the interface element 94. Each LED 10A, 10B includes an anode-cathode pair 171A-172A, 171B-172B proximate to a functional stack 170A, 170B that is arranged to emit light into the substrate portion 173A, 173B that includes lateral surfaces 174A, 174B (i.e., including lateral surfaces bounding the filled recess or groove). In certain embodiments, the functional stacks 170A, 170B and/or substrate portions 173A, 173B of different LEDs 10A, 10B may be integrally formed and/or connected via at least one interconnect 170'; alternatively, each LED 10A, 10B may be physically and/or electrically disconnected relative to one another. With continued reference to FIG. 25A, the anode-cathode pairs 171A-172A, 171B-172B are mounted (e.g., via solder bumps 93) to electrode pairs 91, 92 of the interface element 94, which preferably includes a semiconductor wafer. Although solder bumps 93 are shown, it is to be appreciated that any suitable electrical connection means (e.g., solder paste or other means) may be used instead. FIG. 25A further shows addition of an underfill material 99 (e.g., optionally including an epoxy filled with SiO$_2$ microspheres) between the solid state light emitting device 188 and the interface element 94, whereby the underfill material 99 may provide structural support between the foregoing elements without compromising conductive electrical connections between the anode-cathode pairs 171A-172A, 171B-172B and the electrode pairs 91, 92 of the interface element 94.

FIG. 25B shows the solid state light emitting device 188 of FIG. 25A following thinning (e.g., via polishing) of the substrate portions 173A, 173B to enhance light extraction, yielding primary light-emitting surface portions 175A, 175B. Such thinning correspondingly reduces the height of the removable material 189 provided between the substrate portions 173A, 173B. FIG. 25C shows the solid state light emitting device 188 of FIG. 25B following formation of a layer of lumiphoric material 180 over the primary light-emitting surface portions 175A, 175B of the thinned substrate portions 173A, 173B as well as over the removable material 189. FIG. 25D shows the solid state light emitting device 188 of FIG. 25C following removal of the removable material to yield an unfilled recess or groove 179 that is covered with the layer of lumiphoric material 180. The unfilled recess or groove 179 preferably serves as a light segregating element to prevent or limit crosstalk between the LEDs 10A, 10B in operation. Operation of the solid state light emitting device 188 is substantially similar to operation of the solid state light emitting device 168 of FIG. 22C.

Although FIG. 25D shows the unfilled recess or groove 179 as extending through the entire thickness of the substrate portions 173A, 173B, in alternative embodiments, a removable material may be initially formed in a bottom portion of a recess or groove and followed thereafter with a light-transmissive material to form a light spreading or light redirecting element, whereby the light-transmissive material is not intended to be removed. The resulting structure may include an unfilled lower portion of a recess or groove to provide light segregation utility, and an upper portion of the recess or groove to provide light spreading or light redirecting utility.

Figure 26A:
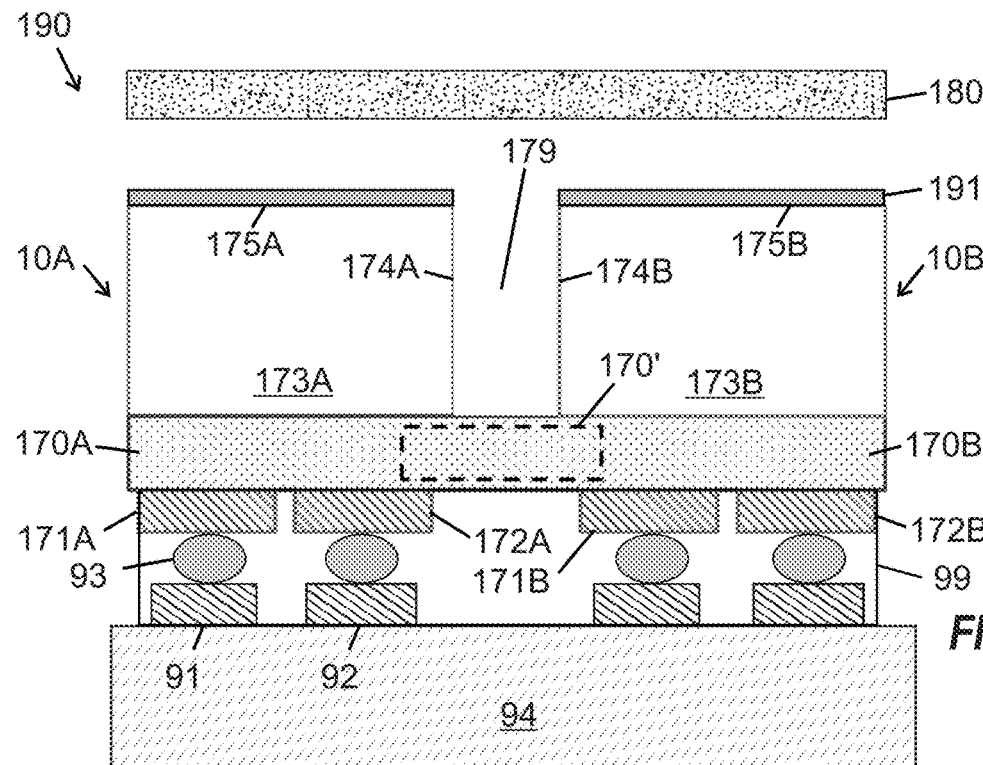
FIG. 26A is a side cross-sectional schematic view of a portion of a solid state light emitting device (e.g., a multi-LED chip) including multiple LEDs and a substrate mounted over an interface element (e.g., ASIC, or carrier substrate or submount), with an unfilled recess or groove defined in the substrate, an adhesion promoting material arranged over the substrate, a lumiphoric material film arranged over the substrate and the adhesion promoting material, and with an underfill material arranged between the multi-LED chip and the interface element.
Figure 26B:
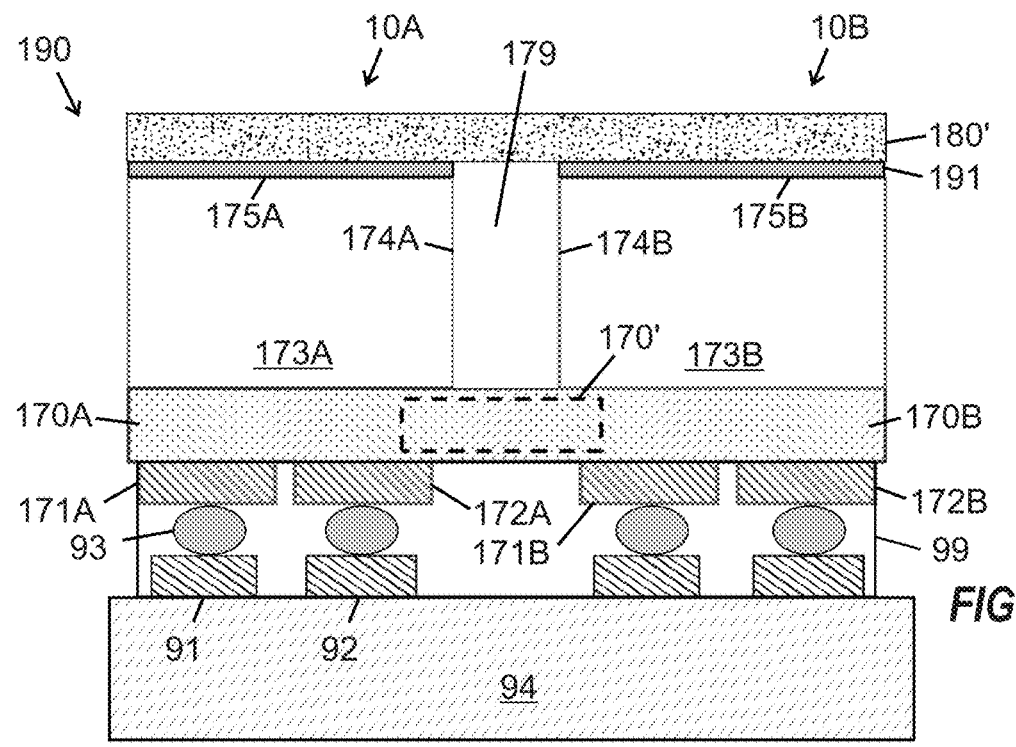
FIG. 26B is a side cross-sectional schematic view of the solid state light emitting device portion of FIG. 26A following adhesion of the lumiphoric material film over the substrate, with the recess or groove arranged between the LEDs remaining unfilled.

FIGS. 26A and 26B illustrate a portion of a solid state light emitting device 190 (e.g., a multi-LED chip) utilizing a lumiphoric material film 180' and an adhesion promoting material 191 to dispense with the need for adding and thereafter removing a removable material as described in connection with FIGS. 25A-25D. Referring to FIG. 26A, the solid state light emitting device 190 includes two LEDs 10A, 10B separated by an unfilled recess or groove 179. Each LED 10A, 10B includes an anode-cathode pair 171A-172A, 171B-172B proximate to a functional stack 170A, 170B that is arranged to emit light into a substrate portion 173A, 173B that includes lateral surfaces 174A, 174B (i.e., including lateral surfaces bounding the unfilled recess or groove 179) and primary light-emitting surface portions 175A, 175B. In certain embodiments, the functional stacks 170A, 170B and/or substrate portions 173A, 173B of different LEDs 10A, 10B may be integrally formed and/or connected via at least one interconnect 170'; alternatively, each LED 10A, 10B may be physically and/or electrically disconnected relative to one another. With continued reference to FIG. 26A, the anode-cathode pairs 171A-172A, 171B-172B are mounted (e.g., via solder bumps 93) to electrode pairs 91, 92 of an interface element 94, which preferably includes a semiconductor wafer. FIG. 26A further shows addition of an underfill material 99 (e.g., optionally including an epoxy filled with SiO$_2$ microspheres) between the solid state light emitting device 190 and the interface element 94, whereby the underfill material 99 may provide structural support between the foregoing elements without compromising conductive electrical connections between the anode-cathode pairs 171A-172A, 171B-172B and the electrode pairs 91, 92 of the interface element 94. With the mounting complete, the substrate portions 173A, 173B are shown in a thinned state (with such thinning preferably following mounting of the substrate portions 173A, 173B over the interface element 94). The adhesion promoting material 191 (e.g., silicone or epoxy) is preferably provided in a thin layer over the primary light-emitting surface portions 175A, 175B of the substrate portion 173A, 173B. FIG. 26B shows the solid state light emitting device 190 of FIG. 26A following adhesion of the lumiphoric material film 180' over the substrate portions 173A, 173B using the adhesion promoting material 191, thereby enclosing the unfilled recess or groove 179. The unfilled recess or groove 179 preferably serves as a light segregating element to prevent or limit crosstalk between the LEDs 10A, 10B in operation. Operation of the solid state light emitting device 188 is substantially similar to operation of the solid state light emitting device 168 of FIG. 22C, and the solid state light emitting device 190 of FIG. 25D.

In certain embodiments, each layer and/or substrate (including the epitaxial region) of a multi-LED chip as disclosed herein may include features that are etched, ground, sawed, formed on and/or deposited in or on one or more portions of the device chip to from pixelated regions of the LED chip with the desired optical characteristics and/or performance of the LED chip. Layers and/or substrates that are additional to or different from those expressly described may be included with additional features. For example, additional optical coupling layers may be provided, such as coupling layers with index of refraction values that would promote light extraction from portions of pixelated regions of a LED chip covered with such layer(s), such as in an inner or central region of each pixel. In another example, an adhesive layer (such as adhesive layer 191 illustrated in FIGS. 26A-26N), can also serve that purpose or additional layers can be used to provide optical, adhesive, structural, and/or passivation utility. Other light extraction and/or light shaping can be provided on or associated with pixel regions to provide a desired optical performance. In certain embodiments, if a layer or substrate includes such features on a first side thereof, then a first side of layer or substrate may be bonded to an adjacent (e.g., underlying or overlying depending on the orientation) other layer or substrate to achieve a desired optical performance. After such bonding is complete, additional processing can be performed on an opposing second side of the layer or substrate, with non-limiting examples of such additional processing steps including as grinding, etching, sawing, defining additional optical features, and/or thinning the layer or substrate, to enhance (e.g. expose or define) and/or cooperate with features on the first side. Additional features can also be deposited or formed on the second side, either before or after processing of the second side. As such, different cumulative shapes and/or optical characteristics for the optical features can be provided to frame or border the pixel regions of the LED chip, and/or to affect any desired areas of each pixel region to obtain desired optical characteristics. Such characteristics may be provided in or on one layer, or may be provided by deposition or stacking of additional and/or different layer(s) or substrate(s), including the same and/or different materials. In certain embodiments, desired optical characteristics (e.g., desired homogeneity and contrast) may change depending on the end use application.

While certain embodiments disclosed herein include different height portions of a recess or groove containing materials providing different utilities (e.g., light segregating utility versus light spreading and/or light redirecting utility), in other embodiments, different width portions of a recess or groove between substrate portions may contain different materials. One example of such an embodiment is shown in FIGS. 27A and 27B. FIG. 27A illustrates a portion of a solid state light emitting device 194 (e.g., a multi-LED chip) including three LEDs 10A-10C and a substrate following performance of certain fabrication steps, with recesses or grooves 179A-179C being defined in portions of the substrate between adjacent LEDs 10A-10C to define substrate portions 173A-173C. (A fourth substrate portion 173Z is shown to laterally bound or define the recess or groove 179A.) Each recess or groove 179A-179C include a first width portion 179A1, 17961, 179C1 and a second width portion 179A2, 179B2, 179C2. As shown in FIG. 27A, the first width portion 179A1, 17961, 179C1 of each recess or groove 179A-179C contains a light segregation element 176A-176C. These light segregation elements 176A-176C may be formed, for example, by orienting the substrates vertically in a fluid bath, and circulating fluid containing particulate material to deposit particulate material in the recesses or grooves 179A-179C. Other methods may be used to deposit a light segregation material in the first width portion 179A1, 17961, 179C1 of each recess or groove 179A-179C.

As shown in FIG. 27A, each LED 10A-10C includes an anode-cathode pair 171A-172A, 171B-172B, 171C-172C proximate to a functional stack 170A-170C that is arranged to emit light into a substrate portion 173A-173C that includes lateral surfaces 174A-174C (i.e., including lateral surfaces bounding respective recesses or grooves 179A-179C) and primary light-emitting surface portions 175A-175C. In certain embodiments, the functional stacks 170A-170C and/or substrate portions 173A-173C of different LEDs 10A-10C may be integrally formed and/or connected via at least one interconnect 170'; alternatively, each LED 10A-10C may be physically and/or electrically disconnected relative to one another.

FIG. 27B shows the solid state light emitting device 194 of FIG. 27A following addition of a light-transmissive material to each second width portion 179A2, 179B2, 179C2 of the recesses or grooves (179A-179C; shown in FIG. 27A) to form light spreading and/or light redirecting elements 177A-177C that serve to reduce the appearance of non-illuminated or dark regions produced by the light segregation elements 176A-176C in comparison to an alternative configuration with each light segregation element 176A-176C occupying a full width of a corresponding light spreading and/or light redirecting element 177A-177C.

In certain embodiments, one or more optical elements such as a wavelength-selective light-transmissive region (e.g., an optical filter or optical reflector) or a one-way mirror may be provided between different solid state emitter substrate portions to promote spreading of light between pixels of a LED array, and therefore enhance homogeneity of combined emissions. An example is described in connection with FIGS. 28A-28D, which illustrate use of optical elements arranged along side surfaces of solid state emitter substrate portions.

FIG. 28A is a side cross-sectional view of three LEDs 10A-10C each including a substrate portion 173A-173C and each being mounted along a lateral surface 174A-174C thereof to a carrier 195. Each LED 10A-10C includes an anode-cathode pair 171A-172A, 171B-172B, 171C-172C proximate to a functional stack 170A-170C that is arranged to emit light into the substrate portion 173A-173C that includes lateral surfaces 174A-174C (i.e., including lateral surfaces bounding respective recesses or grooves) and primary light-emitting surface portions 175A-175C. Mounting of the LEDs 10A-10C to the carrier 195 is intended to enable formation of optical elements 196A-196C along side surfaces of the LEDs 10A-10C, as shown in FIG. 28B. Thereafter, the LEDs 10A-10C may be removed from the carrier 195 and (following placement using precision pick-and-place techniques or the like) mounted over an interface element 94 to form a solid state light emitting device 200, as shown in FIG. 28C. In particular, the substrate portions 173A-173C may be mounted over the interface element 94 with simultaneous formation of electrical connections between the anode-cathode pairs 171A-172A, 171B-172B, 171C-172C of the LEDs 10A-10C and corresponding electrode pairs 91, 92 of the interface element 94 (e.g., using solder bumps 93, solder paste, or similar means). Additionally, light-transmissive material may be deposited into gaps between the optical elements 196A-196C and lateral surfaces 174A-174C of adjacent LEDs 10A-10C to form light spreading and/or light redirecting elements 197A-197C. Thereafter, the primary light-emitting surface portions 175A-175C, the optical elements 196A-196C, and the light spreading and/or light redirecting elements 197A-197C are overlaid with a layer of lumiphoric material 180, as shown in FIG. 28D.

In operation of the solid state light emitting device 200, current is supplied to the LEDs 10A-10C via the anode-cathode pairs 171A-172A, 171B-172B, 171C-172C and LED emissions are generated in the functional stacks 170A-170C. Such LED emissions are propagated through the substrate portions 173A-173C, with a majority of steep angle emissions impinging on the layer of lumiphoric material 180 above the primary light-emitting surface portions 175A-175C. Shallow angle LED emissions may be transmitted (optionally in combination with refraction) or reflected between substrate portions 173A-173C via the optical elements 196A-196C, but preferably, at least a fraction of any LED emissions interacting with the optical elements 196A-196C may be directed through the light spreading and/or redirection elements 197A-197C to impinge on the overlying lumiphoric material 180. In this manner, appearance of a non-illuminated or dark zone between the substrate portions 173A-173C is preferably reduced, and homogeneity of light emissions of the light emitting device may be enhanced.

In certain embodiments, light-transmissive portions of at least one substrate include at least one beveled edge to enhance spreading of light over light segregation elements and therefore serve as inter-pixel light spreading regions. In certain embodiments, multiple inter-pixel light spreading regions are formed in a multi-LED chip. An angular range of the at least one beveled edge may be adjusted to optimize light extraction. Examples of such a configuration are shown in connection with FIGS. 29A and 29B and FIGS. 30A and 30B.

FIGS. 29A and 29B illustrate a portion of a solid state light emitting device 202 (e.g., a multi-LED chip) including two LEDs 10A, 10B and a substrate (including substrate portions 173A, 173B) defining a recess or groove 179 containing a light segregation element 176, and with the substrate portions 173A, 173B including beveled edge portions 204A, 204B arranged proximate to the light segregation element 176. In certain embodiments, the recess or groove 179 may be formed with a wire saw, and the beveled edge portions 204A, 204B may be formed with a wire saw arranged to travel in each instance in an angled direction. The beveled edge portions 204A, 204B laterally bound an expanded recess portion 179' having a greater width than the recess or groove 179 containing the light segregation element 176. Each LED 10A, 10B includes an anode-cathode pair 171A-172A, 171B-172B proximate to a functional stack 170A, 170B that is arranged to emit light into the substrate portion 173A, 173B that includes lateral surfaces 174A, 174B (i.e., including lateral surfaces bounding the recess or groove 179) and primary light-emitting surface portions 175A, 175B. In certain embodiments, the functional stacks 170A, 170B and/or substrate portions 173A, 173B of different LEDs 10A, 10B may be integrally formed and/or connected via at least one interconnect 170'; alternatively, each LED 10A, 10B may be physically and/or electrically disconnected relative to one another. FIG. 29B shows the solid state light emitting device 202 of FIG. 29A following formation of a layer of lumiphoric material 180 over the substrate portions 173A, 173B and the light segregation element 176.

In operation of the solid state light emitting device 202, current is supplied to the LEDs 10A, 10B via the anode-cathode pairs 171A-172A, 171B-172B and LED emissions are generated in the functional stacks 170A, 170B. Such LED emissions are propagated through the substrate portions 173A, 173B, with a majority impinging on the layer of lumiphoric material 180 above the primary light-emitting surface portions 175A, 175B. Shallow angle LED emissions are blocked from transmission between substrate portions 173A, 173B by the light segregation element 176; however, a fraction of moderate angle emissions may transit through the beveled edge portions 204A, 204B (serving as light spreading and/or light redirecting regions) to impinge on a portion of the lumiphoric material 180 within the expanded recess portion 179' and registered with (or proximate to) the light segregation element 176. In this manner, a region forward of the light segregation element 176 (corresponding to an inter-pixel light spreading region 203) is illuminated, appearance of a non-illuminated or dark zone between the substrate portions 173A, 173B is reduced, and homogeneity of light emissions of the solid state light emitting device 202 is enhanced.

FIGS. 30A and 30B illustrate another beveled edge embodiment that includes an unfilled recess or groove serving as a light segregation element and that is arranged to be covered with a lumiphoric material film. Referring to FIG. 30A, a solid state light emitting device 205 (e.g., a multi-LED chip) includes two LEDs 10A, 10B separated by an unfilled recess or groove 179. Each LED 10A, 10B includes an anode-cathode pair 171A-172A, 171B-172B proximate to a functional stack 170A, 170B that is arranged to emit light into a substrate portion 173A, 173B that includes lateral surfaces 174A, 174B (i.e., including lateral surfaces bounding the unfilled recess or groove 179) and primary light-emitting surface portions 175A, 175B. The substrate portions 173A, 173B include beveled edge portions 204A, 204B arranged proximate to the unfilled recess or groove 179. The beveled edge portions 204A, 204B laterally bound an expanded recess portion 179' having a greater width than the recess or groove 179. In certain embodiments, the functional stacks 170A, 170B and/or substrate portions 173A, 173B of different LEDs 10A, 10B may be integrally formed and/or connected via at least one interconnect 170'; alternatively, each LED 10A, 10B may be physically and/or electrically disconnected relative to one another. As shown, the anode-cathode pairs 171A-172A, 171B-172B are mounted (e.g., via solder bumps 93 or other means, such as solder paste or the like) to electrode pairs 91, 92 of an interface element 94, which preferably includes a semiconductor wafer. Additionally, an underfill material 99 is provided between the solid state light emitting device 205 and the interface element 94.

Referring to FIG. 30B, an adhesion promoting material 191 (e.g., silicone or epoxy) is preferably provided in a thin layer over the primary light-emitting surface portions 175A, 175B of the substrate portions 173A, 173B, and a lumiphoric material film 180' is adhered over the adhesion promoting material 191, thereby enclosing the unfilled recess or groove 179 and the expanded recess portion 179'. The unfilled recess or groove 179 preferably serves as a light segregating element to prevent or limit crosstalk between the LEDs 10A, 10B in operation, and the beveled edge portions 204A, 204B preferably serve as light spreading and/or light redirecting elements to cause LED emissions to impinge on a portion of the lumiphoric material film 180' overlying the expanded recess portion 179'. In this manner, a region forward of the unfilled recess or groove 179 (with the forward region corresponding to an inter-pixel light spreading region 203) is illuminated, appearance of a non-illuminated or dark zone between the substrate portions 173A, 173B is reduced, and homogeneity of light emissions of the solid state light emitting device 205 is enhanced.

In certain embodiments, light segregation elements may be defined between portions of a substrate of a multi-LED array (e.g., embodied in a multi-LED chip), a lumiphoric material layer may be arranged over the substrate portions, and a light-transmissive secondary substrate including light spreading and/or light redirecting regions may be arranged over the lumiphoric material layer to reduce the appearance of non-illuminated or dark zones overlying light segregation elements. The light-transmissive secondary substrate may include a patternable wafer-type material such as sapphire, and the light spreading and/or light redirecting regions may be defined by photolithographic patterning and selective material removal, optionally followed by selective material deposition (e.g., to deposit material having lumiphoric material and/or a different index of refraction, scattering, or optical properties relative to the bulk of the light-transmissive secondary substrate). Examples of such embodiments are described in connection with FIGS. 31-35.

FIG. 31 illustrates a portion of a solid state light emitting device 206 (e.g., a multi-LED chip) including three LEDs 10A-10C and a substrate, with recesses or grooves being defined in portions of the substrate between adjacent LEDs 10A-10C to define substrate portions 173A-173C. Each recess or groove is filled with a light segregation element 176A, 176B. Each LED 10A-10C includes an anode-cathode pair 171A-172A, 171B-172B, 171C-172C proximate to a functional stack 170A-170C that is arranged to emit light into the substrate portion 173A-173C that includes lateral surfaces 174A-174C (i.e., including lateral surfaces bounding respective recesses or grooves) and primary light-emitting surface portions 175A-175C. In certain embodiments, the functional stacks 170A-170C and/or substrate portions 173A-173C of different LEDs 10A-10C may be integrally formed and/or connected via at least one interconnect 170'; alternatively, each LED 10A-10C may be physically and/or electrically disconnected relative to one another. A layer of lumiphoric material 180 is arranged over the primary light-emitting surface portions 175A-175C and light segregation elements 176A, 176B. A secondary substrate 210 is arranged over the layer of lumiphoric material 180 and includes triangular light spreading and/or light redirecting regions 214A, 214B in the secondary substrate 210 proximate to the layer of lumiphoric material 180. The secondary substrate 210 includes a lower surface 211 and an upper surface 212, with the lower surface proximate to the layer of lumiphoric material 180. Each light spreading and/or light redirecting region 214A, 214B includes a base 215A, 215B and an apex 216A, 216B, wherein the base 215A, 215B is closer than the apex 216A, 216B to the substrate portions 173A-173C such that each apex 216A, 216B points upward. A light scattering material 208 is further arranged over the upper surface 212 of the secondary substrate 210.

In operation of the solid state light emitting device 206, current is supplied to the LEDs 10A-10C via the anode-cathode pairs 171A-172A, 171B-172B, 171C-172C and LED emissions are generated in the functional stacks 170A-170C. Such LED emissions are propagated through the substrate portions 173A-173C, with a majority of steep angle emissions impinging on the layer of lumiphoric material 180 above the primary light-emitting surface portions 175A-175C. Shallow angle LED emissions may be reflected by the light segregation elements 176A, 176B and redirected upward toward the lumiphoric material 180. A portion of the lumiphoric material 180 between substrate portions 173A-173C is configured to direct emissions into the light spreading and/or light redirecting regions 214A, 214B. In this manner, regions forward of the light segregation elements 176A, 176B (corresponding to inter-pixel light spreading regions 207A, 207B) are illuminated, appearance of non-illuminated or dark zones between the substrate portions 173A-173C corresponding to the light segregation elements 164A, 176B is reduced, and homogeneity of light emissions of the solid state light emitting device 206 is enhanced.

FIG. 32 illustrates a portion of another solid state light emitting device 220 (e.g., a multi-LED chip) that is substantially similar to the solid state light emitting device 206 of FIG. 31 (such that identical elements will not be described again), but with differently shaped and differently placed light spreading and/or light redirecting regions 218A, 218B. In particular, the secondary substrate 210 arranged over a layer of lumiphoric material film 180' includes rectangular light spreading and/or light redirecting regions 218A, 218B in the secondary substrate 210 that extend through the layer of lumiphoric material film 180' (such that the layer may be discontinuous in character) and through lower portions of the secondary substrate 210 (e.g., through the lower surface 211 of the secondary substrate 210 but not to the upper surface 212). Each light spreading and/or light redirecting region 218A, 218B is registered with an underlying light segregation element 176A, 176B and includes a width that is substantially the same as the corresponding underlying light segregation element 176A, 176B. Operation of the solid state light emitting device 220 is substantially similar to operation of the solid state light emitting device 206 of FIG. 31.

Figure 33:
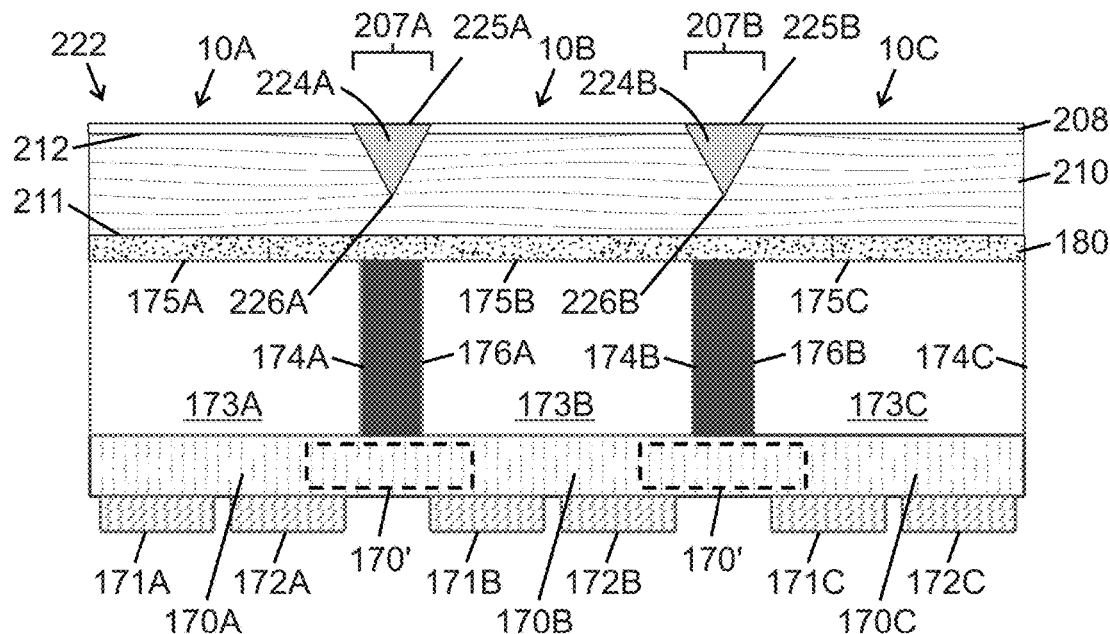
FIG. 33 is a side cross-sectional view of a portion of a solid state light emitting device including three LEDs and a substrate (e.g., a multi-LED chip), with recesses or grooves being defined in portions of the substrate between adjacent LEDs, each recess or groove being filled with a light segregation element, a lumiphoric material layer arranged over the substrate and the light segregation elements, a secondary substrate arranged over the lumiphoric material layer and including triangular light redirecting regions therein, and a light scattering material arranged over the secondary substrate, with the triangular light redirecting regions each including a base portion extending through the light scattering material.

FIG. 33 illustrates a portion of another solid state light emitting device 222 (e.g., a multi-LED chip) that is substantially similar to the solid state light emitting device 206 of FIG. 31 (such that identical elements will not be described again), but with differently placed and oriented light spreading and/or light redirecting regions 224A, 224B. In particular, the secondary substrate 210 arranged over a layer of lumiphoric material 180 includes triangular light spreading and/or light redirecting regions 224A, 224B in the secondary substrate 210 that are proximate to an upper surface 212 of the secondary substrate 210. Each light spreading and/or light redirecting region 224A, 224B includes a base 225A, 225B and an apex 226A, 226B, wherein the apex 226A, 226B is closer than the base 225A, 225B to the substrate portions 173A-173C, such that each apex 226A, 226B points downward. A light scattering material 208 is further arranged over an upper surface of the secondary substrate 210, with the base 225A, 225B of each light spreading and/or light redirecting region 224A, 224B extending upward through at least a portion of the light scattering material 208. Operation of the solid state light emitting device 220 is substantially similar to operation of the solid state light emitting device 206 of FIG. 31.

Figure 34:
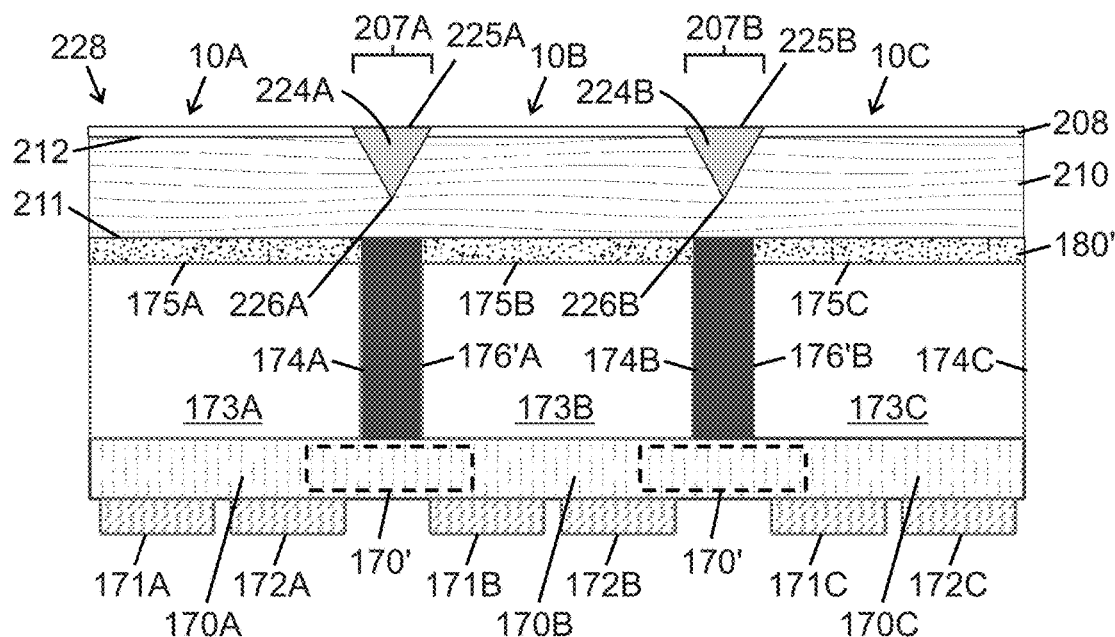
FIG. 34 is a side cross-sectional view of a portion of a solid state light emitting device including three LEDs and a substrate (e.g., a multi-LED chip), with recesses or grooves being defined in portions of the substrate between adjacent LEDs, each recess or groove being filled with a light segregation element that extends beyond the substrate, a lumiphoric material layer arranged over the substrate between the light segregation elements, a secondary substrate arranged over the lumiphoric material layer and including triangular light redirecting regions therein, and a light scattering material arranged over the secondary substrate, with the triangular light redirecting regions each including a base portion extending through the light scattering material.

FIG. 34 illustrates a portion of another solid state light emitting device 228 (e.g., a multi-LED chip) that is substantially similar to the solid state light emitting device 206 of FIG. 31 (such that identical elements will not be described again), but with differently placed and oriented light spreading and/or light redirecting regions 224A, 224B and lengthened light segregation elements 176'A, 176'6. In particular, each lengthened light segregation element 176'A, 176'B extends upward past substrate portions 173A-173C and through at least a portion of a layer of lumiphoric material film 180'. Additionally (in a manner similar to FIG. 33), a secondary substrate 210 arranged over the layer of lumiphoric material film 180' includes triangular light spreading and/or light redirecting regions 224A, 224B in the secondary substrate 210 that are proximate to an upper surface 212 of the secondary substrate 210. Each light spreading and/or light redirecting region 224A, 224B includes a base 225A, 225B and an apex 226A, 226B, wherein the apex 226A, 226B is closer than the base 225A, 225B to the substrate portions 173A-173C, such that each apex 226A, 226B points downward. A light scattering material 208 is further arranged over an upper surface of the secondary substrate 210, with the base 225A, 225B of each light spreading and/or light redirecting region 224A, 224B extending upward through at least a portion of the light scattering material 208. Operation of the solid state light emitting device 220 is substantially similar to operation of the solid state light emitting device 206 of FIG. 31.

Figure 35:
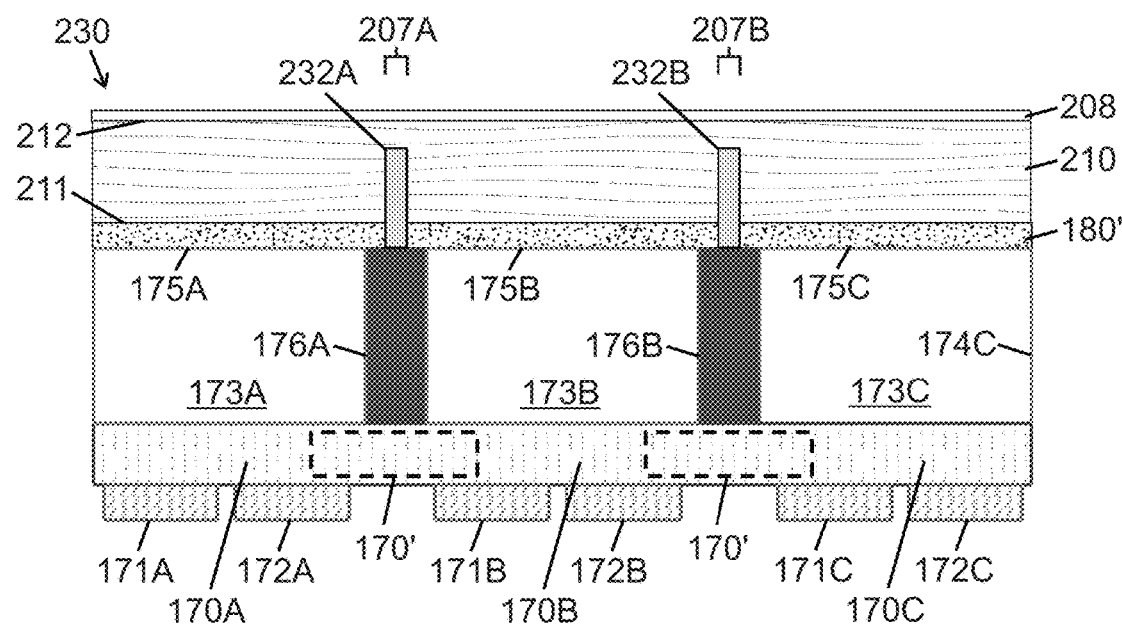
FIG. 35 is a side cross-sectional view of a portion of a solid state light emitting device including three LEDs and a substrate (e.g., a multi-LED chip), with recesses or grooves being defined in portions of the substrate between adjacent LEDs, each recess or groove being filled with a light segregation element, a lumiphoric material layer arranged over the substrate, a secondary substrate arranged over the lumiphoric material layer and including rectangle-shaped light redirecting regions in the secondary substrate and extending through the lumiphoric material layer, and a light scattering material arranged over the secondary substrate, with the light redirecting regions being narrower in width than the light segregation elements.

FIG. 35 illustrates a portion of another solid state light emitting device 230 (e.g., a multi-LED chip) that is substantially similar to the device 206 of FIG. 31 and the device 220 of FIG. 32 (such that identical elements will not be described again), but with differently placed, dimensioned, and oriented light spreading and/or light redirecting regions 232A, 232B. A secondary substrate 210 arranged over a layer of lumiphoric material film 180' includes rectangular light spreading and/or light redirecting regions 232A, 232B in the secondary substrate 210 that extend through the layer of lumiphoric material film 180' (such that the layer of lumiphoric material film 180' may be discontinuous in character) and through lower portions of the secondary substrate 210 (i.e., extending through the lower surface 211 of the secondary substrate 210 but not far enough to contact the upper surface 212). Each light spreading and/or light redirecting region 232A, 232B is registered with an underlying light segregation element 176A, 176B, but includes a width that is substantially smaller than the corresponding underlying light segregation element 176A, 176B. Operation of the solid state light emitting device 230 is substantially similar to operation of the solid state light emitting device 206 of FIG. 31, and solid state light emitting device 220 of FIG. 32.

Figure 36:
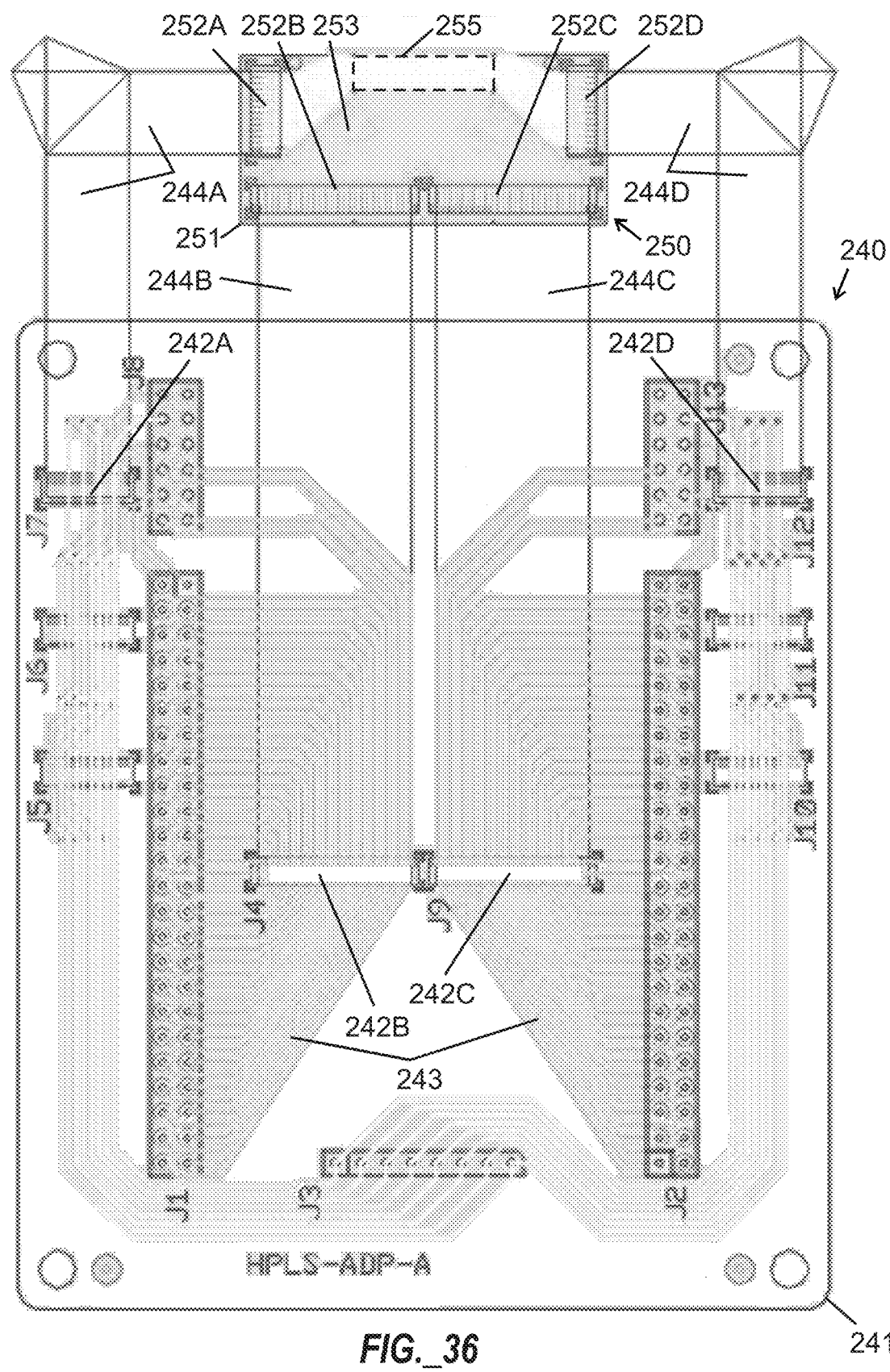
FIG. 36 is a top plan view of interconnections between a circuit board and a carrier substrate or submount of a test apparatus for operating a solid state light emitting device including a high density LED array (e.g., embodying at least one multi-LED chip) as disclosed herein.

FIG. 36 shows interconnections between a circuit board 240 and a submount 250 of a test apparatus for operating a solid state light emitting device (e.g., a multi-LED chip) including a high density LED array as disclosed herein. The circuit board 240 includes a substrate 241 (e.g., including conventional circuit board material such as FR-4) supporting numerous (e.g., copper) electrical traces 243, which may be formed on one or both sides thereof, and/or may be formed in sequential layers with intervening dielectric layers (not shown). The circuit board 240 supports multiple interconnects, including four interconnects 242A-242D that are configured to receive ribbon cables 244A-244D for communicating signals with interconnects 252A-252D of the submount 250. The submount 250 preferably comprises a semiconductor wafer 251 having including multiple traces 253 arranged thereon. A rectangular array mounting area 255 is configured to receive an array of LEDs, and preferably permits each pixel (LED) of the array of LEDs to be individually controlled, such as by providing one anode and one cathode per LED.

Figure 37A:
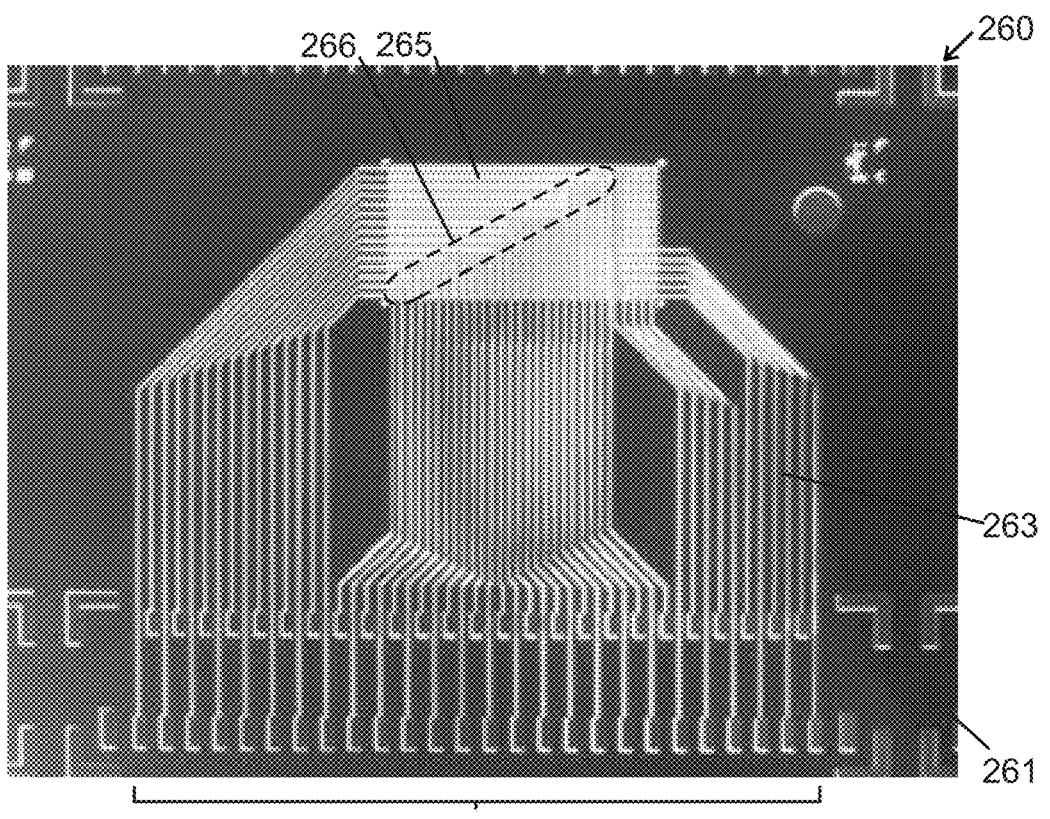
FIG. 37A is a top plan view of a carrier substrate or submount including a semiconductor wafer supporting multiple electrical traces leading to a rectangular array mounting area suitable for receiving a solid state light emitting device (e.g., a multi-LED chip) including a high density LED array and useable as part of a test apparatus.
Figure 37B:
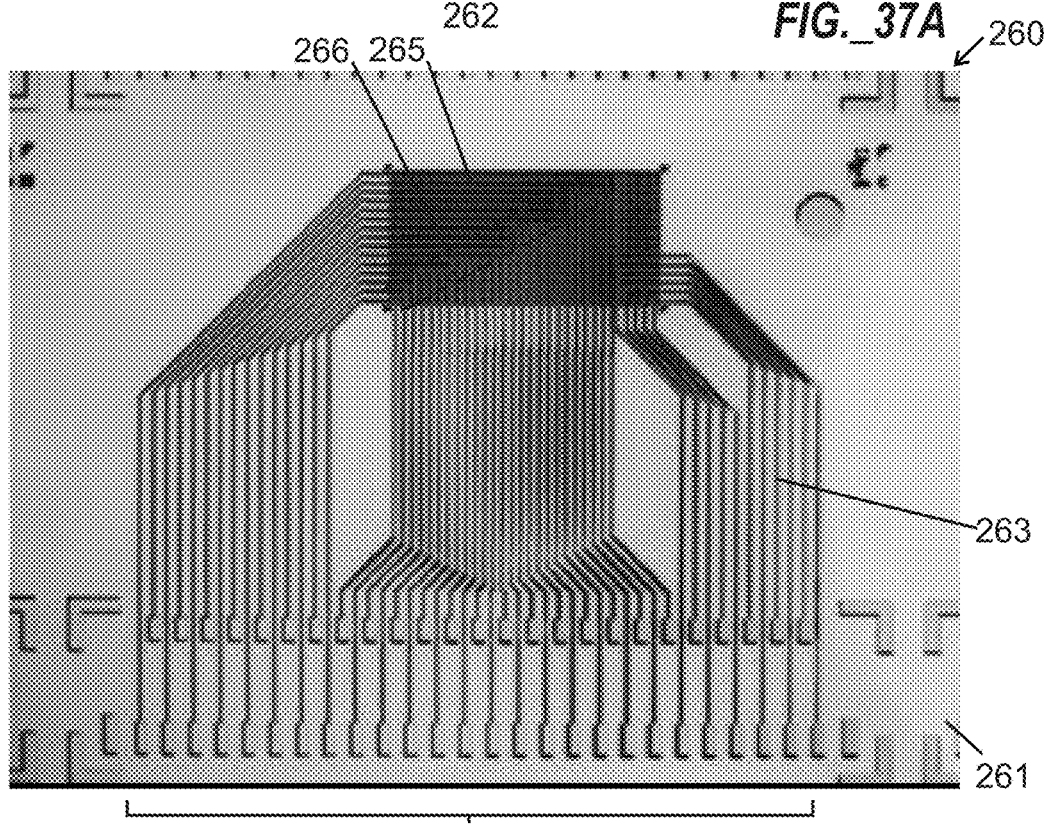
FIG. 37B is a color inverted version of FIG. 37A.

FIGS. 37A and 37B depict another submount 260 including a semiconductor wafer 261 supporting multiple electrical traces 263 that are routed to a rectangular array mounting area 265 configured to receive an array of LEDs (not shown) as disclosed herein. The traces 263 extend to multiple contacts 262 proximate to one edge of the submount 260. The submount 260 is useable as a test apparatus, such that within the rectangular array mounting area 265, only selected contact pairs 266 (e.g., arranged in a roughly diagonal direction within the pictured dashed line shape) are active and capable of operating LEDs of a LED array. Additional active contact pairs would be necessary to operate every pixel in a LED array occupying the entire rectangular array mounting area 265. In certain embodiments, active contact pairs may be arranged along an accessible surface of an applicant specific integrated circuit (ASIC) chip configured to receive a LED array as disclosed herein. FIG. 38A is a magnified portion of the submount 260 of FIGS. 37A and 37B, showing the traces 263 and rectangular array mounting area 265 arranged over the semiconductor wafer 261, and the selected contact pairs 266 that are operational (within the pictured dashed line shape).

Figure 39A:
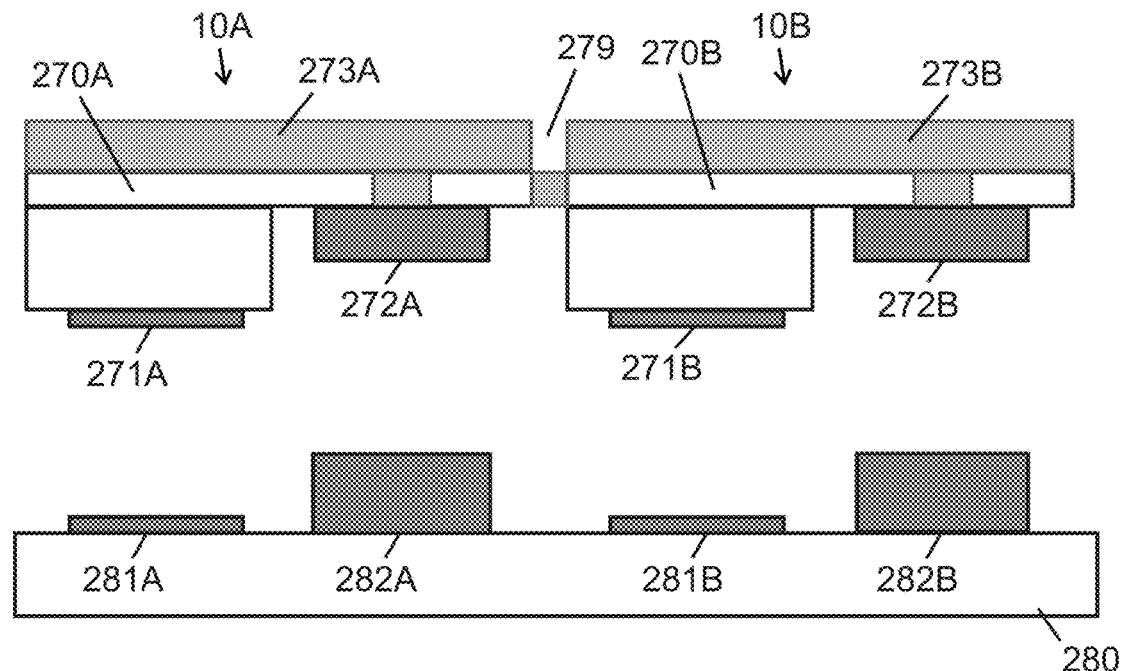
FIG. 39A is a side cross-sectional schematic assembly view of a portion of a solid state light emitting device including two flip chip LEDs associated with a single substrate (e.g., optionally embodied in one multi-LED chip), with anodes and cathodes having different heights relative to one another, and being arranged above (without contacting) electrodes of different heights provided along a top surface of a carrier substrate or submount.

FIG. 39A is a side cross-sectional schematic assembly view of a portion of a solid state light emitting device including two flip chip LEDs 10A, 10B (e.g., Cree EZ-series flip chips available from Cree, Inc., Durham, N.C.) arranged to transmit LED emissions through light-transmissive substrate portions 273A, 273B that are separated by a recess or groove 279. Each LED 10A, 10B includes an anode-cathode pair 271A-272A, 271B-272B proximate to a functional stack 270A, 270B that is arranged to emit light into the substrate portions 273A, 273B, with the LEDs 10A, 10B optionally being embodied in a single multi-LED chip. The anodes 271A, 271B have different heights relative to the cathodes 272A, 272B, and are arranged above electrodes 281A, 282A, 281B, 282B of a submount 280 that preferably includes a semiconductor wafer. The electrodes 281A, 282A, 281B, 282B are arranged as electrode pairs 281A-282A, 281B-282B, wherein each electrode pair includes one short electrode 281A, 281B and one tall electrode 282A, 282B, and each electrode 281A, 282A, 281B, 282B is configured to mate with an anode 271A, 272A or cathode 271B, 272B of complementary height. The electrode pairs 281A-282A, 281B-282B are arranged to receive the anode-cathode pairs 271A-272A, 271B-272B by appropriate mounting means such as solder paste, solder bumps, or the like. Providing electrodes 281A-282A, 281B-282B of different heights may reduce the risk of inadvertent short-circuiting between electrodes (or anodes and cathodes) of opposite polarity due to flow of excess solder paste or solder flux during mounting, which may be of particular concern when the LEDs 10A, 10B have a small pixel pitch (i.e., are in close proximity to one another).

Figure 39B:
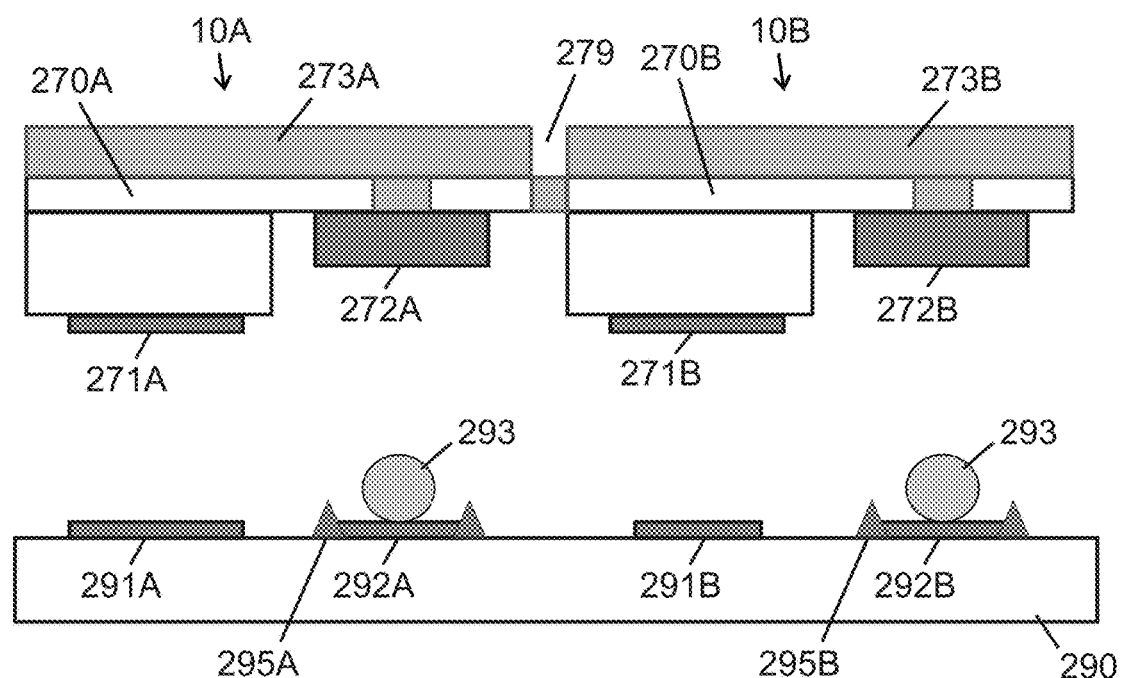
FIG. 39B is a side cross-sectional schematic assembly view of a portion of a solid state light emitting device including two flip chip LEDs arranged over a single substrate (e.g., optionally embodied in one multi-LED chip), with anodes and cathodes having different heights relative to one another, and being arranged above (without contacting) electrodes provided along a top surface of a carrier substrate or submount, with one electrode per electrode pair including boundary walls containing a solder bump material.

FIG. 39B is a side cross-sectional schematic assembly view of a portion of a solid state light emitting device that is similar to the device of FIG. 39A, but includes a modified arrangement of electrodes along a submount. As shown, the solid state light emitting device includes two flip chip LEDs 10A, 10B arranged to transmit LED emissions through light-transmissive substrate portions 273A, 273B that are separated by a recess or groove 279. Each LED 10A, 10B includes an anode-cathode pair 271A-272A, 271B-272B proximate to a functional stack 270A, 270B that is arranged to emit light into the substrate portions 273A, 273B. The anodes 271A, 271B have different heights relative to the cathodes 272A, 272B, and are arranged above electrodes 291A, 292A, 291B, 292B of a submount 290 that preferably includes a semiconductor wafer. Two of the electrodes 292A, 292B include boundary walls 295A, 295B that are arranged to prevent lateral flow of solder material that may emanate from solder bumps 293 when melted during a soldering operation. The presence of solder bumps 293 also raises the effective height of the electrodes 292A, 292B relative to the other electrodes 291A, 291B, which may be configured to receive solder paste having a thinner effective height than the solder bumps 293. Electrode pairs 291A-292A, 291B-292B are arranged to receive the anode-cathode pairs 271A-272A, 271B-272B. Providing electrodes 291A-292A, 291B-292B of different effective heights, in combination with providing the boundary walls 295A, 295B, may reduce the risk of inadvertent short-circuiting between electrodes (or anodes and cathodes) of opposite polarity during a mounting operation, which may be of particular concern when the LEDs 10A, 10B have a small pixel pitch (i.e., are in close proximity to one another).

In certain embodiments, a solid state light emitting device (e.g., a multi-LED chip) including multiple LEDs and a substrate may be mounted over an interface element (e.g., an ASIC, or a carrier substrate or submount) before one or more recesses or grooves are defined in the substrate connecting the LEDs. Defining recesses or grooves in a substrate tends to weaken the substrate and may affect its planarity. By mounting the solid state light emitting device to an interface element before one or more recesses or grooves are defined in the substrate, the ability to ensure reliable connections therebetween may be enhanced.

FIGS. 40A-40D illustrate steps in fabricating a solid state light emitting device 300 with features promoting improved contrast and inter-pixel homogeneity, mounted over an interface element 94 (e.g., optionally embodied in an ASIC, or a carrier or submount), with such mounting being performed prior to formation of grooves or recesses between different LEDs 10A, 10B of the solid state light emitting device 300. Each LED 10A, 10B includes an anode-cathode pair 171A-172A, 171B-172B proximate to a functional stack 170A, 170B that is arranged to emit light into portions of a substrate 173. The substrate 173 includes lateral surfaces 174A, 174B and a light-emitting surface that is subject to being divided into multiple light-emitting surface portions 175A, 175B. In certain embodiments, the functional stacks 170A, 170B and/or portions of the substrate 173 corresponding to different LEDs 10A, 10B may be integrally formed and/or connected via at least one interconnect 170'; alternatively, each LED 10A, 10B may be physically and/or electrically disconnected relative to one another. The anode-cathode pairs 171A-172A, 171B-172B are mounted (e.g., via solder bumps 93) to electrode pairs 91, 92 of the interface element 94, which may include a semiconductor wafer. Although solder bumps 93 are shown, it is to be appreciated that any suitable electrical connection means (e.g., solder paste or other means) may be used instead. In certain embodiments, bonding between the solid state light emitting device 300 and the interface element 94 comprises wafer level bonding of a wafer defining multiple multi-LED chips and a wafer or other substrate defining multiple interface elements, with all contacts of the anode-cathode pairs 171A-172A, 171B-172B and the electrode pairs 91, 92 of the interface element 94 being appropriately aligned prior to completion of steps such as grooving, filling, and singulation.

FIG. 40B shows the solid state light emitting device 300 of FIG. 40A following formation of a recess or groove 179 in the substrate 173 of FIG. 40A to form substrate portions 173A, 173B, each having a corresponding light-emitting surface portion 175A, 175B. Although only a single recess or groove 179 and two LEDs 10A, 10B are shown, it is to be appreciated that any suitable number of LEDs separated by grooves or recesses may be provided, with the LEDs preferably being arranged in a two-dimensional array. In certain embodiments, the recesses or grooves may be defined by mechanical sawing, by etching, by laser cutting, or by other methods, and the recesses or grooves may be defined through only a portion of the substrate or through the entire thickness of the substrate to yield the substrate portions 173A, 173B.

FIG. 40C illustrates the solid state light emitting device 300 of FIG. 40B following addition of a removable (e.g., sacrificial) material 189 to the recess or groove 179 (shown in FIG. 40B), and following formation of a lumiphoric material 180 over the substrate portions 173A, 173B and the removable material 189. Optionally, an underfill material (not shown) may be arranged between the interface element 94 and the solid state light emitting device 300.

FIG. 40D illustrates the solid state light emitting device 300 of FIG. 40C following removal of the removable material 189 (shown in FIG. 40C) from between the substrate portions 173A, 173B to yield an unfilled recess or groove 179 that is covered with the lumiphoric material 180. The unfilled recess or groove 179 preferably serves as a light segregating element to prevent or limit crosstalk between the LEDs 10A, 10B when they are operated. Operation of the solid state light emitting device 300 is substantially similar to operation of the solid state light emitting device 168 of FIG. 22C.

In certain embodiments, a solid state light emitting device (e.g., a multi-LED chip) may be mounted over a first interface element (e.g., embodied in a carrier substrate or a submount) providing structural support to the solid state light emitting device and including pass-through electrical connections for mounting the first interface element to a second interface element (e.g., embodied in an ASIC). In certain embodiments, the pass-through electrical connections may include electrically conductive vias passing through an interior of the first interface element to provide conductive paths between contact pads defined on opposing faces of the first interface element. In certain embodiments, a multi-LED chip may be mounted to a first interface element to provide structural support for the multi-LED chip before one or more recesses or grooves are defined therein. Such support may be beneficial to promote handling and/or address packaging constraints, since formation of recesses or grooves may tend to cause light emitting devices to be very fragile and susceptible to cracking.

FIG. 41 is a side cross-sectional schematic view of a solid state light emitting device (e.g., a multi-LED chip) 304 including multiple LEDs 10A, 10B and a substrate 173 mounted over a first interface element 305 embodied in a carrier substrate or submount. The first interface element 305 includes electrical contacts 311, 312 arranged on a first major surface 306, electrical contacts 315, 316 arranged on a second major surface 308, and electrically conductive vias 309 extending between the first and second major surfaces 306, 308 to provide conductive paths between corresponding electrical contacts 311, 212, 315, 316. The first interface element 305 is positioned over a (second) interface element 94 embodied in an ASIC to enable mounting of the first interface element 305 between the solid state light emitting device 304 and the second interface element 94. The second interface element 94 includes electrode pairs 91, 92 arranged to be electrically connected to corresponding electrical contacts 315, 316 along the second major surface 308 of the first interface element 305 using solder bumps 93 or other means such as solder paste (not shown). The substrate 173 is divisible into substrate portions each being associated with a different LED 10A, 10B. Each LED 10A, 10B includes an anode-cathode pair 171A-172A, 171B-172B proximate to a functional stack 170A, 170B that is arranged to emit light into a corresponding one of the substrate portions, with each LED 10A, 10B embodying a flip chip LED. In certain embodiments, the functional stacks 170A, 170B and/or substrate portions of different LEDs 10A, 10B may be integrally formed and/or connected via at least one interconnect 170'; alternatively, each LED 10A, 10B may be physically and/or electrically disconnected relative to one another. Each substrate portion includes lateral surfaces 174A, 174B and includes a primary light-emitting surface portion 175A, 175B. As shown, the solid state light emitting device 304 is devoid of any grooves or recesses between the LEDs 10A, 10B, but it is to be appreciated that grooves or recesses may be defined through a portion of the thickness or through the entire thickness of the substrate 173 between the LEDs 10A, 10B (to form the substrate portions), either following the mounting of the solid state light emitting device 304 to the first interface element 305, or following the mounting of the first interface element 305 (with the solid state light emitting device 304 arranged thereon) over the second interface element 94.

In certain embodiments, multiple solid state light-emitting devices (e.g., multi-chip LEDs), optionally arranged in a two-dimensional array, may be mounted over a single interface element such as an ASIC, or a carrier substrate or submount, optionally before one or more grooves or recesses are defined in portions of substrates between LEDs of the solid state-light emitting devices. In other embodiments, multiple interface elements such as ASICs, or carrier substrates or submounts, may be arranged to be mounted to a single multi-chip solid state light emitting device (e.g., a multi-chip LED chip), optionally before one or more grooves or recesses are defined in portions of the multi-chip solid state light emitting device. In certain embodiments, multiple singulated LED arrays or multi-LED device (prior to formation of grooves or recesses therein) may be placed and bonded to a single interface element (e.g., ASIC, or carrier substrate or submount); alternatively, in other embodiments, a single LED array may be arranged to receive multiple placed and bonded singulated ASIC chips.

FIG. 42 illustrates two solid state light emitting devices (e.g., multi-LED chips) 320-1, 320-2 mounted over a single interface element (e.g., ASIC, or carrier substrate or submount) 94, prior to defining of recesses or grooves in substrates 173-1, 173-2 of the solid state light emitting devices 320-1, 320-2. Although FIG. 42 illustrates the presence of a gap 321 between the solid state light emitting devices 320-1, 320-2, in certain embodiments the gap 321 may be filled with one or more materials and/or eliminated (e.g., by causing the solid state light emitting devices 320-1, 320-2 to abut one another without space therebetween). Each solid state light emitting device 320-1, 320-2 includes multiple LEDs 10-1A, 10-1B, 10-2A, 10-2B, and each LED 10-1A, 10-1B, 10-2A, 10-2B includes an anode-cathode pair 171-1A, 172-1B, 171-2A, 172-2B proximate to a functional stack 170-1A, 170-1B, 170-2A, 170-2B that is arranged to emit light into portions of a substrate 173-1, 173-2. Each substrate 173-1, 173-2 is divisible (e.g., using grooves or recesses, not shown) into substrate portions each being associated with a different LED 10-1A, 10-1B, 10-2A, 10-2B. Each substrate 173-1, 173-2 includes lateral surfaces 174-1A, 174-2B and a primary light-emitting surface that is subject to being divided into multiple light-emitting surface portions 175-1A, 175-1B, 175-2A, 175-2B. In certain embodiments, the functional stacks 170-1A, 170-1B, 170-2A, 170-2B and/or portions of the substrates 173-1, 173-2 corresponding to different LEDs 10-1A, 10-1B, 10-2A, 10-2B may be integrally formed and/or connected via at least one interconnect 170'-1, 170'-2; alternatively, each LED 10-1A, 10-1B, 10-2A, 10-2B may be physically and/or electrically disconnected relative to one another. The anode-cathode pairs 171-1A, 172-1B, 171-2A, 172-2B are mounted (e.g., via solder bumps 93) to electrode pairs 91, 92 of the interface element 94, which may include a semiconductor wafer. In certain embodiments, the solid state light emitting devices 320-1, 320-2 may be processed after mounting to the interface element 94, such as to thin the entire substrates 173-1, 173-2 and/or to define recesses or grooves in the substrates 173-1, 173-2 between the LEDs 10-1A, 10-1B, 10-2A, 10-2B, such as in locations marked by dashed arrows 322-1, 322-2.

FIG. 43 illustrates a solid state light emitting device (e.g., a multi-LED chip) 330 mounted over multiple interface elements 94-1, 94-2 (e.g., ASICs, or carrier substrates or submounts), prior to defining of recesses or grooves in a substrate 173 connecting multiple LEDs 10A-10D of the solid state light emitting device 330. Each LED 10A-10D includes an anode (e.g., anode 171A) and a cathode (e.g., cathode 172D) proximate to a functional stack 170A-170D that is arranged to emit light into portions of the substrate 173, which is divisible into substrate portions each associated with a different LED 10A-10D. In particular, the substrate 173 may be divided by defining recesses or grooves (not shown) through a portion of the thickness or an entire thickness of the substrate 173 generally between the LEDs 10A-10D, such as in locations marked by dashed arrows 332A-332C. The substrate 173 includes lateral surfaces 174A, 174D and a primary light-emitting surface that is subject to being divided into multiple light-emitting surface portions 175A-175D. In certain embodiments, the functional stacks 170A-170D and/or portions of the substrate 173 corresponding to different LEDs 10A-10D may be integrally formed and/or connected via at least one interconnect 170'; alternatively, each LED 10A-10D may be physically and/or electrically disconnected relative to one another. The anode-cathode pairs (e.g., including anode 171A through cathode 172D) are mounted (e.g., via solder bumps 93) to electrode pairs 91-1, 92-1, 91-2, 92-2 of the interface elements 94-1, 94-2, which may include semiconductor wafers. In certain embodiments, the solid state light emitting device 330 may be processed after mounting to the interface elements 94-1, 94-2, such as to thin the entire substrate 173, and/or to define recesses or grooves in the substrate 173 between the LEDs 10A-10D.

In certain embodiments, epitaxial layer portions including active layers of a solid state light emitting device (e.g., a multi-LED chip) may be selectively removed prior to mounting of the solid state light emitting device to an interface element, such as an ASIC, or a carrier substrate or a submount. Such selective removal may be accomplished by etching, sawing, or other means, and may optionally be followed by selective removal of substrate material extending through a partial or entire thickness of a substrate supporting the epitaxial layers. In certain embodiments, epitaxial layer portions may be selectively removed between LEDs, which may be desirable to enable independent operation of, and/or reduced thermal communication between, different LEDs. In certain embodiments, one or more first recesses or grooves may be defined in a first direction (e.g., from a front side) through epitaxial layer portions of a solid state light emitting device, followed by mounting of the solid state light emitting device over an interface element, followed by defining of one or more second recesses or grooves in a second direction (e.g., from a back side) through substrate portions of the solid state light emitting device. In certain embodiments, the first recesses or grooves may be registered with the second recesses or grooves, optionally in a manner to cause the first recesses to merge with the second recesses, or alternatively to leave a thin membrane portion of the substrate to separate the first recesses and the second recesses.

FIGS. 44A-44C illustrate steps in fabricating a solid state light emitting device (e.g., a multi-LED chip) 340 with features promoting improved contrast and inter-pixel homogeneity, mounted over an interface element 94 (e.g., optionally embodied in an ASIC, or a carrier or submount), with a first recess or groove 341 being defined in the solid state light emitting device 340 in a first direction prior to mounting.

FIG. 44A illustrates the solid state light emitting device (e.g., multi-LED chip) 340 including the first (front side) recess or groove 341. The first recess or groove 341 extends through epitaxial layers forming functional stacks 170A, 170B of different LEDs 10A, 10B of the solid state light emitting device 340. The functional stacks 170A, 170B are arranged between a substrate 173 and anode-cathode pairs 171A-172A, 171B-172B of the LEDs 10A, 10B, with the functional stacks 170A, 170B being arranged to emit light into portions of the substrate 173 to exit through primary light-emitting surface portions 175A, 175B of the substrate 173 bounded between lateral surfaces 174A, 174B. As shown, the first recess or groove 341 is defined (e.g., by etching or other means) through epitaxial layers to separate the functional stacks 170A, 170B.

FIG. 44B illustrates the solid state light emitting device 340 of FIG. 44A after being mounted over an interface element (e.g., ASIC, or carrier substrate or submount) 94. A dashed arrow 342A identifies a location where a second recess (not shown) may be defined through at least a portion of the substrate 173. The anode-cathode pairs 171A-172A, 171B-172B of the solid state light emitting device 340 are mounted (e.g., via solder bumps 93) to electrode pairs 91, 92 of the interface element 94, which may include a semiconductor wafer. Although solder bumps 93 are shown, it is to be appreciated that any suitable electrical connection means (e.g., solder paste or other means) may be used instead.

FIG. 44C illustrates the solid state light emitting device 340 of FIG. 44B after addition of an underfill material 345 between the solid state light emitting device 340 and the interface element 94, and formation of a second recess or groove 343 defined (i.e., in a second direction opposing a first direction in which the first recess or groove 341 was formed) through a portion of the substrate to yield substrate portions 173A, 173B. As shown, the second recess or groove 343 is registered (i.e., aligned) with the first recess or groove 341, but the respective recesses or grooves 341, 343 are separated by a thin membrane region 344 of the substrate 173.

FIG. 44D illustrates a solid state light emitting device 340' that is substantially similar to the device 340 shown in FIG. 44C (whereby elements with the same reference numerals will not be described again), but including a second alternate recess or groove 346 that extends through an entire thickness of the substrate portions 173A, 173B (i.e., to expose a portion of the underfill material 345 arranged generally between the solid state light emitting device 340' and the interface element 94).

Figure 45:
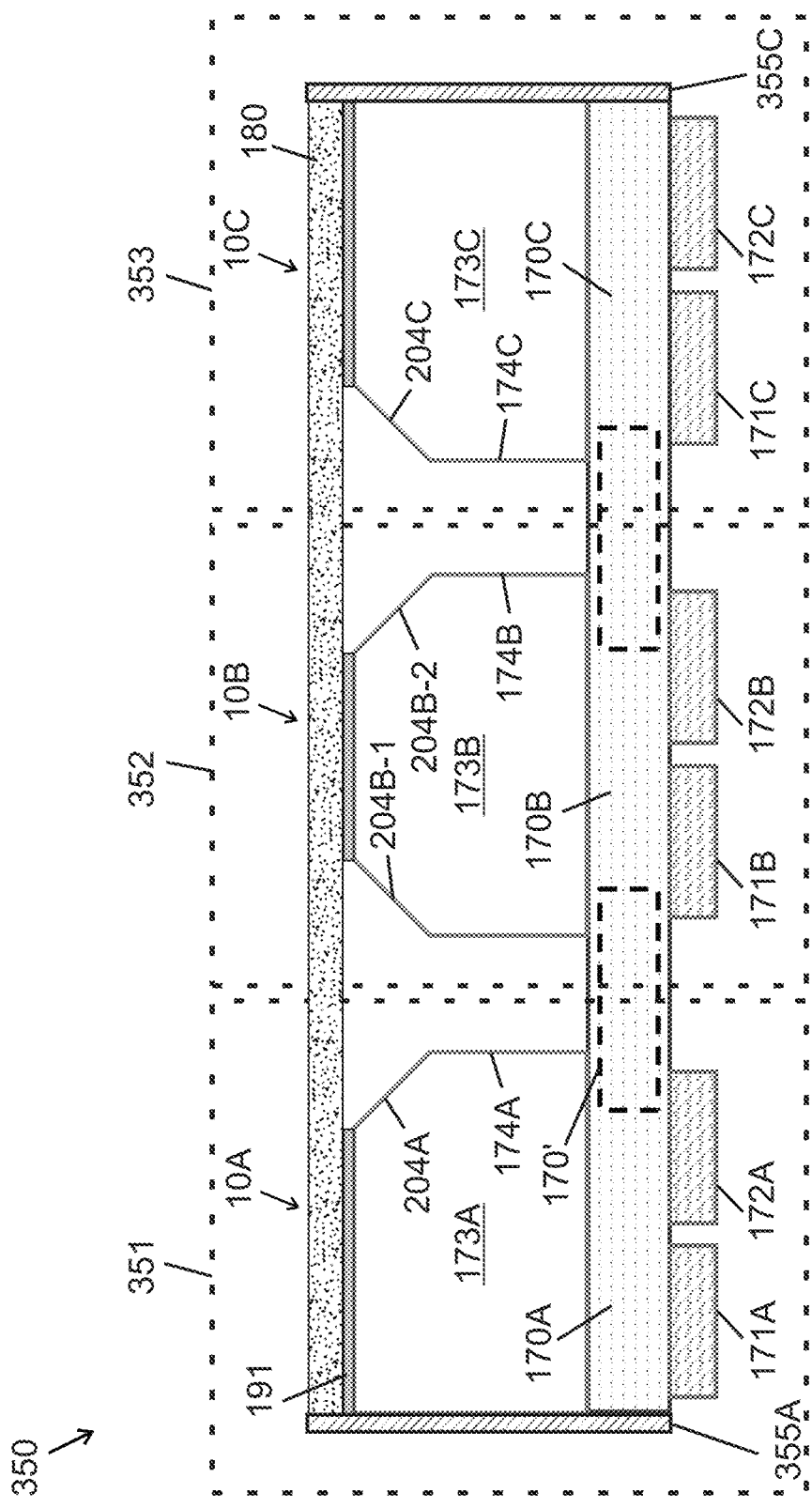
FIG. 45 is a side cross-sectional schematic view of a portion of a solid state light emitting device (e.g., a multi-LED chip) including grooves or recesses defined between adjacent LEDs of the multi-LED chip, and with different emitter regions having different characteristics.

FIG. 45 illustrates a solid state light emitting device (e.g., a multi-LED chip) 350 including recesses or grooves defined between adjacent LEDs 10A-10C, and with different emitter regions 351-353 having different characteristics. Each LED 10A-10C includes an anode-cathode pair 171A-172A, 171B-172B, 171C-172C proximate to a functional stack 170A-170C that is arranged to emit light into substrate portions 173A-173C. Recesses or grooves are defined between respective LEDs 10A-10C to yield lateral surfaces 174A-174C between the respective LEDs 10A-10C, and to yield beveled edge portions 204A, 204B-1, 204B-2, 204C along lateral boundaries of substrate portions 173A-173C to provide light segregation and inter-pixel light spreading utilities. Primary light emitting surfaces of the substrate portions 173A-173C for the respective LEDs 10A-10C are covered with adhesion promoting material 191 (e.g., epoxy) and a layer of lumiphoric material 180 that spans above and between each LED 10A-10C. In certain embodiments, the functional stacks 170A-170C and/or substrate portions 173A-173C of different LEDs 10A-10C may be integrally formed and/or connected via at least one interconnect 170'; alternatively, each LED 10A-10C may be physically and/or electrically disconnected relative to one another. A light reflecting coating 355A, 355C may be provided proximate to lateral edges of substrate portions 173A, 173C that are arrangeable along lateral edges of a solid state light emitting apparatus. Properties of different emitter regions 351-353 may be tailored to provide different characteristics (e.g., directionality, lateral cutoff, beam pattern, color point, color temperature, intensity, etc.) such as may be useful depending on relative positioning of the emitter regions 351-353 in a solid state light emitting apparatus.

Embodiments disclosed herein may provide one or more of the following beneficial technical effects: enabling fabrication of solid state light emitting devices with small pixel pitch emitter arrays; providing small pixel pitch solid state light emitting devices (including lumiphor-containing emitting devices) with reduced scattering and/or optical crosstalk properties; providing small pixel pitch solid state light emitting devices (including lumiphor-containing emitting devices) with enhanced uniformity of illumination while simultaneously providing reduced optical crosstalk; simplifying fabrication and enhancing resolution of multi-color sequentially illuminated LED displays; enabling fabrication of large modular arrays of a solid state light emitting device; simplifying fabrication of next-generation vehicular headlamps with multiple illumination zones and the ability to selectively illuminate or avoid illumination of selected illumination targets; and enabling projection of images or information on a target illumination surface.

Those skilled in the art will recognize improvements and modifications to the preferred embodiments of the present disclosure. All such improvements and modifications are considered within the scope of the concepts disclosed herein and the claims that follow.

What is claimed is:

1. A multi-LED chip comprising:
an array of LEDs arranged to transmit LED emissions through a plurality of light-transmissive portions of a substrate, wherein the array of LEDs comprises at least one anode-cathode pair;
a plurality of light segregation elements arranged at least partially within the substrate, wherein light segregation elements of the plurality of light segregation elements are arranged between different light-transmissive portions of the plurality of light-transmissive portions, the plurality of light segregation elements is configured to reduce passage of LED emissions between the different light-transmissive portions, and the plurality of light-transmissive portions is configured to be illuminated by the array of LEDs to define a plurality of pixels that includes a plurality of border portions, wherein each pixel of the plurality of pixels includes at least one border portion of the plurality of border portions;
a plurality of inter-pixel light spreading regions configured to transmit light through border portions of the plurality of border portions to enhance inter-pixel illumination at light-emitting surface portions of the multi-LED chip that are registered with or proximate to the plurality of light segregation elements; and
at least one lumiphoric material arranged over the plurality of inter-pixel light spreading regions;
wherein the substrate is arranged between the array of LEDs and the at least one lumiphoric material; and
wherein the array of LEDs is arranged between the substrate and the at least one anode-cathode pair.

2. The multi-LED chip of claim 1, wherein the plurality of light segregation elements comprises at least one light-affecting material, and the plurality of inter-pixel light spreading regions comprises at least one light-transmissive material arranged in contact with the at least one light-affecting material.

3. The multi-LED chip of claim 1, wherein:
the plurality of light segregation elements is arranged entirely within the substrate; and
the plurality of inter-pixel light spreading regions includes at least one light-transmissive material arranged at least partially within the substrate and over the plurality of light segregation elements.

4. The multi-LED chip of claim 1, wherein the plurality of inter-pixel light spreading regions comprises at least one light-transmissive material region that is elevated relative to a surface of the substrate and that is at least partially registered with the plurality of light segregation elements.

5. The multi-LED chip of claim 1, wherein the plurality of light segregation elements comprises a plurality of unfilled voids within portions of the substrate.

6. The multi-LED chip of claim 1, wherein the at least one lumiphoric material is arranged on or over a light extraction surface of the substrate, wherein the at least one lumiphoric material is configured to receive at least a portion of the LED emissions and responsively generate lumiphor emissions.

7. The multi-LED chip of claim 1, wherein each light-transmissive portion of the plurality of light-transmissive portions of the substrate is separated from at least one other light-transmissive portion of the plurality of light-transmissive portions of the substrate by a gap that: (i) has a width and a depth, (ii) is partially filled with a light segregation element of the plurality of light segregation elements, and (iii) is partially filled with at least one light-transmissive material defining an inter-pixel light spreading region of the plurality of inter-pixel light spreading regions.

8. The multi-LED chip of claim 7, wherein the gap includes a first portion of the width that is filled with the light segregation element, and includes a second portion of the width that is filled with the at least one light-transmissive material.

9. The multi-LED chip of claim 7, wherein the gap includes a first portion of the depth that is filled with the light segregation element, and includes a second portion of the depth that is filled with the at least one light-transmissive material.

10. The multi-LED chip of claim 7, further comprising at least one light-transmissive material region that is elevated relative to a surface of the substrate and that is at least partially registered with at least one of the light segregation element or the inter-pixel light spreading region.

11. The multi-LED chip of claim 1, wherein each light-transmissive portion of the plurality of light-transmissive portions of the substrate comprises at least one beveled edge forming an inter-pixel light spreading region of the plurality of inter-pixel light spreading regions.

12. The multi-LED chip of claim 11, wherein the substrate includes at least one light extraction surface including the at least one beveled edge, and the at least one lumiphoric material arranged on or over the at least one light extraction surface, wherein the at least one lumiphoric material is configured to receive at least a portion of the LED emissions and responsively generate lumiphor emissions.

13. The multi-LED chip of claim 1, further comprising:
a light-transmissive secondary substrate arranged over the substrate, wherein the at least one lumiphoric material is arranged between the light-transmissive secondary substrate and the substrate, and the at least one lumiphoric material is configured to receive at least a portion of the LED emissions and responsively generate lumiphor emissions.

14. The multi-LED chip of claim 13, further comprising a light scattering layer arranged on the light-transmissive secondary substrate.

15. The multi-LED chip of claim 13, wherein the plurality of inter-pixel light spreading regions is arranged at least partially within the light-transmissive secondary substrate.

16. The multi-LED chip of claim 13, wherein the plurality of inter-pixel light spreading regions comprises a plurality of light redirecting regions within the light-transmissive secondary substrate.

17. The multi-LED chip of claim 16, wherein the plurality of light redirecting regions comprises a plurality of voids defined within the light-transmissive secondary substrate.

18. The multi-LED chip of claim 16, wherein each light redirecting region of the plurality of light redirecting regions comprises a further light-transmissive material that differs in composition from a material of the light-transmissive secondary substrate.

19. A multi-LED chip comprising:
an array of LEDs arranged to transmit LED emissions through a plurality of light-transmissive portions of a substrate;
a plurality of light segregation elements arranged at least partially within the substrate, wherein light segregation elements of the plurality of light segregation elements are arranged between different light-transmissive portions of the plurality of light-transmissive portions, the plurality of light segregation elements is configured to reduce passage of LED emissions between the different light-transmissive portions;
a light-transmissive secondary substrate arranged over the substrate;
a lumiphoric material arranged between the light-transmissive secondary substrate and the substrate, wherein the lumiphoric material is configured to receive at least a portion of the LED emissions and responsively generate lumiphor emissions; and
a plurality of light redirecting regions arranged at least partially within the light-transmissive secondary substrate, wherein each light redirecting region of the plurality of light redirecting regions is configured to enhance illumination of light emitting surface portions of the multi-LED chip that are overlying and registered with the plurality of light segregation elements.

20. The multi-LED chip of claim 19, further comprising a light scattering layer arranged on the light-transmissive secondary substrate.

21. The multi-LED chip of claim 20, wherein the light-transmissive secondary substrate is arranged between the lumiphoric material and the light scattering layer.

22. The multi-LED chip of claim 19, wherein a portion of each light redirecting region extends into or through a lumiphoric material layer containing the lumiphoric material.

23. The multi-LED chip of claim 19, wherein the plurality of light redirecting regions comprises a plurality of voids defined within the light-transmissive secondary substrate.

24. The multi-LED chip of claim 19, wherein each light redirecting region of the plurality of light redirecting regions comprises a further light-transmissive material that differs in composition from a material of the light-transmissive secondary substrate.

25. The multi-LED chip of claim 19, wherein the plurality of light segregation elements comprises a plurality of unfilled voids defined in the substrate.

26. A multi-LED chip comprising:
a functional stack comprising a plurality of semiconductor layers and an active region;
an array of LEDs formed in the functional stack that define a plurality of pixels, wherein each LED of the array of LEDs comprises a substrate material portion arranged over the active region;
a plurality of light segregation elements arranged between different pixels of the plurality of pixels, the plurality of light segregation elements comprising reflective material arranged between substrate material portions of different LEDs of the array of LEDs, wherein the plurality of light segregation elements is configured to reduce passage of LED emissions between the different pixels;
a plurality of border portions, wherein each pixel of the plurality of pixels includes at least one border portion of the plurality of border portions;
a plurality of inter-pixel light spreading regions configured to transmit light through border portions of the plurality of border portions to enhance inter-pixel illumination at light-emitting surface portions of the multi-LED chip that are registered with or proximate to the plurality of light segregation elements;
at least one lumiphoric material arranged over the plurality of inter-pixel light spreading regions; and
an underfill material registered with boundaries between at least some pixels of the plurality of pixels;
wherein the plurality of light segregation elements comprises at least one recess configured to expose the underfill material.

27. The multi-LED chip of claim 26, wherein the array of LEDs is configured to transmit LED emissions through the substrate material portions, the array of LEDs comprises at least one anode-cathode pair, each substrate material portions is arranged between the functional stack and the at least one lumiphoric material, and the functional stack is arranged between the substrate material portions and at least one anode-cathode pair.

28. The multi-LED chip of claim 26, wherein the plurality of light segregation elements comprises a plurality of unfilled voids.

* * * * *

UNITED STATES PATENT AND TRADEMARK OFFICE
CERTIFICATE OF CORRECTION

PATENT NO. : 10,312,224 B2
APPLICATION NO. : 15/401240
DATED : June 4, 2019
INVENTOR(S) : John Edmond et al.

Page 1 of 1

It is certified that error appears in the above-identified patent and that said Letters Patent is hereby corrected as shown below:

In the Specification

In Column 53, Lines 64 and 66, replace "17961," with --179B1,--.

In Column 54, Line 7, replace "17961," with --179B1,--.

In Column 58, Line 66, replace "176′6." with --176′B.--.

Signed and Sealed this
Ninth Day of July, 2019

Andrei Iancu
*Director of the United States Patent and Trademark Office*